United States Patent [19]

Sato et al.

[11] Patent Number: 5,609,982
[45] Date of Patent: *Mar. 11, 1997

[54] POSITIVE-WORKING PHOTORESIST COMPOSITION

[75] Inventors: Kenichiro Sato; Yasumasa Kawabe; Toshiaki Aoai; Shinji Sakaguchi, all of Shizuoka, Japan

[73] Assignee: Fuji Photo Film Co., Ltd., Kanagawa, Japan

[*] Notice: The term of this patent shall not extend beyond the expiration date of Pat. No. 5,554,481.

[21] Appl. No.: 357,748

[22] Filed: Dec. 16, 1994

[30] Foreign Application Priority Data

Dec. 17, 1993 [JP] Japan ................... 5-318194
Dec. 17, 1993 [JP] Japan ................... 5-318195
Mar. 31, 1994 [JP] Japan ................... 6-063859

[51] Int. Cl.$^6$ ........................................ G03F 7/023
[52] U.S. Cl. .................. 430/192; 430/191; 430/193; 534/557
[58] Field of Search ........................ 430/192, 193, 430/165, 191; 534/557

[56] References Cited

U.S. PATENT DOCUMENTS

| | | | |
|---|---|---|---|
| 5,059,507 | 10/1991 | Uetani et al. | 430/192 |
| 5,143,815 | 9/1992 | Stahlhofen | 430/192 |
| 5,166,033 | 11/1992 | Oie et al. | 430/193 |
| 5,173,389 | 12/1992 | Uenishi et al. | 430/192 |
| 5,306,596 | 4/1994 | Oie et al. | 430/193 |
| 5,378,586 | 1/1995 | Uetani et al. | 430/192 |
| 5,407,779 | 4/1995 | Uetani et al. | 430/192 |
| 5,554,481 | 9/1996 | Kawabe et al. | 430/192 |

FOREIGN PATENT DOCUMENTS

| | | |
|---|---|---|
| 0440238 | 8/1991 | European Pat. Off. |
| 0570884 | 11/1993 | European Pat. Off. |
| 0573056 | 12/1993 | European Pat. Off. |

*Primary Examiner*—John S. Chu
*Attorney, Agent, or Firm*—Sughrue, Mion, Zinn, Macpeak & Seas

[57] ABSTRACT

The present invention provides a positive-working photoresist composition comprising an alkali-soluble resin and a 1,2-naphthoquinonediazide-5-(and/or -4-)sulfonic ester of a specific water-insoluble alkali-soluble low molecular compound, wherein the high-performance liquid chromatography of the ester with an ultraviolet ray at 254 nm shows that the patterns corresponding to the diester components and complete ester component of the ester each fall within the specific range and a positive-working photoresist composition comprising a water-insoluble alkali-soluble resin, a water-insoluble alkali-soluble low molecular compound, and an ionization-sensitive radioactive compound which comprises a mixture of a naphthoquinone-diazidesulfonic diester of a water-insoluble alkali-soluble low molecular compound having three phenolic hydroxyl groups as an ionization-sensitive radioactive compound (A) and a naphthoquinonediazidesulfonic diester of a water-insoluble alkali-soluble low molecular compound having four phenolic hydroxyl groups as an ionization-sensitive radioactive compound (B) in an amount of 30% or more by weight based on the total amount of the ionization-sensitive radioactive compound.

10 Claims, No Drawings

POSITIVE-WORKING PHOTORESIST COMPOSITION

FIELD OF THE INVENTION

The present invention relates to a positive-working photoresist composition comprising an alkali-soluble resin and a specific 1,2-quinonediazide compound which is sensitive to radiations such as ultraviolet ray, far ultraviolet ray, X ray, electron ray, molecular beam, γ-ray and synchrotron radiation. More particularly, the present invention relates to a positive-working photoresist for fine work which provides a high resolving power against the fluctuations in the film thickness, gives little development residue and exhibits an excellent development latitude and a high age stability.

The positive-working photoresist of the present invention is generally applied to a substrate such as semiconductor wafer, glass, ceramics and metal to a thickness of 0.5 to 2μm by spin coating method or roller coating method. Thereafter, the material is heated to dryness, irradiated with an ultraviolet ray etc. through an exposure mask to print a circuit pattern thereon, and then developed, optionally after baking, to form a positive image thereon.

With this positive image as a mask, the substrate is then etched to effect patternwise work thereon. This technique finds typical applications in the production of semiconductors such as IC, the production of circuit boards such as a liquid crystal and thermal head, the production of a magnetic bubble memory device, and other photofabrication processes, etc.

BACKGROUND OF THE INVENTION

As a positive-working photoresist composition there is normally used a composition comprising an alkali-soluble resin binder such as novolak and a naphthoquinonediazide compound as a photosensitive material.

A novolak resin which serves as a binder can be dissolved in an alkaline aqueous solution without swelling. The novolak resin can also exhibit a high resistance particularly to plasma etching when an image thus produced is used as a mask for etching. Thus, novolak resin is particularly useful in this application. A naphthoquinone diazide compound which serves as a photosensitive material itself serves as a dissolution inhibitor for reducing the alkali solubility of novolak resin but is peculiar in that it undergoes decomposition upon the irradiation with light to produce an alkali-soluble substance which rather enhances the alkali solubility of novolak resin. Because of the great change in properties by the irradiation with light, naphthoquinone diazide compound is particularly useful as photosensitive material for positive-working photoresist.

From such a standpoint of view, many positive-working photoresists comprising novolak resin and naphthoquinone photosensitive material have heretofore been developed and put into practical use. These positive-working photoresist materials have showed marked progress particularly towards high resolving power and attained sufficient results in working lines having a width as small as submicron.

It has heretofore been considered that a resist having a high contrast (γ value) can be advantageously used to provide reproduction of a faithfully-patterned image with an enhanced resolving power. In an attempt to accomplish the foregoing object, various resist compositions have been developed. An extremely large number of publications disclose this technique. Referring particularly to novolak resin as a main component of positive-working photoresist, many monomer compositions, molecular weight distributions, synthesis methods, etc. have been applied for patent. These patents have attained some good results.

An attempt to improve the properties of resists by providing a novolak resin with a specified molecular weight distribution is known. For example, JP-A-1-105243 (The term "JP-A" as used herein means an "unexamined published Japanese patent application") discloses that a novolak resin having a molecular weight distribution such that the molecular weight range of 500 to 5,000 accounts for not more than 30% of the molecular weight distribution is desirable. Further, JP-A-62-227144 and JP-A-63-2044 disclose that there is a desirable proportion of specified molecular weight ranges in the molecular weight distribution. Moreover, JP-A-60-97347 and JP-A-60-189739 disclose the use of a novolak resin from which a low molecular weight component has been fractionally removed. Also, JP-A-60-45238 disclose the use of a resin having a dispersion degree of not more than 3 as used herein.

Referring to photosensitive material as another main component of positive-working photoresist, many compounds structured so as to provide a high contrast have been disclosed. The design of positive-working photoresist taking advantage of these techniques makes it possible to develop a ultrahigh resolving resist that can resolve a pattern with the same dimension as the wavelength of light.

However, integrated circuits have developed its degree of integration more and more. In the production of semiconductor substrates such as SLSI (super large scale integration), the working of ultrafine patterns composed of lines having a width down to not more than 0.5μm has been required. Such an application has required a photoresist having a development latitude wide enough to provide an invariably high resolving power and keep the width of worked lines constant. In order to prevent circuits from being malworked, it is necessary that no resist residues occur on the resist pattern developed.

Further, a low molecular compound having aromatic hydroxyl group is normally used as a dissolution accelerator or for the purpose of enhancing sensitivity. Many cases of the addition of such a low molecular compound have been disclosed. However, the addition of such a compound normally causes a rise in the reduction of the thickness of unexposed area, resulting in the deterioration of the shape of the resist. In addition, the addition of such a compound increases the development speed and hence reduces the development latitude. Thus, the structure of desirable compounds have been selected such that these phenomena can be minimized.

An attempt to improve the sensitivity and developability of resists by blending a specific compound in the resist compositions has been made. For example, JP-A-61-141441 discloses a positive-working photoresist composition containing trihydroxybenzophenone. The positive-working photoresist composition containing trihydroxybenzophenone can exhibit an improved sensitivity and developability but is disadvantageous in that the presence of trihydroxybenzophenone causes a deterioration of the heat resistance that results in the rise in the reduction of the film thickness of unexposed area.

It has also been found that the formation of an ultrafine pattern having a line width as small as not more than 0.5μm is liable to a phenomenon in which, although a specified resolving power can be obtained with a predetermined coat film thickness, even a slight change in the coat film thickness can deteriorate the resolving power (hereinafter referred to as "dependence on film thickness"). A surprising fact has also been found that even a change in the film thickness as small as few hundredths of micron can cause a great change in the resolving power and any commercially available typical positive-working photoresists show such a behavior more or less. In some detail, when the thickness of the resist film which has not been exposed changes in a proportion of λ/4n (in which λ is the wavelength of light to which the resist is exposed, and n is the refractive index of the resist film at the same wavelength), the resulting resolving power can vary.

Referring to the problem of dependence on film thickness, its presence is noted in, e.g., SPIE Proceedings, vol. 1,925, page 626, 1993. The paper reports that this phenomenon can be caused by a multiple light reflection effect in the resist film.

It has been found that this dependence on film thickness becomes remarkable particularly when the contrast of the resist is raised such that a high resolving power and a pattern having a rectangular section can be obtained. In the actual work of semiconductor substrates, a pattern is formed using a resist film having slight fluctuation in film thickness due to roughness on the surface of the substrate or unevenness in the coat film thickness. Thus, this dependence on film thickness is one of obstacles to the work of ultrafine patterns close to the limit of resolution with a positive-working photoresist.

Many 1,2-naphthoquinonediazidization products of polyhydroxy compound having a specific structure have heretofore been proposed to enhance the resolving power. These compounds are disclosed in JP-A-57-63526, JP-A-60-163043, JP-A-62-10645, JP-A-62-10646, JP-A-62-150245, JP-A-63-220139, JP-A- 64-76047, JP-A-1-189644, JP-A-2-285351, JP-A-2-296248, JP-A-2-296249, JP-A-3-48249, JP-A-3-48250, JP-A-3-158856, JP-A-3-228057, JP-A-4-502519, U.S. Pat. Nos. 4,957,846, 4,992,356, 5,151,340, and 5,178,986, and EP 530,148. However, even these photosensitive materials leave something to be desired in the reduction of dependence on film thickness.

On the other hand, it is disclosed in JP-B-37-18015 (The term "JP-B" as used herein means an "examined Japanese patent publication"), JP-A-58-150948, JP-A-2-19846, JP-A-2-103543, JP-A-3-228057, JP-A-5-323597, EP 573,056, U.S. Pat. Nos. 3,061,430, 3,130,047, 3,130,048, 3,130,049, 3,102,809, 3,184,310, 3,188,210, and 3,180,733, West German Patent 938,233, and SPIE Proceedings, vol. 631, page 210, vol. 1,672, page 231 (1992), vol. 1,672, page 262 (1992) and vol. 1,925, page 227 (1993) that the use of a photosensitive material having hydroxyl group in its molecule can provide a resist having a high contrast and a high resolving power.

Selectively esterified photosensitive materials each having three aromatic rings (formulae (III) to (V)) are proposed in SPIE Proceedings, vol. 1,672, pp. 262–272.

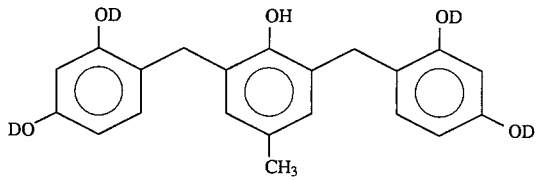

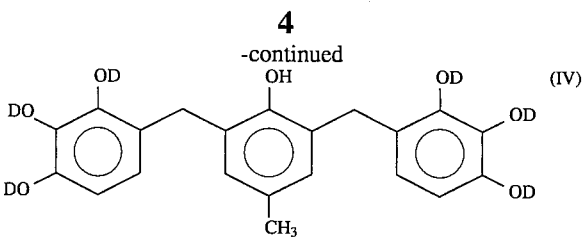

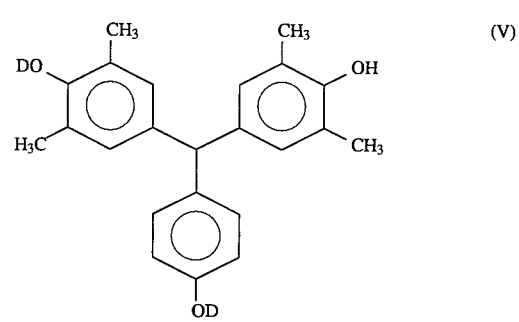

wherein D represents 1,2-naphtoquinonediazide-5-(and/or -4-) sulfonyl group.

However, these photosensitive materials leave something to be desired in the reduction of dependence on film thickness, though providing a sufficiently enhanced resolving power.

Further, JP-A-2-19846 and JP-A-2-103543 disclose diesterification products of polyhydroxy compound having, e.g., the following specific structural formulae (VI) to (VIII). As a result of the examination of these diester photosensitive materials for dependence on film thickness, it was found that these photosensitive materials, too, leave something to be desired.

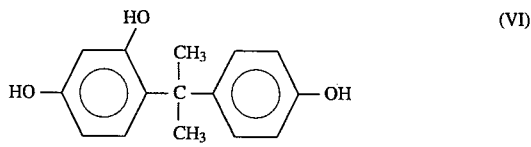

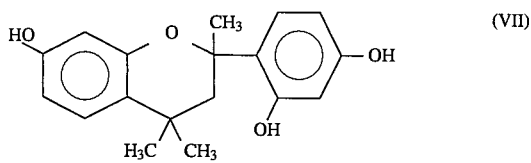

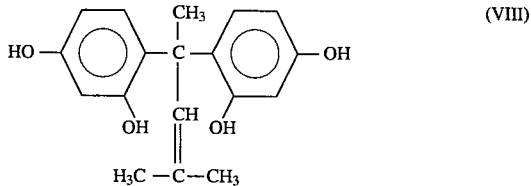

Moreover, 1,2-naphthoquinonediazide-5-(and/or -4-) sulfonyl chlorides of compounds having the following structural formulae (IX) and (X) disclosed in U.S. Patent 5,178,986, JP-A-57-63526, and JP-A-62-10646 leave something to be desired in the reduction of dependence on film thickness.

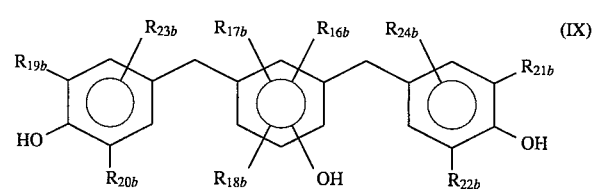

-continued

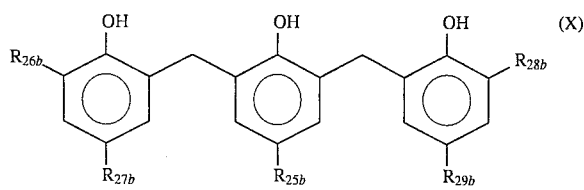

wherein $R_{16b}$ to $R_{18b}$, $R_{23b}$, $R_{24b}$, $R_{26b}$, and $R_{28b}$, may be the same or different and each represent a hydrogen atom, a halogen atom, an alkyl group, an alkoxy group, an aryl group or a nitro group; and $R_{19b}$ to $R_{22b}$, $R_{25b}$, $R_{27b}$, and $R_{29b}$, each represent a hydrogen atom or an alkyl group.

It has heretofore been quite unknown how the composition of resist materials should be formulated to reduce the dependence on film thickness, making it possible to provide a high resolving power independent of film thickness.

With the recent rise in the integration of semiconductor circuits, the demand for the elimination of particles produced from positive-working photoresists has grown more and more. In the field of semiconductor circuits, as the so-called "1/10 rule" says, particles having a size of not less than 1/10 of the smallest line width of device affect the yield of semiconductor circuits (see "Ultraclean Technology", vol. 3, No. 1, page 79 (1991)).

In order to eliminate these particles, some schemes such as use of a filter having a pore diameter as small as 0.1 μm or 0.05μm have been made. These schemes can help eliminate particles during the preparation of resists.

However, even if there are few particles during the preparation of resists, particles can often occur more and more with time. The occurrence of particles with time is mostly attributed to 1,2-quinonediazide photosensitive materials. In order to improve the age stability of resists, various schemes have been made.

For example, the use of a photosensitive material in which the hydroxyl groups in polyhydroxy compound is partially acylated or sulfonylated (JP-A-62-178562), the use of a mixture of 1,2-naphthoquinonediazide-4-sulfonic ester and 1,2-naphthoquinonediazide-5-sulfonic ester (JP-A-62-284354), the use of a thermally modified 1,2-naphthoquinonediazide photosensitive material (JP-A-63-113451), the reduction of residual catalyst in photosensitive material (JP-A-63-236030), the synthesis of a photosensitive material in the presence of an anion exchange resin (JP-A-63-236031), the mixing of a photosensitive material with a solution having a high power of dissolving the photosensitive material (JP-A-61-260239, JP-A-1-293340), etc. have been heretofore attempted.

SUMMARY OF THE INVENTION

It is therefore an object of the present invention to provide a positive-working photoresist composition for fine work which exhibits a high resolving power and a small dependence of resolving power on film thickness. The term "dependence on film thickness" as used herein is meant to indicate the variation in the resolving power of the resist obtained by the exposure (optionally followed by baking) and development of the positive-working photoresist composition with the change of the resist thickness within the range of λ/4n before exposure.

It is another object of the present invention to provide a positive-working photoresist composition which exhibits a wide development latitude and gives little development residue. The term "development latitude" as used herein can be represented by the dependence of the width of the resist obtained by development on the development time or the temperature dependence of the developer. The term "development residue" as used herein is meant to indicate a slight amount of resist insolubles left between developed fine pattern lines which can be observed under a scanning electron microscope.

It is a further object of the present invention to provide a positive-working photoresist composition which is free from deposition of a photosensitive agent and production of microgel with time, i.e., shows no rise in the number of particles with time, to attain an extremely excellent storage stability.

These and other objects of the present invention will become more apparent from the following detailed description and examples.

The inventors made extensive studies taking the foregoing properties into consideration. As a result, it has been found that the foregoing problems can be solved by the use of an alkali-soluble resin and a quinonediazide compound having a specific mother nucleus wherein the ratio of intramolecular hydroxyl group to 1,2-quinonediazide-5-(and/or -4-)sulfonic ester group is in a specified range. The present invention has been worked out on the basis of this knowledge.

The foregoing objects of the present invention are accomplished with the following three aspects of the present invention.

The first aspect of the present invention provides a positive-working photoresist composition, comprising an alkali-soluble resin and a 1,2-naphthoquinonediazide-5-(and/or -4-)sulfonic ester of a water-insoluble alkali-soluble low molecular compound represented by formula (Ia), wherein the high-performance liquid chromatography of said ester with an ultraviolet ray at 254 nm shows that the patterns corresponding to the diester components and complete ester component of said ester are not less than 50% (preferably not less than 60%) and less than 10% of the total pattern area of said ester, respectively:

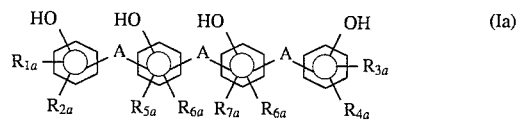

wherein A's may be the same or different and each represent a single bond or a divalent organic group, with the proviso that at least one of A's is selected from the group consisting of a single bond, —O—, —S—, —SO—, —S$_2$—, —SO$_3$—, —NH—, —C(=O)—, —C(=O)O—, —C(=S)—, and —C(=O)NH—; and $R_{1a}$ to $R_{8a}$ may be the same or different and each represent a hydrogen atom, an alkyl group, an aryl group, an alkoxy group, an acyl group, an alkenyl group or a halogen atom.

The second aspect of the present invention provides a positive-working photoresist composition, comprising an alkali-soluble resin and a 1,2-naphthoquinonediazide-5-(and/or -4-)sulfonic ester of a water-insoluble alkali-soluble low molecular compound represented by formula (Ib) obtained by the esterification reaction Of a water-insoluble alkali-soluble low molecular compound represented by formula (Ib) with 1,2-naphthoquinonediazide-5-(and/or -4-)sulfonyl chloride, wherein the high-performance liquid chromatography of said ester with an ultraviolet ray at 254 nm shows that the patterns corresponding to the diester component and complete ester component of said ester account for not less than 40% and less than 10% of the total pattern area of said ester, respectively:

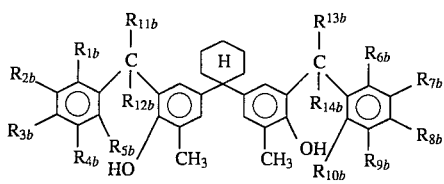

(Ib)

wherein $R_{1b}$ to $R_{10b}$ may be the same or different and each represent a hydrogen atom, a halogen atom, an alkyl group, a cyclic alkyl group, an aryl group, an alkoxy group, an acyl group, an alkenyl group or a hydroxyl group, with the proviso that at least one of $R_{1b}$ to $R_{5b}$ and at least one of $R_{6b}$ to $R_{10b}$ each is a hydroxyl group; and $R_{11b}$ to $R_{14b}$ may be the same or different and each represent a hydrogen atom or an alkyl group.

The third aspect of the invention provides a positive-working photoresist composition comprising a water-insoluble alkali-soluble resin, a water-insoluble alkali-soluble low molecular compound, and an ionization-sensitive radioactive compound, said ionization-sensitive radioactive compound comprises a mixture of a naphthoquinone-diazidesulfonic diester of a water-insoluble alkali-soluble low molecular compound having three phenolic hydroxyl groups as an ionization-sensitive radioactive compound (A) and a naphthoquinonediazidesulfonic diester of a water-insoluble alkali-soluble low molecular compound having four phenolic hydroxyl groups as an ionization-sensitive radioactive compound (B) in an amount of 30% or more by weight based on the total amount of said ionization-sensitive radioactive compound.

Some of skeleton compounds of the ionization-sensitive radioactive compound (A) or (B) are described in U.S. Pat. No. 5,178,986, JP-A-2-296249, and JP-A-2-296248. However, the photosensitive compounds described therein essentially comprise a naphthoquinonediazidesulfonic complete esterification product of phenolic hydroxyl groups as a main component. A positive-working photoresist composition comprising such a photosensitive material along with a water-insoluble alkali-soluble resin and a water-insoluble alkali-soluble low molecular compound is disadvantageous in that it can easily produce development residue, gives a narrow development latitude and exhibits a great dependence on film thickness.

On the other hand, the effects of the present invention are so unique that they can be exerted only by the use of a positive-working photoresist composition comprising a water-insoluble alkali-soluble resin, a water-insoluble alkali-soluble low molecular compound, and an ionization-sensitive radioactive compound, the ionization-sensitive radioactive compound comprising a mixture of a naphthoquinonediazidesulfonic diesterfication product (A) of a water-insoluble alkali-soluble low molecular compound having three phenolic hydroxyl groups and a naphthoquinonediazidesulfonic diesterfication product (B) of water-insoluble alkali-soluble low molecular compound having four phenolic hydroxyl groups in an amount of 30% or more based on the weight of the total amount of the ionization-sensitive radioactive compounds.

In other words, the combination of such an ionization-sensitive radioactive compound mixture with a water-insoluble alkali-soluble resin and a water-insoluble alkali-soluble low molecular compound defined herein expectedly produces a proper balance between the ionization-sensitive radioactive compound's effect of inhibiting dissolution in alkali and the effect of the photodecomposition product of the ionization-sensitive radioactive compound of accelerating dissolution in alkali that enhances the resolving power of the resist while quite unexpectedly giving a wider development latitude and a smaller dependence on film thickness than obtained with either one of the ionization-sensitive radioactive compounds (A) and (B).

DETAILED DESCRIPTION OF THE INVENTION

The first aspect of the present invention will be further described hereinafter.

In formula (Ia), A represents a single bond or divalent organic group, with the proviso that at least one of A's is selected from the group consisting of a single bond, —O—, —S—, —SO—, —SO$_2$—, —SO$_3$—, —NH—, —C(=O)—, —C(=O)O—, —C(=S)—, and —C(=O)NH—. Preferred examples of the group represented by A include a single bond, a $C_{1-8}$ straight-chain or branched alkylene group, a cyclic alkylene group, —O—, —S—, —SO—, and —S$_2$—. The three A's may not be the same at the same time.

Preferred examples of the alkyl group represented by $R_{1a}$ to $R_{8a}$ in formula (Ia) include a $C_{1-4}$ alkyl group such as methyl group, an ethyl group, propyl group, isopropyl group, n-butyl group, isobutyl group, sec-butyl group and t-butyl group. Preferred examples of the aryl group represented by $R_{1a}$ to $R_{8a}$ include a phenyl group, a toluyl group, a xylyl group, and a cumenyl group. Preferred examples of the alkoxy group represented by $R_{1a}$ to $R_{8a}$ include a $C_{1-4}$ alkoxy group such as methoxy group, ethoxy group, propoxy group, isopropoxy group, n-butoxy group, isobutoxy group, sec-butoxy group and t-butoxy group. Preferred examples of the acyl group represented by $R_{1a}$ to $R_{8a}$ include a formyl group, an acetyl group, and a benzoyl group. Preferred examples of the alkenyl group represented by $R_{1a}$ to $R_{8a}$ include a vinyl group, a propenyl group, and an allyl group. Preferred examples of the halogen atom represented by $R_{1a}$ to $R_{8a}$ include a chlorine atom, a bromine atom, and an iodine atom.

Specific examples of the compound represented by formula (Ia) include those represented by formulae (Ia-1) to (Ia-7), but the present invention should not be construed as being limited thereto. These water-insoluble alkali-soluble low molecular compounds may be used singly or in admixture.

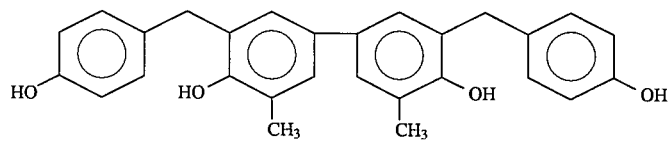

[Ia-1]

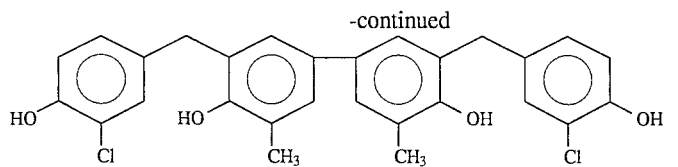

[Ia-2]

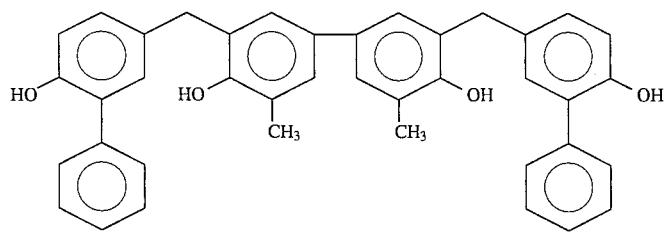

[Ia-3]

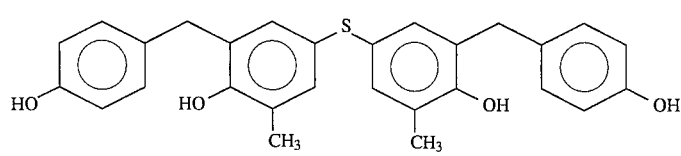

[Ia-4]

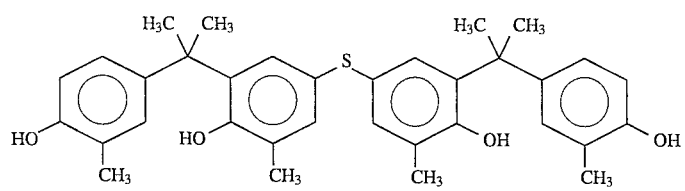

[Ia-5]

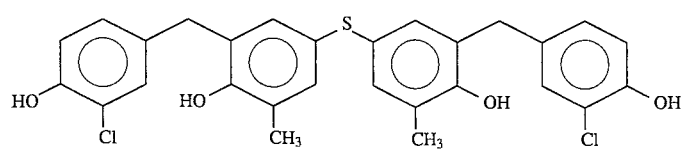

[Ia-6]

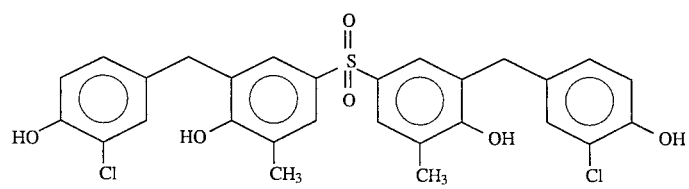

[Ia-7]

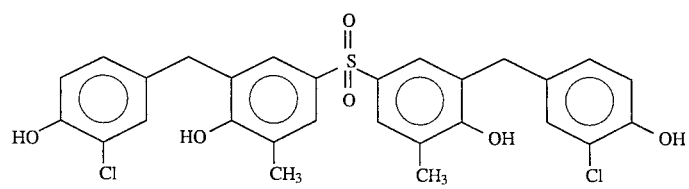

The compound of the present invention can be obtained by the esterification reaction of e.g., the foregoing water-insoluble alkali-soluble low molecular compound with 1,2-naphthoquinonediazide-5-(and/or -4-)sulfonyl chloride in the presence of a basic catalyst.

In some detail, a predetermined amount of such a water-insoluble alkali-soluble low molecular compound and a solvent such as 1,2-naphthoquinonediazide-5-(and/or -4-)sulfonyl chloride, acetone, methyl ethyl ketone, methyl isobutyl ketone, 1,4-dioxane, tetrahydrofuran, dimethoxyethane, diglyme, ethyl acetate, acetonitrile, chloroform, dichloromethane, dichloroethane, chlorobenzene, N-methylpyrrolidone and γ-butyl lactone are charged into a flask. A basic catalyst such as sodium hydroxide, sodium carbonate, sodium hydrogencarbonate, triethylamine, N-methylmorpholine, N-methylpiperidine, N-methylpyrrolidine and 1,4-dimethylpiperazineis then added dropwise to the mixture to effect condensation. The resulting product is washed with water, purified, and then dried.

In the ordinary esterification reaction, mixtures having different esterification degrees and esterification positions are obtained. A specific isomer can be selectively esterified by properly selecting the synthesis conditions or the structure of water-insoluble alkali-soluble low molecular compounds. The term "percent esterification" as used herein is meant to indicate the average value of this mixture.

The percent esterification thus defined can be controlled by properly selecting the mixing ratio of the water-insoluble alkali-soluble low molecular compound as a starting material and 1,2-naphthoquinonediazide-5-(and/or -4-)sulfonyl chloride. In other words, since 1,2-naphthoquinonediazide-5- (and/or -4-)sulfonyl chloride thus added substantially all take part in the esterification reaction, the molar ratio of the starting material may be controlled to obtain a mixture having a desired percent esterification.

The ratio by weight of the water-insoluble alkali-soluble low molecular compound to 1,2-naphthoquinonediazide-5-(and/or -4-)sulfonyl chloride is preferably 1/1.8 to 1/2.2.

The use of the compound represented by the following formula (1) or (2) is particularly preferred.

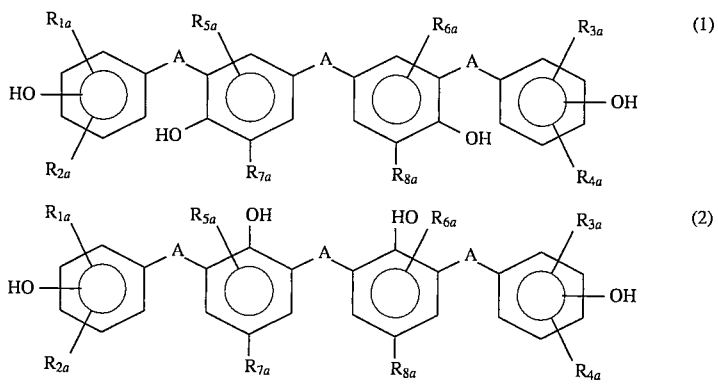

wherein A's and $R_{1a}$ to $R_{8a}$ have the same meaning as in formula (Ia), with the proviso that a group on at least one of ortho positions with respect to a hydroxy group on each aromatic ring is a hydrogen atom and $R_{7a}$ and $R_{8a}$ should not be a hydrogen atom.

If necessary, 1,2-naphthoquinonediazide-5-sulfonic ester and 1,2-naphthoquinonediazide-4-sulfonic ester may be used in combination. The temperature at which the foregoing reaction occurs is normally in the range of −20° C. to 60° C., preferably 0° C. to 40° C.

The second aspect of the present invention will be further described hereinafter.

It is unknown why the use of the photosensitive material of the present invention can provide a uniquely high resolving power, little dependence on film thickness, a wide development latitude and an extremely excellent storage stability and hardly cause the production of development residue. It is possibly because that these unique effects are exerted by the structural features: (1) straight-chain, (2) skeleton having four aromatic rings, (3) compound having one hydroxyl group in each aromatic ring, and (4) hydroxyl groups at both ends can be selectively esterified, and (5) cycloalkyl groups are present in the molecule. In addition, among the structural features, the presence of cycloalkyl group can probably enhance the storage stability. For example, a $C_{1-6}$ straight-chain or branched alkyl group or an aryl groups such as a phenyl group leave something to be desired in storage stability. In other words, it has been found that the features (1) to (4) are effective for the improvement of resolving power and dependence on film thickness while the feature (5) is effective particularly for the improvement of storage stability. This was unexpected from the conventional knowledge.

Preferred examples of the alkyl group represented by $R_{1b}$ to $R_{10b}$ and $R_{11b}$ to $R_{14b}$ in the foregoing formula (Ib) include a $C_{1-4}$ alkyl group such as methyl group, ethyl group, propyl group, isopropyl group, n-butyl group, isobutyl group, sec-butyl group and tert-butyl group. Particularly preferred among these alkyl groups is a methyl group.

The group represented by $R_{11b}$ to $R_{14b}$ is preferably a hydrogen atom.

Preferred examples of the halogen atom represented by $R_{1b}$ to $R_{10b}$ in the foregoing formula (Ib) include a chlorine atom, a bromine atom, and an iodine atom. Preferred examples of the cyclic alkyl group represented by $R_{1b}$ to $R_{10b}$ include a cyclopentyl group, and a cyclohexyl group. Preferred examples of the aryl group represented by $R_{1b}$ to $R_{10b}$ include a phenyl group, a toluyl group, a xylyl group, and a cumenyl group. Preferred examples of the alkoxy group represented by $R_{1b}$ to $R_{10b}$ include a $C_{1-4}$ alkoxy group such as methoxy group, ethoxy group, propoxy group, isopropoxy group, n-butoxy group, isobutoxy group, sec-butoxy group and t-butoxy group. Preferred examples of the acyl group represented by $R_{1b}$ to $R_{10b}$ include a formyl group, an acetyl group, and a benzoyl group. Preferred examples of the alkenyl group represented by $R_{1b}$ to R10b include a vinyl group, a propenyl group, and an allyl group.

Specific examples of the compound represented by formula (Ib) include those represented by formulae (Ib-1) to (Ib-12), but the present invention should not be construed as being limited thereto. These water-insoluble alkali-soluble low molecular compounds may be used singly or in combination.

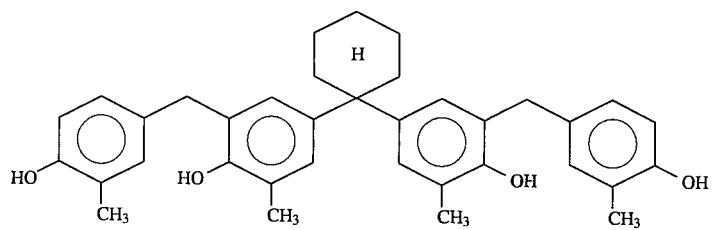

[Ib-1]

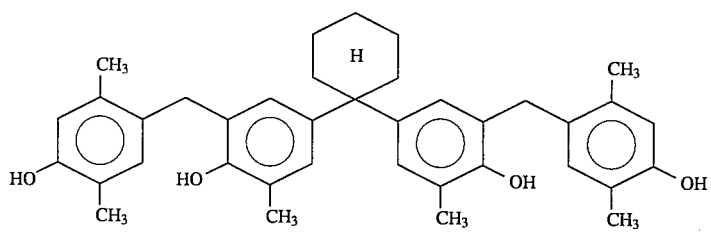

[Ib-2]

-continued
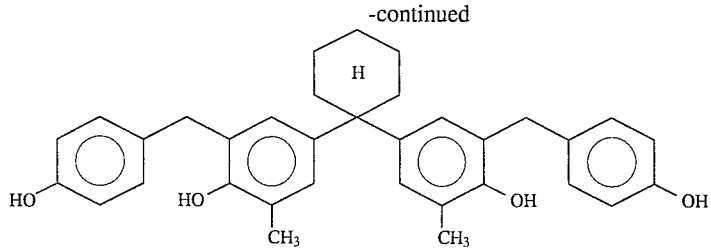
[Ib-3]
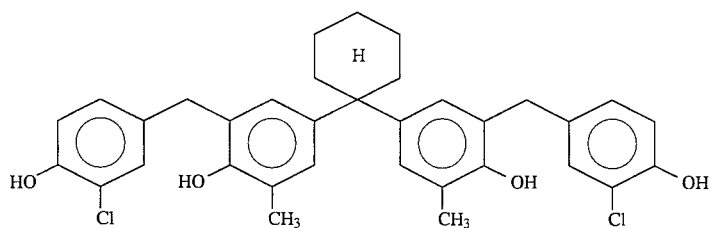
[Ib-4]
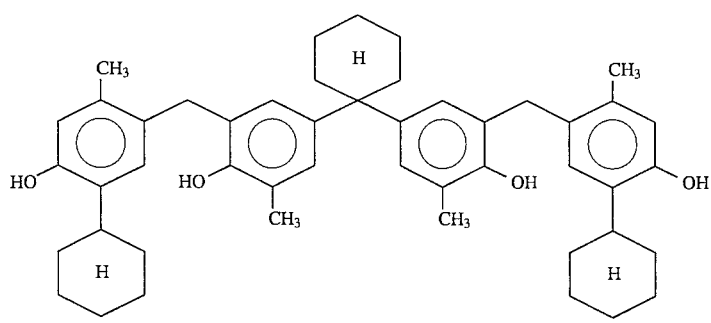
[Ib-5]
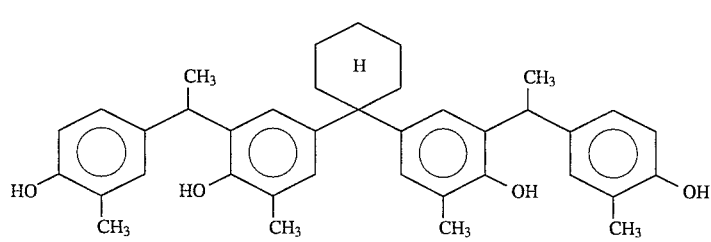
[Ib-6]
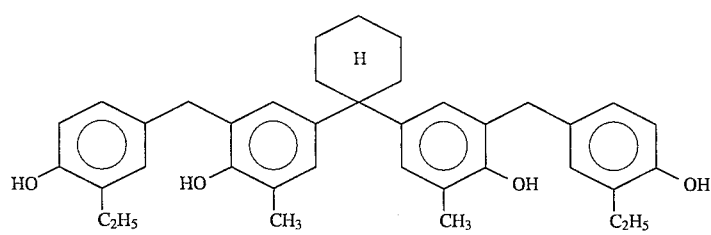
[Ib-7]
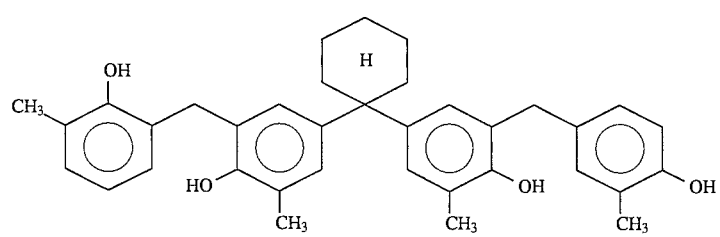
[Ib-8]
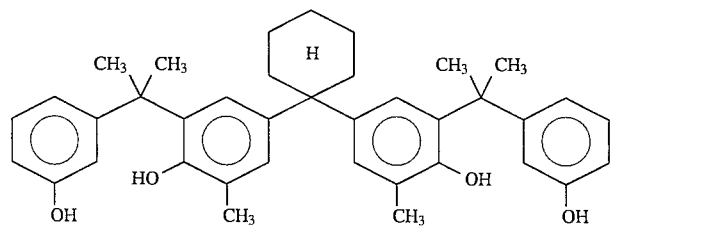
[Ib-9]

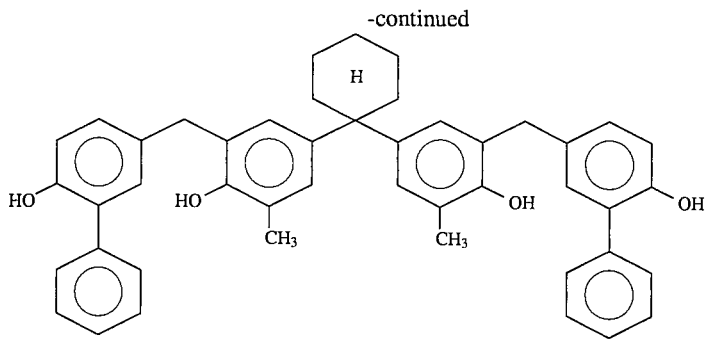

[Ib-10]

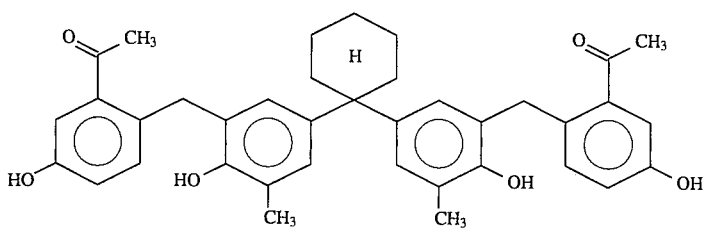

[Ib-11]

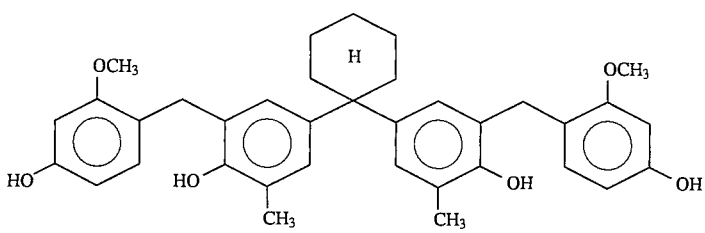

[Ib-12]

Among these compounds, Compounds (Ib-1), (Ib-2) and (Ib-3) can exert the best effect of accomplishing the objects of the present invention.

The photosensitive material of the present invention can be obtained by the esterification reaction of e.g., the foregoing water-insoluble alkali-soluble low molecular compound with 1,2-naphthoquinonediazide-5-(and/or -4-)sulfonyl chloride in the presence of a basic catalyst.

In some detail, a predetermined amount of such a water-insoluble alkali-soluble low molecular compound and a solvent such as 1,2-naphthoquinonediazide-5-(and/or -4-)sulfonyl chloride, acetone, methyl ethyl ketone, methyl isobutyl ketone, 1,4-dioxane, tetrahydrofuran, dimethoxyethane, diglyme, ethyl acetate, acetonitrile, chloroform, dichloromethane, dichloroethane, chlorobenzene, N-methylpyrrolidone and γ-butyl lactone are charged into a flask. A basic catalyst such as sodium hydroxide, sodium carbonate, sodium hydrogencarbonate, triethylamine, N-methylmorpholine, N-methylpiperidine, N-methylpyrrolidine and 1,4-dimethylpiperazine is then added dropwise to the mixture to effect condensation. The resulting product is crystallized from water, washed with water, purified, and then dried.

In the ordinary esterification reaction, mixtures having different esterification degrees and esterification positions are obtained. The use of the water-insoluble alkali-soluble low molecular compound of the present invention makes it possible to effect the selective esterification of diester compounds. However, it is necessary that the content of diester compounds and the content of complete ester compounds be controlled to not less than 40% and less than 10%, respectively, as calculated in terms of area ratio determined by high performance liquid chromatography. If the content of diester compounds falls below 40% and the content of complete ester compounds exceed 10%, the dependence on film thickness is increased, making it impossible to exert the effects of the present invention. Preferably, the content of diester compound is not less than 50%, and the content of complete ester compounds is less than 6%. More preferably, the content of diester compound is not less than 60%, and the content of complete ester compounds is less than 6%.

In order to further enhance the selectivity of the esterification reaction, 1,4-dioxane, tetrahydrofuran, dimethoxyethane, diglyme, ethyl acetate, chloroform, dichloromethane, dichloroethane and chlorobenzene are preferably used among the foregoing solvents. Preferred among the foregoing basic catalysts are N-methylmorpholine, N-methylpiperidine, N-methylpyrrolidine and 1,4-dimethylpiperazine. Particularly preferred among these basic catalysts are N-methylpiperidine and N-methylpyrrolidine.

If necessary, 1,2-naphthoquinonediazide-5-sulfonic ester and 1,2-naphthoquinonediazide-4-sulfonic ester may be used in combination. The temperature at which the foregoing reaction occurs is normally in the range of −20° C. to 60° C., preferably 0° C. to 40° C.

One or more of the photosensitive compounds according to the first and second aspects of the present invention may be used singly or in combination in the form of a blend with an alkali-soluble resin. The amount of the photosensitive compounds to be added is in the range of 5 to 100 parts by weight, preferably 20 to 60 parts by weight based on 100 parts by weight of the alkali-soluble resin. If the amount falls below 5 parts by weight, the percent film retention is remakably reduced. On the contrary, if the amount exceeds 100 parts by weight, the sensitivity and the solubility in the solvent are reduced.

Examples of the alkali-soluble resin employable in the first and second aspects of the present invention include a novolak resin, an acetone-pyrogallol resin, polyhydroxystyrene, and derivatives thereof.

Particularly preferred among these alkali-soluble resins is a novolak resin. The novolak resin can be obtained by addition condensation of an aldehyde with a predetermined monomer as a main component in the presence of an acidic catalyst.

Examples of such a predetermined monomer include cresols such as phenol, m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-t-butylphenol, trialkylphenols such as 2,3,5-trimethylphenol and 2,3,4-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxyaromatic compounds such as m-chlorophenol, p-chlorophenol, o-chlorophenol, dihydroxybiphenyl, bisphenol A, phenylphenol, resorcinol and naphthol. These monomers may be used singly or in combination. The present invention should not be limited to these monomers.

Examples of aldehydes to be used include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzoaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetal compounds thereof, e.g., chloroacetaldehyde diethyl acetal. Preferred among these aldehydes is formaldehyde.

These aldehydes may be used singly or in combination. As acidic catalysts there can be used hydrochloric acid, sulfuric acid, formic acid, acetic acid, and oxalic acid.

Techniques as disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, and JP-A-4-122938 may be employed. In some detail, novolak resins free of or having a reduced amount of a low molecular component are preferably used.

The weight-average molecular weight of the novolak resin thus obtained is preferably in the range of 1,000 to 20,000. If this value falls below 1,000, the reduction in the film on the unexposed portion after development is increased. On the contrary, if this value exceeds 20,000, the development speed is reduced. The particularly preferred range of the weight-average molecular weight of the novolak resin is from 2,000 to 15,000. The weight-average molecular weight of the novolak resin is defined by gel permeation chromatography as calculated in terms of polystyrene.

The degree of dispersion (ratio of the weight-average molecular weight Mw/the number-average molecular weight Mn, i.e., Mw/Mn) of the novolak resin is preferably in the range of 1.5 to 5.0, more preferably 1.5 to 4.0. If Mw/Mn exceeds 7, the effect of the present invention of keeping little dependence on film thickness cannot be attained. On the other hand, if Mw/Mn falls below 1.5, the synthesis of the novolak resin requires a high precision purification procedure which cannot be put into practical use.

In the present invention, the foregoing photosensitive material should be used. If necessary, the product of the esterification reaction of the following water-insoluble alkali-soluble low molecular compound with 1,2-naphthoquinonediazide-5- (and/or -4-) sulfonyl chloride may be used in combination with the foregoing photosensitive material.

The weight ratio of the naphthoquinonediazide esterification product of the water-insoluble alkali-soluble low molecular compound as photosensitive material to the photosensitive material of the present invention is preferably in the range of 20/80 to 80/20 in the first and second aspects of the present invention. In other words, if the proportion of the photosensitive material in all the photosensitive materials falls below 20% by weight, the effects of the present invention cannot be thoroughly exerted.

Examples of such a water-insoluble alkali-soluble low molecular compound include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone and 2,3,4,3',4',5'-hexahydroxybenzophenone, polyhydroxyphenylalkylketones such as 2,3,4-trihydroxyacetophenone, 2,3,4-trihydroxyphenylpenthylketone and 2,3,4-trihydroxyphenylhexylketone, bis((poly)hydroxyphenyl)alkanes such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroguaiaretic acid, ester polyhydroxybenzoates such as propyl 3,4,5-trihydroxybenzoate, phenyl 2,3,4-trihydroxybenzoate and phenyl 3,4,5-trihydroxybenzoate, bis(polyhydroxybenzoyl) alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene and bis(2,4,6-trihydroxybenzoyl)benzene, alkylene di(polyhydroxybenzoate)'s such as ethylene glycol di(3,5-dihydroxybenzoate) and ethylene glycol di(3,4,5-trihydroxybenzoate), polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol and 2,3,4,2',3',4'-biphenylhexol, bis(polyhydroxy)sulfides such as 4,4'-thiobis(1,3-dihydroxy)benzene, bis(polyhydroxyphenyl)ethers such as 2,2', 4,4'-tetrahydroxydiphenylether, bis(polyhydroxyphenyl)sulfoxides such as 2,2',4,4'-tetrahydroxydiphenyl sulfoxide, bis(polyhydoxyphenyl)sulfones such as 2,2',4,4'-diphenylsulfone, polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane and 2,4,6,2',4',6'-hexahydroxy-5,5'dipropionyltriphenylmethane, polyhydroxyspirobi-indanes such as 3,3,3',3'-tetramethyl-1,1'-spirobi-indane-5,6,5',6'-tetrol, 3,3,3',3'-tetramethyl-1,1'-spriobi-indane-5,6,7,5',6',7'-hexol, 3,3,3',3'-tetramethyl-1,1'-spirobi-indane-4,5,6,4',5',6'-hexol and 3,3,3',3'-tetramethyl-1,1'-spirobi-indane-4,5,6,5',6',7'hexol, polyhydroxy phthalides such as 3,3-bis(3,4-dihydroxyphenyl)phthalide, 3,3-bis(2,3,4-trihydroxyphenyl)phthalide and 3',4',5',6'-tetrahydroxyspiro [phthalide-3,9'-xanthene], flavono dyes such as morin, quercetin and rutin, polyhydroxy compounds described in JP-A-4-253058 such as α,α',α"-tris(4-hydroxyphenyl)-1,3,5-triisopropylbenzene, α,α',α"-tris(3,5-dimethyl-4-hydroxyphenyl)-1,3,5-triisopropylbenzene, α,α',α"-tris(3,5-diethyl-4-hydroxyphenyl)-1,3,5-triisopropylbenzenne, α,α',α"-tris(3,5-di-n-propyl-4-hydroxyphenyl)-1,3,5-triisopropylbenzene, α,α',α"-tris(3,5-diisopropyl-4-hydroxyphenyl)-1,3,5-triisopropylbenzene, α,α',α"-tris(3,5-di-n-butyl-4-hydroxyphenyl)-1,3,5-triisopropylbenzene, α,α',α"-tris(3-methyl-4-hydroxyphenyl)-1,3,5-triisopropylbenzene, α,α',α"-tris(3-methoxy-4-hydroxyphenyl)-1,3,5-trisopropylbenzene, α,α',α"-tris(2,4-dihydroxyphenyl)-1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl) ethyl]benzene,1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α,α'-bis(3"-methyl-4"-hydroxyphenyl)ethyl]benzene, 1-[α-methyl-α-(3'-methoxy-4'-hydroxyphenyl)ethyl]-4-[α,α'-bis(3"-methoxy-4"-hydroxyphenyl)ethyl]benzene, 1-[α-methyl-α-(2',4'dihydroxyphenyl)ethyl]-4-[α,α'-bis(4"-hydroxyphenyl)ethyl]benzene and 1-[α-methyl-α-(2',4'-dihydroxyphenyl)ethyl]-3-[α'",α'-bis(4"-hydroxyphenyl)ethyl]benzene, p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3bromobenzoyl)benzene, p-bis(2,3,4-trihydroxy-5-methylbenzoyl) benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris (2,3,4-trihydroxybenzoyl)benzene, 1,2,4-tris (2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α"-tris(2,3,4-trihydroxybenzoyl)mesitylene, 2,6-bis-(2'-hydroxy-3',5'-dimethyl-benzyl)-p-cresol, 2,6-bis-(2'-hydroxy-5'-methyl-benzyl)-p-cresol, 2,6-bis-(2'-hydroxy-3',5'-di-t-butyl-benzyl)-p-cresol, 2,6-bis-(2'-hydroxy-5'-ethyl-benzyl)-p-cresol, 2,6-bis-(2',4'-dihydroxy-benzyl)-p-cresol, 2,6-bis-(2'-hydroxy-3'-t-butyl-5'-methyl-benzyl)-p-cresol, 2,6-bis-(2',3',4'-trihydroxy-5'-acetyl-benzyl)-p-cresol, 2,6-bis(2',4',6'-trihydroxy-benzyl)-p-cresol, 2,6-bis-(2',3',4'-trihydroxy-benzyl)-p-cresol, 2,6-bis-(2',3',4'-trihydroxybenzyl)-3,5-dimethyl-phenol, 4,6-bis-(4'-hydroxy-3',5'-dimethyl-benzyl)-pyrogallol, 4,6-bis-(4'-hydroxy-3',5'-dimethoxybenzyl)-pyrogallol, 2,6-bis-(4'-hydroxy-3',5'-dimethyl-benzyl)-1,3,4-trihydroxy-phenol, 4,6-bis-(2',4',6'-trihydroxy-benzyl)-2,4-dimethyl-phenol, and 4,6-bis-(2',3',4'-trihydroxy-benzyl)-2,5-dimethyl-phenol.

Further, lower nucleus compounds of phenol resin such as novolak resin can be used.

The composition of the present invention may further comprise other water-insoluble alkali-soluble low molecular compounds to accelerate its solubility in the developer. Preferred examples of such water-insoluble alkali-soluble low molecular compounds include phenols, resorcin, phloroglucin, 2,3,4-trihydroxybenzophenone,2,3,4,4'-tetrahydroxybenzophenone, 2,3,4,3',4',5'-hexahydroxybenzophenone, acetone-pyrogallol condensation resin, phloroglucide, 2,4,2',4'-biphenyltetrol, 4,4'-thiobis (1,3-dihydroxy)benzene, 2,2',4,4'-tetrahydroxydiphenylether, 2,2',4,4'-tetrahydroxydiphenylsulfoxide, 2,2',4,4'-tetrahydroxydiphenylsulfone, tris (4-hydroxyphenyl )methane, 1,1-bis(4-hydroxyphenyl)cyclohexane, 4,4'-(α-methylbenzylidene)bisphenol, α,α',α"-tris(4-hydroxyphenyl )1,3,5-triisopropylbenzene, α,α', α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxphenyl)ethane, 1,1,3-tris(hydroxyphenyl)butane, and para [α,α,α',α'-tetrakis(4-hydroxyphenyl)]-xylene.

In the first and second aspects of the present invention, these water-insoluble alkali-soluble low molecular compounds may be added normally in an amount of not more than 100 parts by weight, preferably 5 to 50 parts by weight based on 100 parts by weight of all the quinonediazide compounds.

Examples of solvent for dissolving the photosensitive material and alkali-soluble novolak resin of the present invention therein include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, and butyl acetate. These organic solvents may be used singly or in combination.

Further, high boiling solvents such as N-methylformamide, N,N-dimethylformamide, N-methylacetamide, N,N-dimethylacetamide, N-methylpyrrolidone, dimethyl sulfoxide and benzyl ethyl ether may be used in admixture.

The positive-working photoresist composition of the present invention may comprise a surface active agent incorporated therein to further enhance coating properties such as anti-striation properties.

Examples of such a surface active agent include nonionic surface active agents such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl allyl ethers (e.g., polyoxyethylene octyl phenol ether, polyoxyethylene nonyl phenol ether), polyoxyethylene-polyoxypropylene block copolymers, sorbitan aliphatic esters (e.g., sorbitan monolaurate, sorbitan monopalmitate, sorbitan monostearate, sorbitan monooleate, sorbitan trioleate, sorbitan tristearate) and polyoxyethylene sorbitan aliphatic esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate), fluorine surface active agents such as F Top EF301, EF303 and EF352 (produced by Shinakita Kasei K.K.), Megafac F171, F173 (produced by Dainippon Ink And Chemicals, Incorporated), Florad FC430, FC431 (produced by Sumitomo 3M), and Asahi Guard AG710, Surflon S-382, SC101, SC102, SC103, SC104, SC105, SC106 (Asahi Glass Company, Limited), Organosiloxane polymer KP341 (produced by The Shin-etsu Chemical Industry Co., Ltd.), and acrylic or methacrylic (co)polymer Polyflow Nos. 75 and 95 (produced by Kyoeisha Yushi kagaku Kogyo K.K.). Particularly preferred among these surface active agents are fluorine surface active agents and silicone surface active agents. The amount of such a surface active agent to be blended in the system is normally in the range of not more than 2 parts by weight, preferably not more than 1 part by weight based on 100 parts by weight of the total amount of the alkali-soluble resin and the quinonediazide compound in the composition of the present invention.

These surface active agents can be added to the system singly or in combination.

As a developer for the positive-working photoresist composition of the present invention there can be used an aqueous solution of an inorganic alkali such as sodium hydroxide, potassium hydroxide, sodium carbonate, sodium silicate, sodium metasilicate and aqueous ammonia, primary amine such as ethylamine and n-propylamine, secondary amine such as diethylamine and di-n-butylamine, tertiary amine such as triethylamine and methyldiethylamine, alcohol amine such as dimethylethanolamine and triethanolamine, quaternary ammonium salt such as tetramethylammonium hydroxide, tetraethylammonium hydroxide and choline, cyclic amine such as pyrrole and piperidine, etc. To such an aqueous solution of an alkali may be added an alcohol such as isopropyl alcohol and a surface active agent such as a nonionic type in a proper amount.

The positive-working photoresist composition of the present invention may comprise a light absorber, crosslinking agent, adhesive, etc. as necessary. The light absorber is optionally used to inhibit halation from the substrate or enhance the visibility of the positive-working photoresist composition applied to a transparent substrate. Preferred examples of the light absorber employable in the present invention include commercially available light absorbers described in "Kogyoyo Shikiso no gijutsu to shijo (Techinque and market of industrial dyes)", CMC Shuppan, and "Senryou Binran (Handbook of Dyes)", Yuki Gosei Kagaku Kyokai, such as C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Violet 43, C.I. Disperse Blue 96, C. I. Fluorescent Brightening Agent 112, 135 and 163, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10, and C.I. Pigment Brown 2. The light absorber is blended in the positive-working photoresist composition normally in the range of not more than 100 parts by weight, preferably not more than 50 parts by weight, more preferably not more than 30 parts by weight, per 100 parts by weight of the alkali-soluble resin.

The crosslinking agent is added in such an amount that the formation of positive image is not affected. The main purposes of the addition of the crosslinking agent are adjustment of sensitivity, enhancement of heat resistance and dry etching resistance, etc.

Examples of the crosslinking agent employable in the present invention include compounds obtained by allowing formaldehyde to act on melamine, benzoguanamine, glycoluril, etc., alkyl-modification products thereof, epoxy compounds, aldehydes, azides, organic peroxides, and hexamethylenetetramine. These crosslinking agents may be blended in the photosensitive material in an amount of less than 10 parts by weight, preferably less than 5 parts by weight, based on 100 parts by weight of the latter. If this amount exceeds 10 parts by weight, the sensitivity of the resulting photoresist is reduced and scum (resist residue) can easily occur.

The adhesive aid is used to enhance the adhesivity between the substrate and the resist, preventing the resist from being peeled off the substrate particularly at the etching step. Specific examples of the adhesive aid employable in the present invention include chlorosilanes such as chloromethylsilane, trimethylchlorosilane, dimethylvinylchlorosilane, methyldiphenylchlorosilane and chloromethyldimethylchlorosilane, alkoxysilanes such as trimethylmethoxysilane, dimethyldiethoxysilane, methyldimethoxysilane, dimethylvinylethoxysilane, diphenyldimethoxysilane and phenyltriethoxysilane, silazalanes such as hexamethyldisilazalane, N,N'-bis(trimethylsilyl)urea, dimethyltrimethylsilylamine and trimethylsilylimidazole, silanes such as vinyltrichlorosilane, γ-chloropropyltrimethoxysilane, γ-aminopropyltriethoxysilane and γ-glycidoxypropyltrimethoxysilane, heterocyclic compounds such as benzotriazole, benzoimidazole, indazole, imidazole, 2-mercaptobenzimidazole, 2-mercaptobenzthiazole, mercaptobenzoxazole, urazole, thiouracil, mercaptoimidazole and mercaptopyrimidine, and urea or thiourea compounds such as 1,1-dimethylurea and 1,3-dimethylurea.

These adhesive aids are blended normally in an amount of less than 10 parts by weight, preferably less than 5 parts by weight, per 100 parts by weight of the alkali-soluble resin.

The positive-working photoresist composition of the present invention may comprise a dye and plasticizer incorporated therein as necessary.

Specific examples of these additives include dyes such as methyl violet, crystal violet and malachite green, and plasticizers such as stearic acid, acetal resin, phenoxy resin and alkyd resin.

The positive-working photosensitive composition thus prepared is applied to a substrate for use in the production of precision integrated circuit elements (e.g., transparent substrate such as silicon/silicon dioxide-coated substrate, glass substrate and ITO substrate) by an appropriate coating means such as spinner and coater, prebaked, exposed to light through a mask, postbaked (PEB: post exposure bake), developed, rinsed, and then dried to obtain an excellent resist.

The third aspect of the present invention will be further described hereinafter.

The ionization-sensitive radioactive compound (A) is preferably a compound represented by formula ($A_1$) or ($A_2$) and the ionization-sensitive radioactive compound (B) is preferably a compound represented by formula ($B_1$) or ($B_2$):

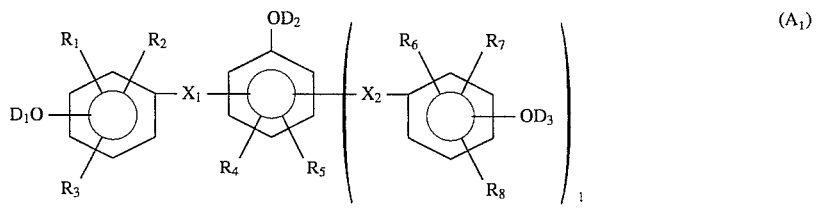

-continued

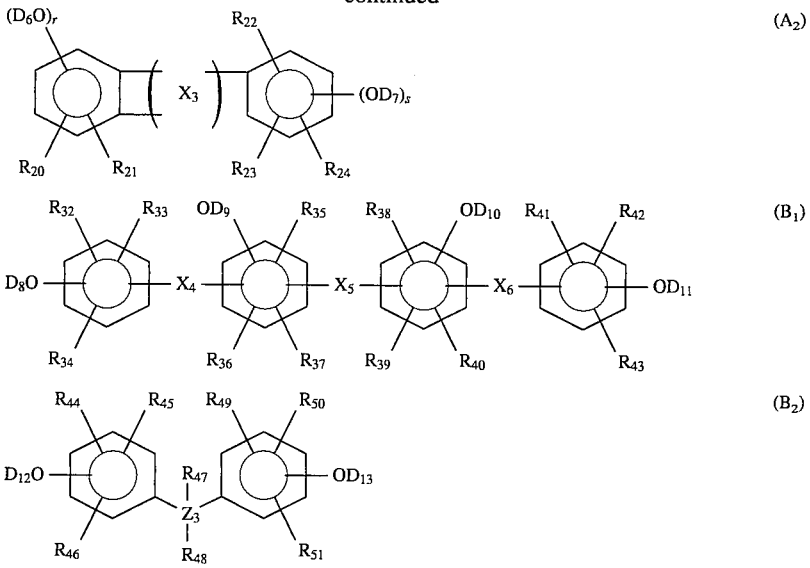

wherein $R_1$ to $R_8$ and $R_{20}$ to $R_{24}$ each represent a hydrogen atom, —CN, —X—$R_{a1}$ or a halogen atom;

$X_1$ and $X_2$ each represent a single bond, a carbonyl group, a sulfide group, a sulfonyl group or —C($R_{b1}$)($R_{b2}$)—, with the proviso that when l is 0, $X_1$ represents a group represented by formula ($A_{11}$) or ($A_{12}$)

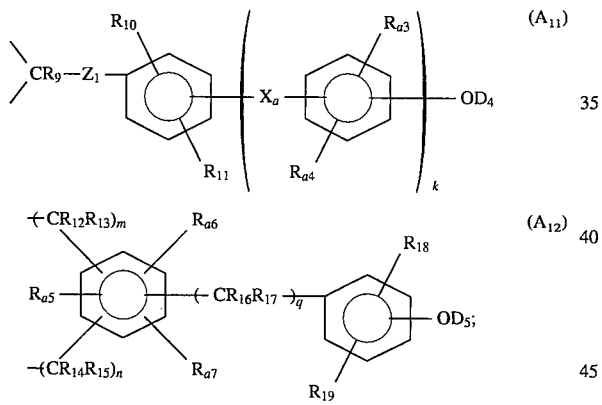

$X_3$ represents a group represented by formula ($A_{21}$) or ($A_{22}$):

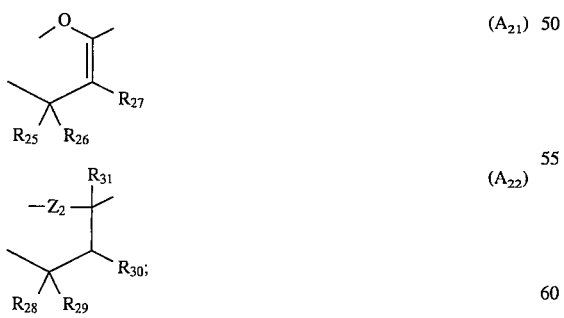

$R_9$, $R_{12}$ to $R_{17}$, $R_{25}$ to $R_{31}$, $R_{b1}$, and $R_{b2}$ each represent a hydrogen atom, a methyl group, an ethyl group or a $C_{1-2}$ haloalkyl group, with the proviso that $R_{b1}$ and $R_{b2}$, $R_{25}$ and $R_{26}$, $R_{28}$ and $R_{29}$, and R30 and $R_{31}$ may be connected to each other to form an alicyclic hydrocarbon residue;

$R_{10}$, $R_{11}$, $R_{a3}$, $R_{a4}$, $R_{18}$ and $R_{19}$ each represent a hydrogen atom, —X—$R_{a1}$, —CN or a halogen atom;

X represents a single bond, —O—, —S—, —CO—, —OC(=O)— or N($R_{a1}$)CO—;

$X_a$ represents a carbonyl group, a sulfide group, a sulfonyl group or —C($R_{b1}$)($R_{b2}$)—;

$R_{a1}$ represents a $C_{1-10}$ alkyl group, an aryl group or an aralkyl group;

$R_{a5}$ to $R_{a7}$ represent a hydrogen atom, a methyl group, an ethyl group or a $C_{1-2}$ haloalkyl group;

$Z_1$ represents a single bond or a trivalent alicyclic hydrocarbon group formed with $CR_9$;

$Z_2$ represents a single bond or —O—;

k and l each represent an integer 0 or 1;

m and n each represent an integer 1 or 2;

q represents an integer 1 to 8;

r and s each represent an integer 1 or 2, with the proviso that r and s satisfy the equation r+s=3;

$D_1$ to $D_7$ each represent a hydrogen atom or naphthoquinone-diazide-4-(and/or 5)-sulfonyl group;

$R_{32}$ to $R_{46}$, and $R_{49}$ each represent a hydrogen atom, —CN, —X—$R_{a1}$ or a halogen atom;

$R_{47}$ represents a hydrogen atom, a methyl group, an ethyl group, a $C_{1-2}$ haloalkyl group or $R_c$, with the proviso that $R_c$ is a group represented by formula ($B_{21}$):

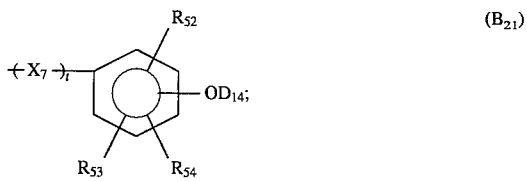

$R_{48}$ represents a hydrogen atom, a methyl group, an ethyl group, a $C_{1-2}$ haloalkyl group or $R_d$, with the proviso that $R_d$ is a group represented by formula ($B_{22}$):

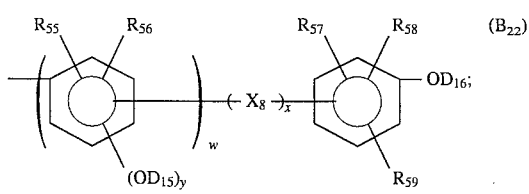

$R_{50}$ and $R_{51}$ each represent a hydrogen atom, —CN, —X—$R_{a1}$ or a halogen atom, with the proviso that when $R_{47}$ is different from $R_c$ and $R_{48}$ is different from $R_d$, $R_{50}$ and $R_{51}$ each represent $R_c$; $X_4$ to $X_6$ each represent a single bond, a carbonyl group, a sulfide group, a sulfonyl group or —C($R_{b1}$)($R_{b2}$)—;

$X_7$ and $X_8$ each represent a single bond or —(C$R_{60}$$R_{61}$)$_u$(CH=CH)$_v$—; $R_{52}$ and $R_{59}$ each represent a hydrogen atom, —CN, —X—$R_{a1}$ or a halogen atom;

$R_{60}$ and $R_{61}$ each represent a hydrogen atom, a methyl group, an ethyl group or a $C_{1-2}$ haloalkyl group;

$Z_3$ represents a $C_{1-6}$ tetravalent alkyl residue;

$D_8$ to $D_{16}$ each represent a hydrogen atom or a naphthoquinonediazide-4(and/or 5)-sulfonyl group;

t represents an integer 0 to 2;

u and x each represent zero or an integer of 1 to 8;

y, v and w each represent an integer 0 or 1, with the proviso that when $R_{47}$ is different from $R_c$, $R_{50}$ is different from $R_c$ and $R_{51}$ is different from $R_c$, y and w each are 1, and y is 0 otherwise; and each of the compounds represented by formulae ($A_1$), ($A_2$), ($B_1$) and ($B_2$) has two naphthoquinonediazide-4(and/or 5)-sulfonyl groups as $D_1$ to $D_{16}$ per molecule.

In formulae (A) and ($A_2$), $R_1$ to $R_8$, and $R_{20}$ to $R_{24}$ each represent a hydrogen atom, —CN, —X—$R_{a1}$ or a halogen atom. Since a group having a large alkyl group tends to add to the dependence on film thickness and gives rise to the production of development residue, $R_1$ to $R_8$, and $R_{20}$ to $R_{24}$ each preferably represent a hydrogen atom, a lower alkyl group or a lower alkoxy group, particularly a hydrogen atom, a methyl group, an ethyl group or a methoxy group.

$X_1$ and $X_2$ each represent a single bond, carbonyl group, sulfide group, sulfonyl group or —C($R_{b1}$)($R_{b2}$)—, with the proviso that when l is 0, $X_1$ represents a group represented by formula ($A_{11}$) or ($A_{12}$).

$X_1$, $X_2$ and $X_a$ each preferably represent a sulfide group, a sulfonyl group or a group represented by —C($R_{b1}$)($R_{b2}$)— in the light of coating solvent solubility, cost and ease of industrial production of the ionization-sensitive radioactive compound (A), with the proviso that when l is 0, $X_1$ is preferably a group represented by formula ($A_{11}$) or ($A_{12}$).

$X_3$ represents a group represented by formula ($A_{21}$) or ($A_{22}$). Particularly preferred is one represented by formula ($A_{22}$).

$R_9$, $R_{12}$ to $R_{17}$, $R_{25}$ to $R_{31}$, $R_{b1}$, and $R_{b2}$ each represent a hydrogen atom, a methyl group, an ethyl group or a $C_{1-2}$ haloalkyl group. In the light of dependence on film thickness and development residue, $R_9$, $R_{12}$ to $R_{17}$, $R_{25}$ to $R_{31}$, $R_{b1}$, and $R_{b2}$ each preferably represent a hydrogen atom or a methyl group.

$R_{b1}$ and $R_{b2}$, $R_{25}$ and $R_{26}$, $R_{28}$ and $R_{29}$, and $R_{30}$ and $R_{31}$ may be connected to each other to form an alicyclic hydrocarbon group.

$R_{10}$, $R_{11}$, $R_{a3}$, $R_{a4}$, $R_{18}$, and $R_{19}$ each represent a hydrogen atom, —X—$R_{a1}$, —CN or a halogen atom. From the similar standpoint of view, $R_{10}$, $R_{11}$, $R_{a3}$, $R_{a4}$, $R_{18}$, and $R_{19}$ each preferably represent a hydrogen atom, a lower alkyl group or a lower alkoxy group. Particularly preferred among these groups are a hydrogen atom, a methyl group, an ethyl group, and a methoxy group.

$Z_1$ represents a single bond or a trivalent alicyclic hydrocarbon group formed with $CR_9$, preferably a single bond.

$Z_2$ preferably represents —O—. The suffixes k and l each preferably represent an integer 1. The suffixes m, n and q each preferably represent an integer 1.

The suffixes r and s each represent an integer 1 or 2, with the proviso that r and s satisfy the equation r+s=3.

$D_1$ to $D_7$ each represent a hydrogen atom or a naphthoquinonediazide-4(and/or 5)-sulfonyl group.

In the above formulas, the hydroxyl groups that are bonded directly to aromatic rings may be referred to as phenolic hydroxyl groups.

Preferred among these ionization-sensitive radioactive compounds (A) is one represented by formula ($A_1$), particularly one wherein l is 1.

Specific examples of the ionization-sensitive radioactive compound (A) useful in the present invention will be listed below, but the present invention should not be construed as being limited thereto. D's each represent a hydrogen atom or naphthoquinonediazide-4(and/or 5)-sulfonyl group.

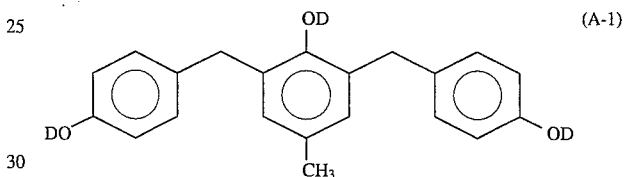

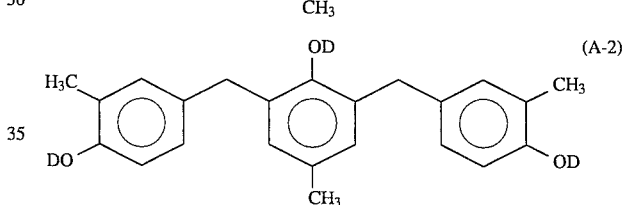

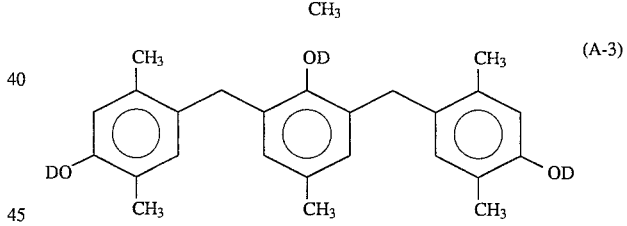

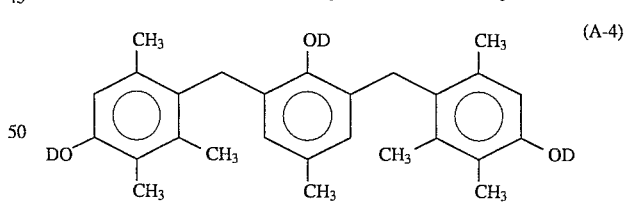

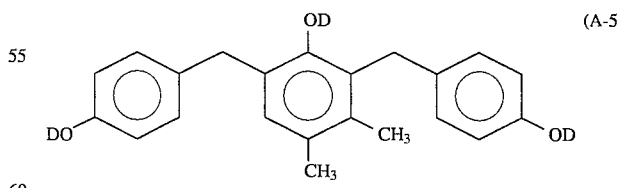

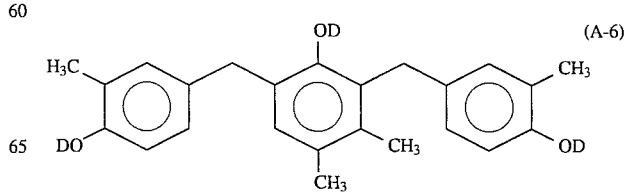

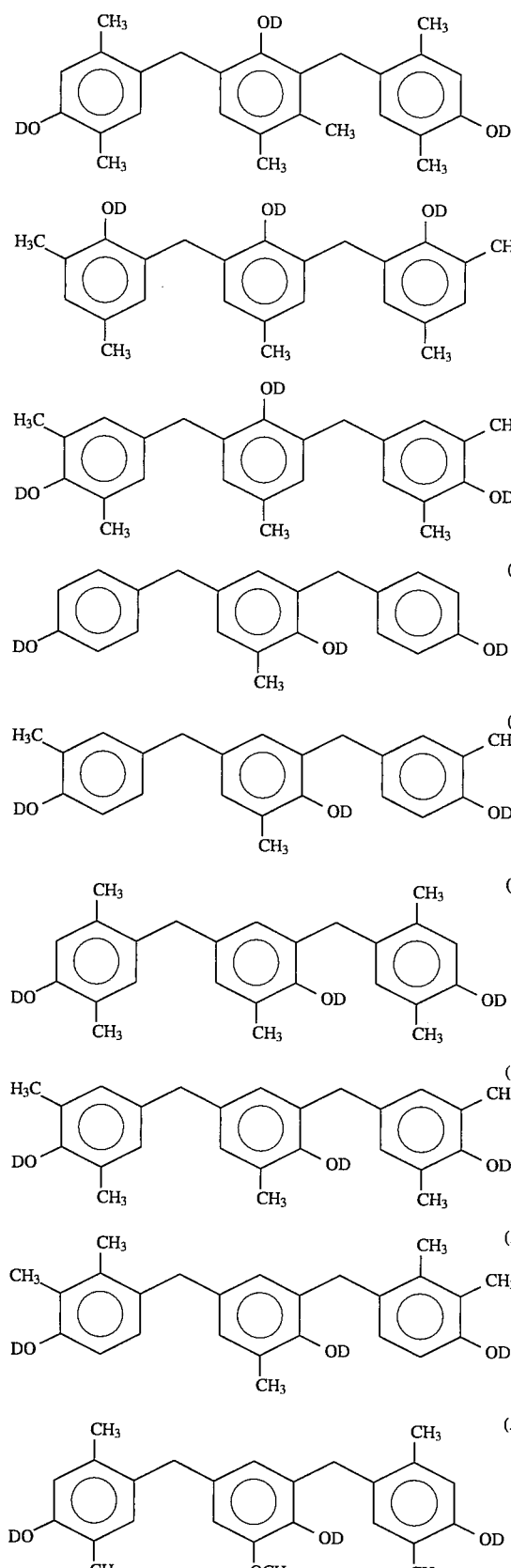

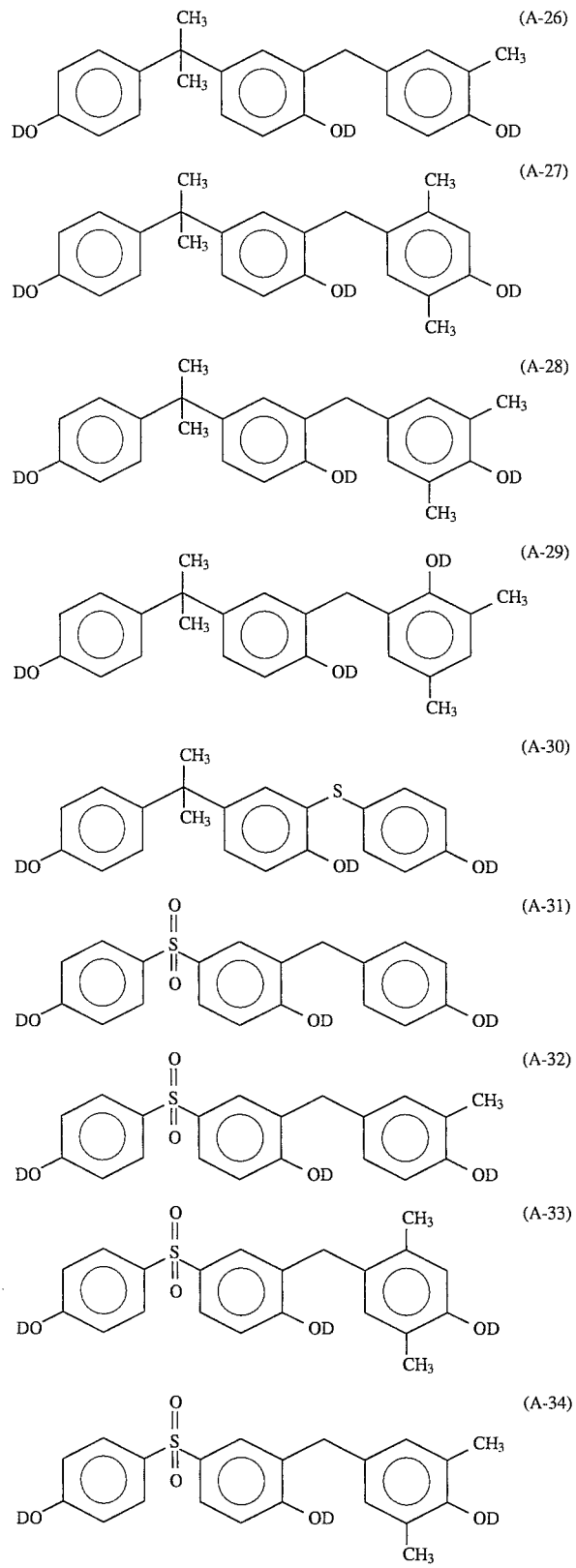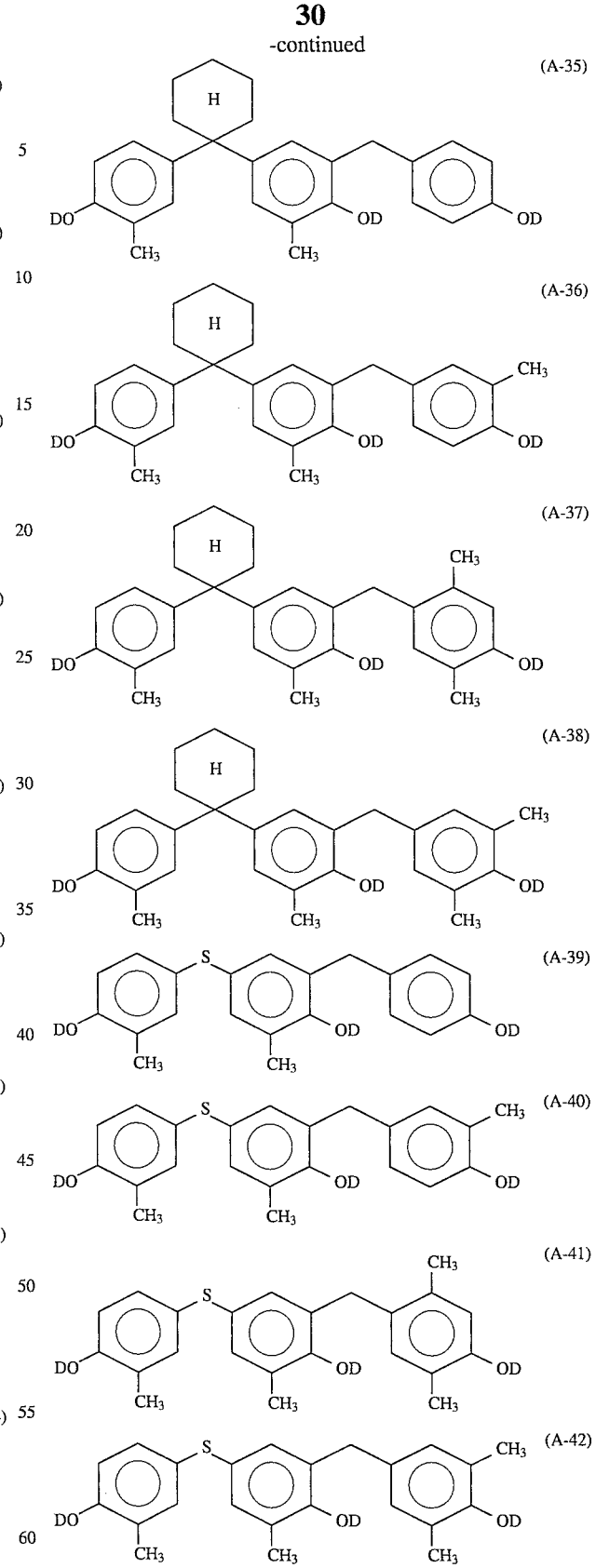

(A-43) 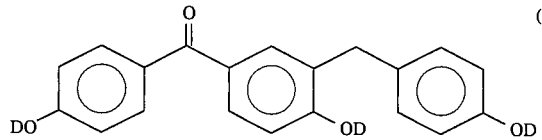
(A-44) 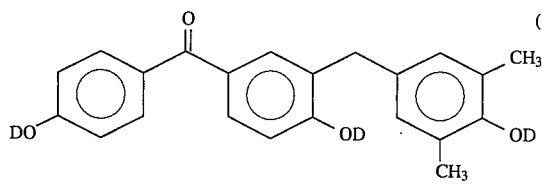
(A-45) 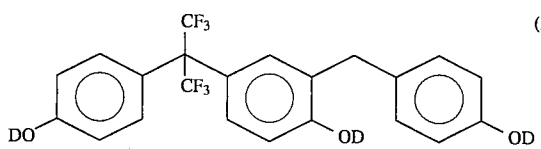
(A-46) 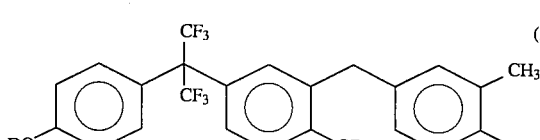
(A-47) 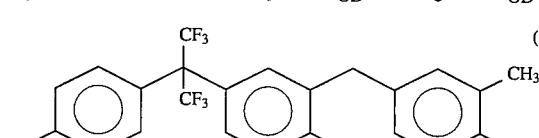
(A-48) 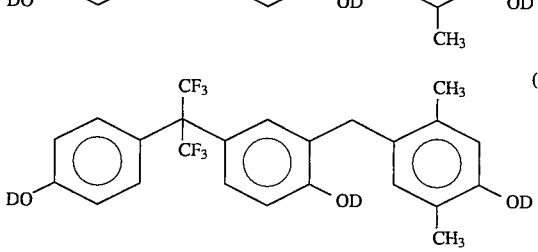
(A-49) 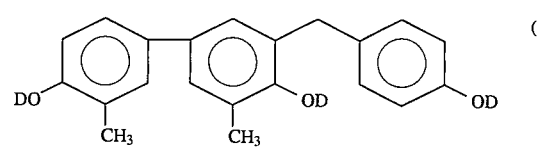
(A-50) 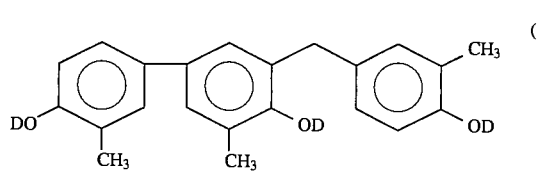
(A-51) 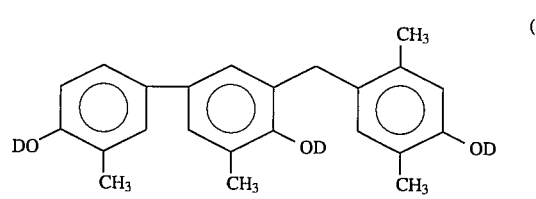
(A-52) 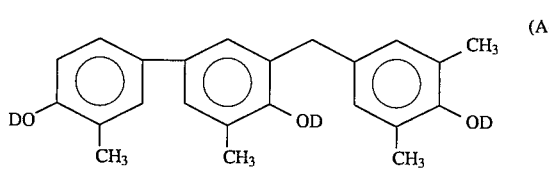
(A-53) 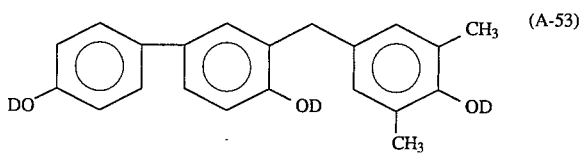
(A-54) 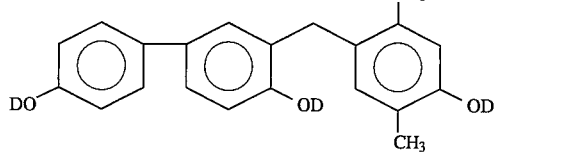
(A-55) 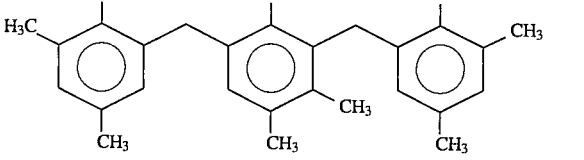
(A-56) 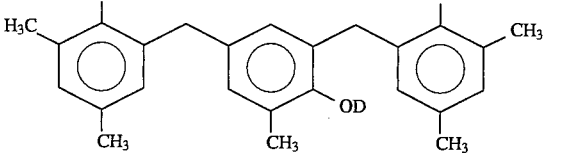
(A-57) 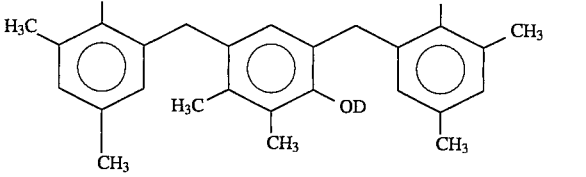
(A-58) 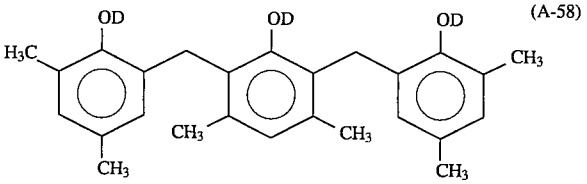
(A-59) 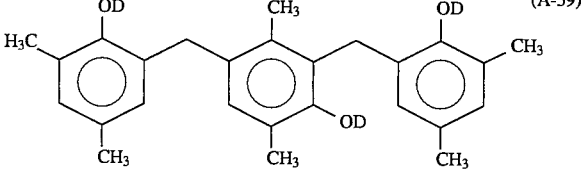
(A-60) 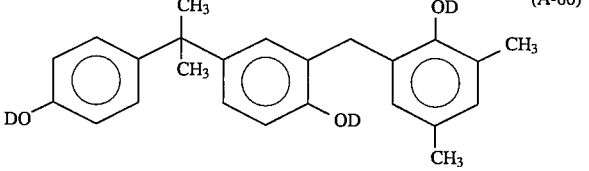

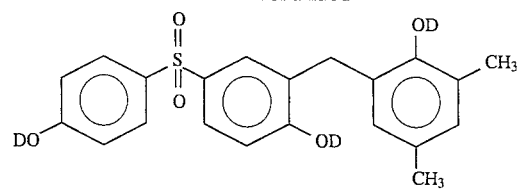 (A-61)
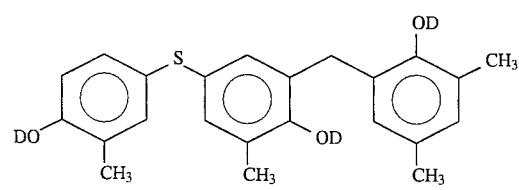 (A-62)
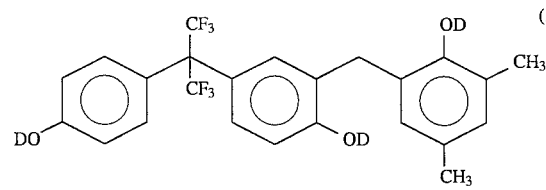 (A-63)
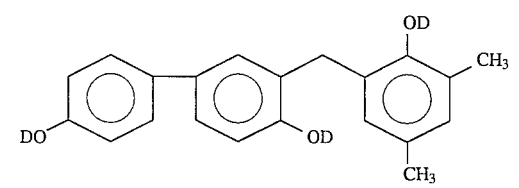 (A-64)
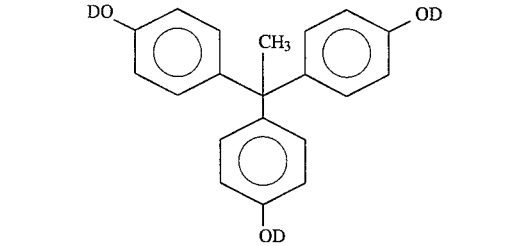 (A-65)
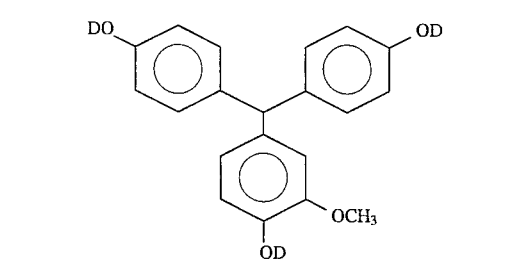 (A-66)
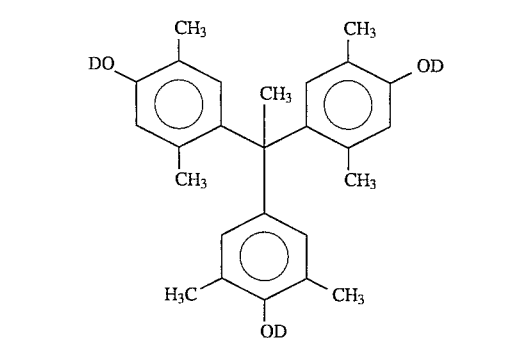 (A-67)
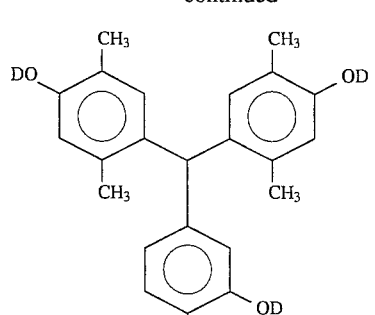 (A-68)
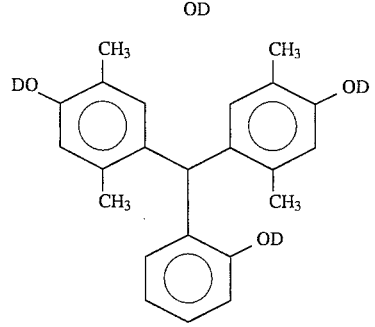 (A-69)
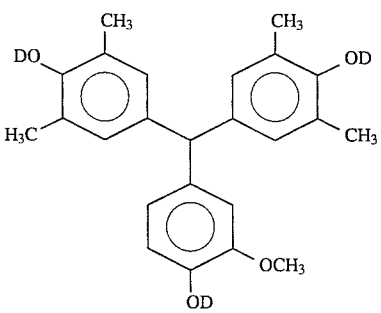 (A-70)
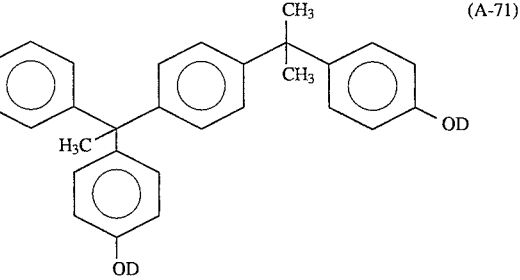 (A-71)
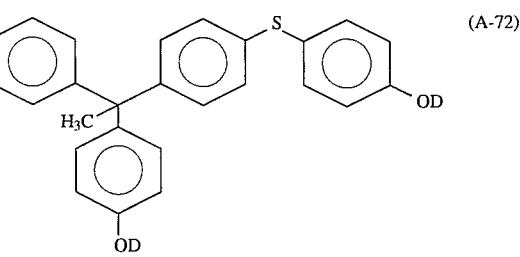 (A-72)

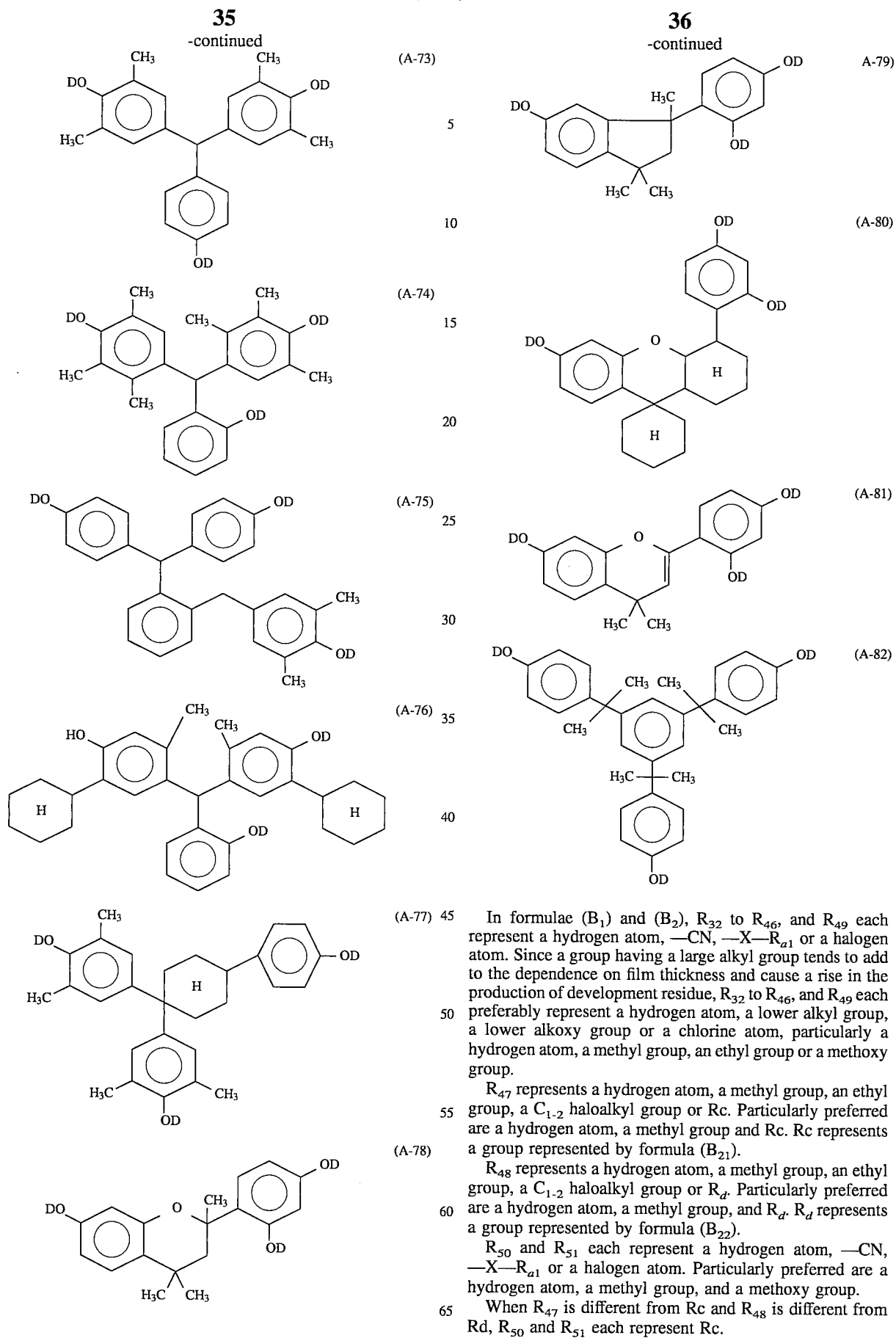

In formulae ($B_1$) and ($B_2$), $R_{32}$ to $R_{46}$, and $R_{49}$ each represent a hydrogen atom, —CN, —X—$R_{a1}$ or a halogen atom. Since a group having a large alkyl group tends to add to the dependence on film thickness and cause a rise in the production of development residue, $R_{32}$ to $R_{46}$, and $R_{49}$ each preferably represent a hydrogen atom, a lower alkyl group, a lower alkoxy group or a chlorine atom, particularly a hydrogen atom, a methyl group, an ethyl group or a methoxy group.

$R_{47}$ represents a hydrogen atom, a methyl group, an ethyl group, a $C_{1-2}$ haloalkyl group or Rc. Particularly preferred are a hydrogen atom, a methyl group and Rc. Rc represents a group represented by formula ($B_{21}$).

$R_{48}$ represents a hydrogen atom, a methyl group, an ethyl group, a $C_{1-2}$ haloalkyl group or $R_d$. Particularly preferred are a hydrogen atom, a methyl group, and $R_d$. $R_d$ represents a group represented by formula ($B_{22}$).

$R_{50}$ and $R_{51}$ each represent a hydrogen atom, —CN, —X—$R_{a1}$ or a halogen atom. Particularly preferred are a hydrogen atom, a methyl group, and a methoxy group.

When $R_{47}$ is different from Rc and $R_{48}$ is different from Rd, $R_{50}$ and $R_{51}$ each represent Rc.

$X_4$ to $X_6$ each represent a signle bond, a carbonyl group, a sulfide group, a sulfonyl group or a group represented by —$C(R_{b1})(R_{b2})$—. $X_4$ to $X_6$ each preferably represent a sulfide group, a sulfonyl group or a group represented by —$C(R_{b1})(R_{b2})$— in the light of coating solvent solubility, cost and ease of industrial production of the ionization-sensitive radioactive compound (B).

$R_{52}$ to $R_{59}$ each represent a hydrogen atom, —CN, —X—$R_{a1}$ or a halogen atom, preferably a hydrogen atom, a methyl group or a methoxy group.

$X_7$ and $X_8$ each represent a single bond or a group represented by —$(CR_{60}R_{61})_u(CH=CH)_v$—.

$R_{60}$ and $R_{61}$ each preferably represent a hydrogen atom or a methyl group.

$Z_3$ represents a $C_{1-6}$ tetravalent alkyl residue, preferably a carbon atom.

$D_8$ to $D_{16}$ each represent a hydrogen atom or a naphthoquinonediazide-4(and/or 5)-sulfonyl group.

The suffix t preferably represents an integer 0 or 1. The suffixes u and x each preferably represent an integer 0 and 1 to 4.

The suffixes y, v and w each represent an integer 0 or 1, with the proviso that when $R_{47}$ is different from $R_c$, $R_{50}$ is different from $R_c$ and $R_{51}$ is different from $R_c$, y and w each are 1, and y is 0 otherwise.

Two of $D_1$ to $D_{16}$ in each of ionization-sensitive radioactive compound molecules represented by formulae $(A_1)$, $(A_2)$, $(B_1)$ and $(B_2)$ are naphthoquinonediazide-4(and/or 5)sulfonyl groups.

In the ionization-sensitive radioactive compound to be used in the present invention, it is particularly preferred that the naphthoquinonediazidesulfonic ester group be positioned at the ends of the molecular chain.

Preferred among these ionization-sensitive radioactive compounds (B) is one represented by formula $(B_1)$.

Specific examples of the ionization-sensitive radioactive compound (B) useful in the present invention will be listed below, but the present invention should not be construed as being limited thereto.

D's each represent a hydrogen atom or naphthoquinonediazide-4(and/or 5)-sulfonyl group.

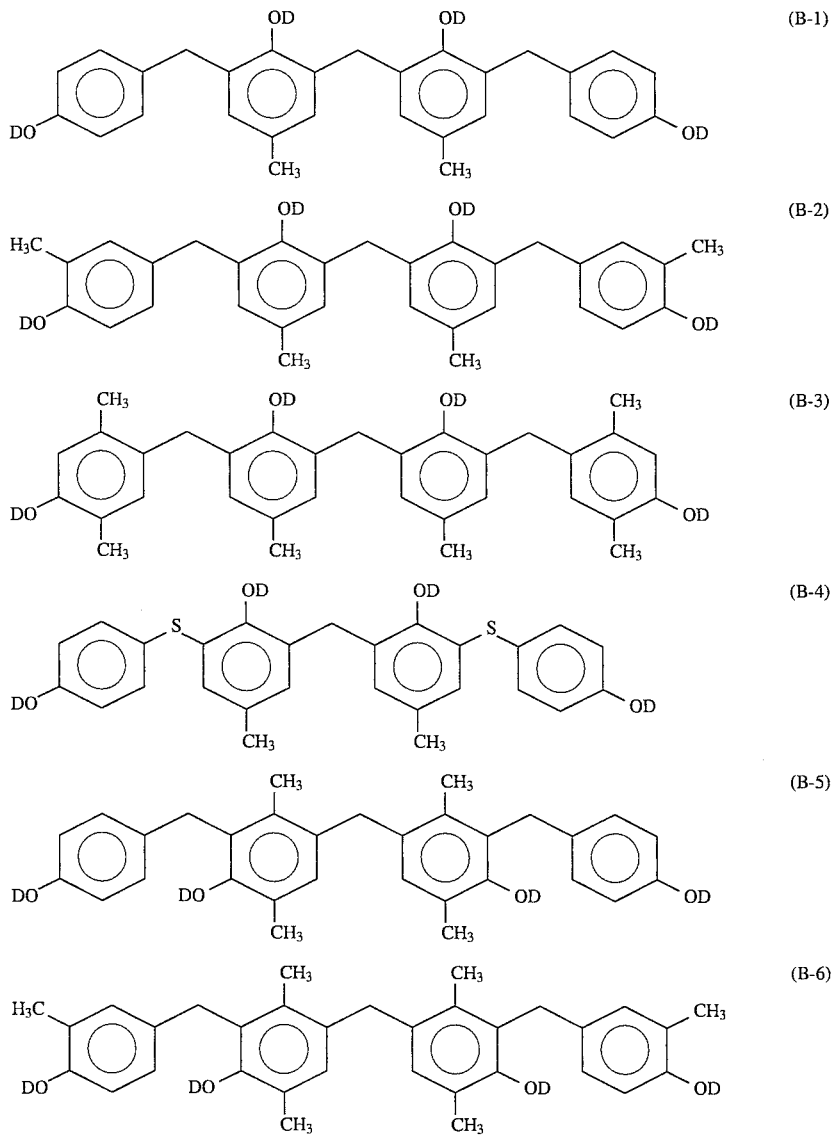

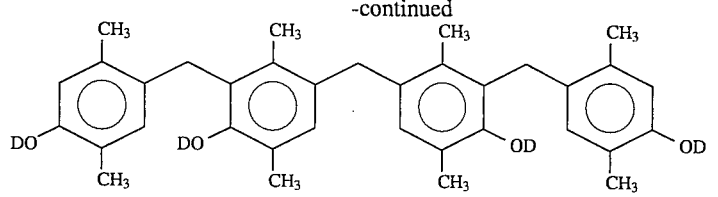
(B-7)
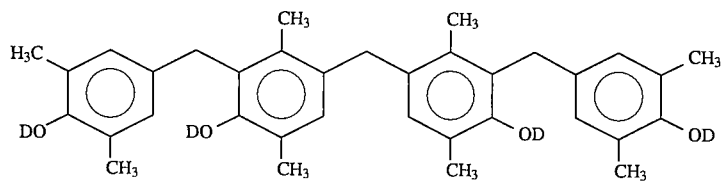
(B-8)
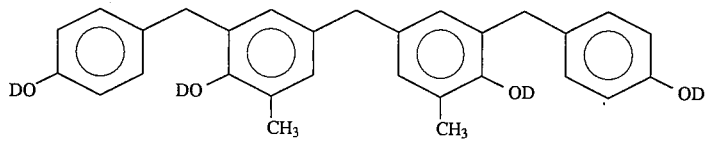
(B-9)
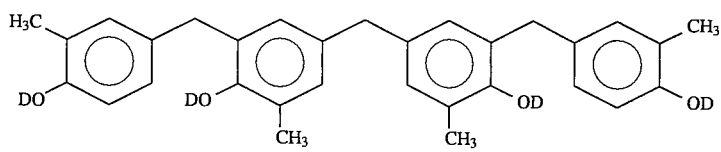
(B-10)
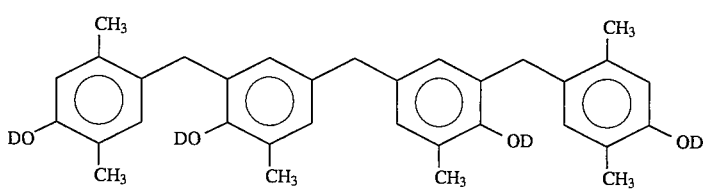
(B-11)
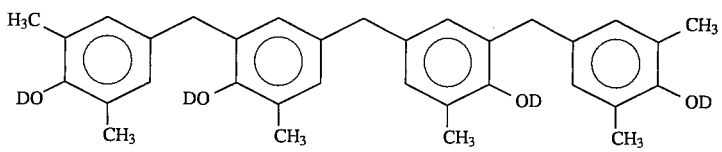
(B-12)
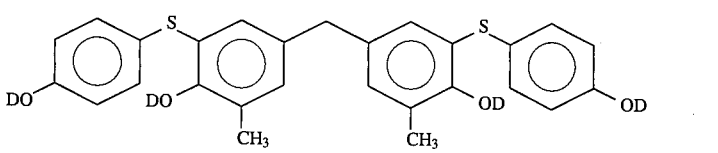
(B-13)
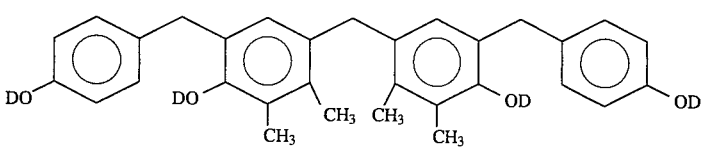
(B-14)
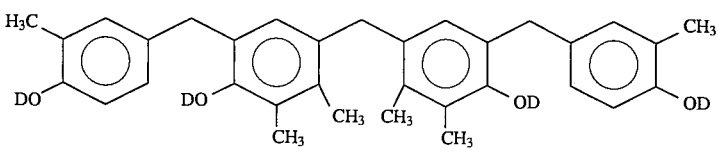
(B-15)
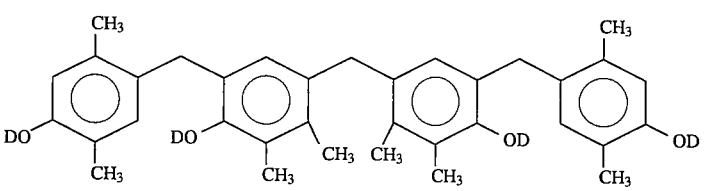
(B-16)

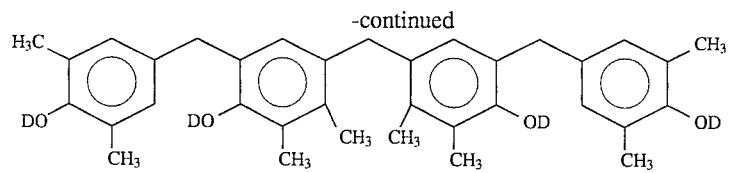 (B-17)
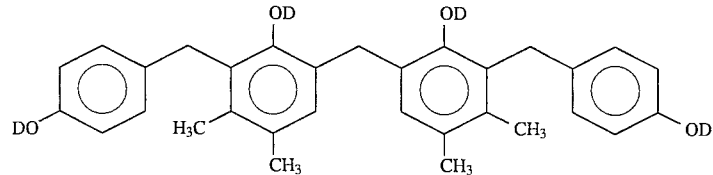 (B-18)
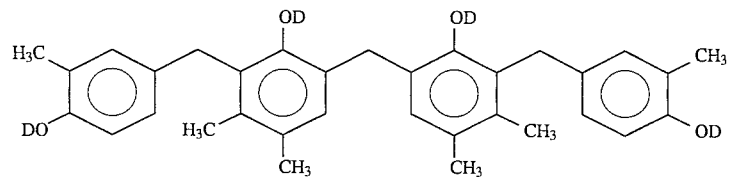 (B-19)
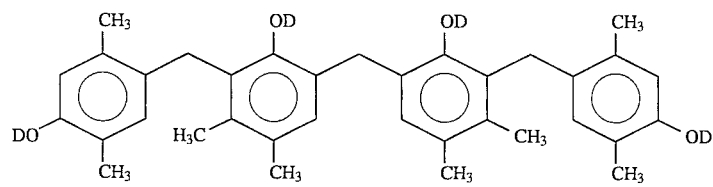 (B-20)
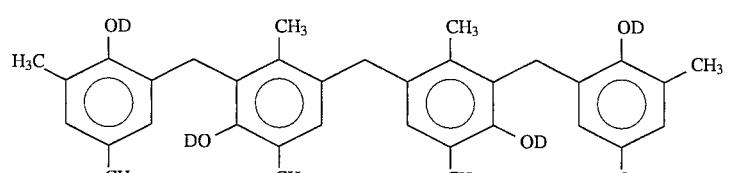 (B-21)
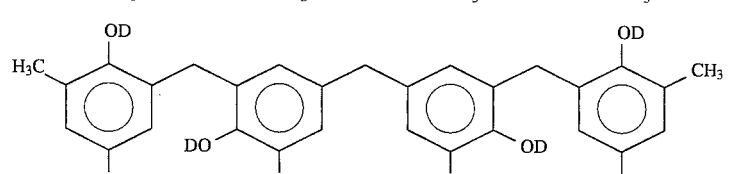 (B-22)
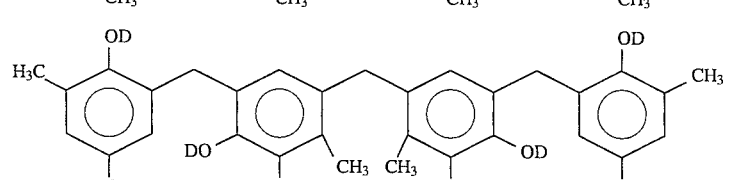 (B-23)
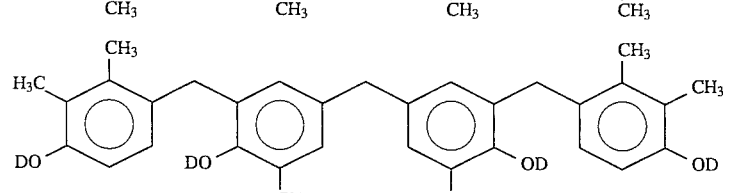 (B-24)
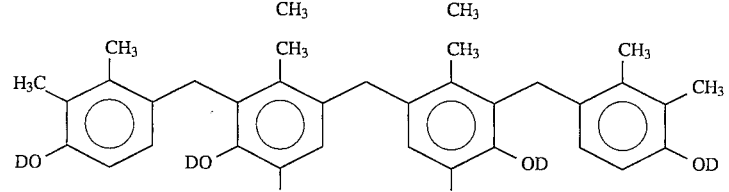 (B-25)

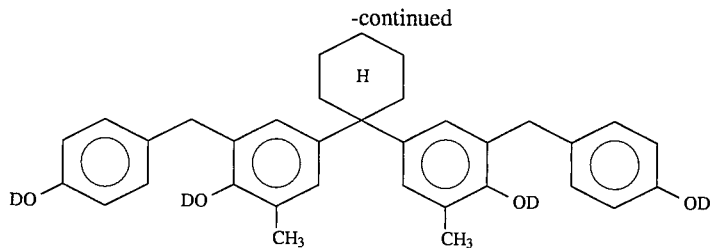
(B-26)
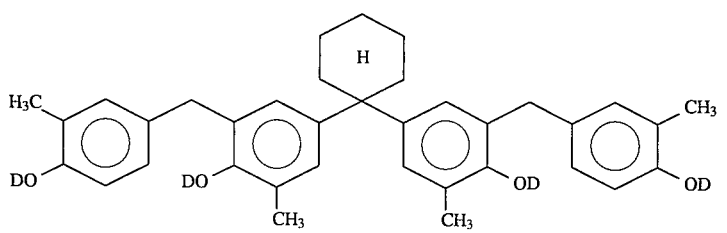
(B-27)
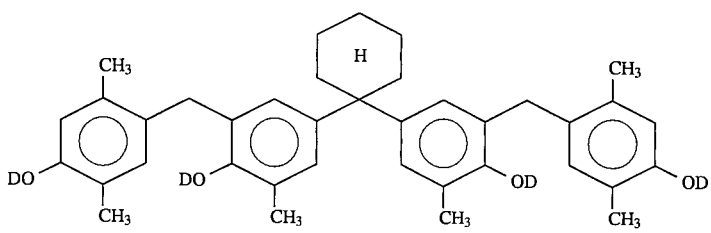
(B-28)
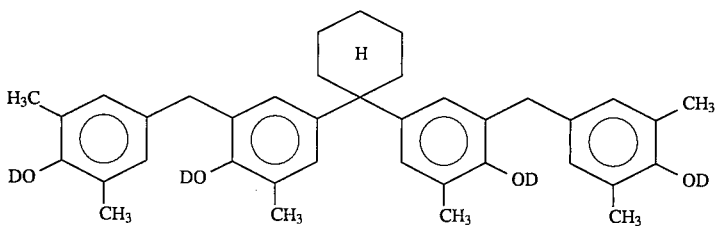
(B-29)
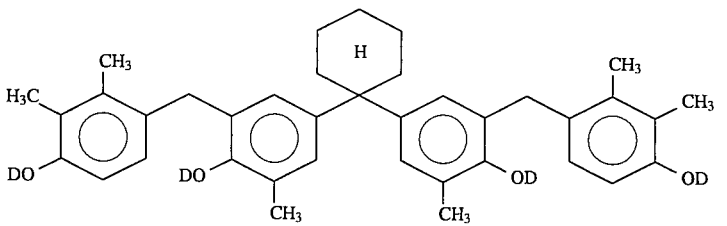
(B-30)
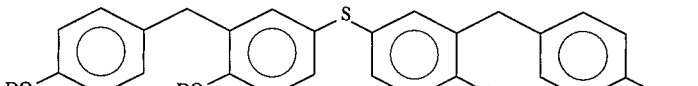
(B-31)
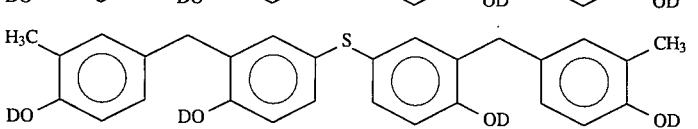
(B-32)
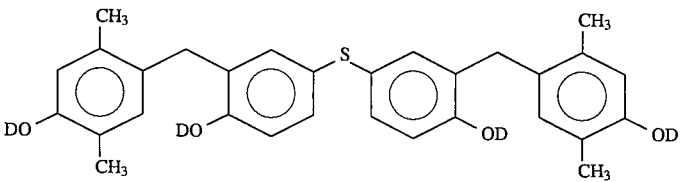
(B-33)
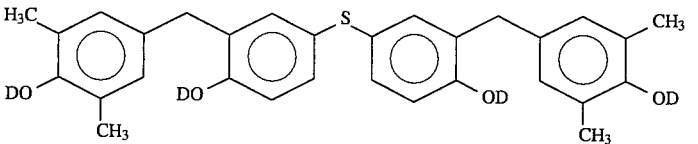
(B-34)

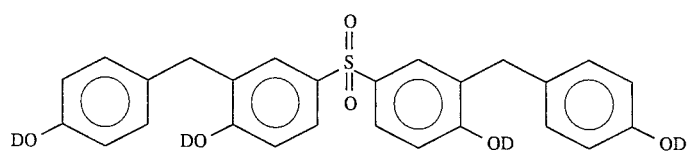
(B-35)
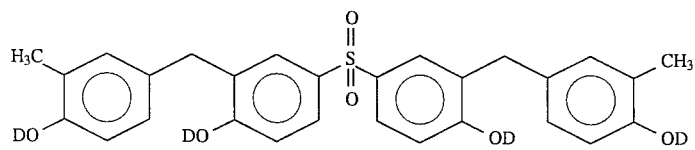
(B-36)
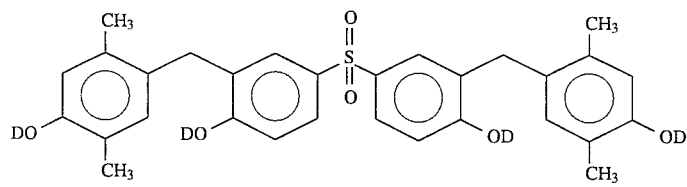
(B-37)
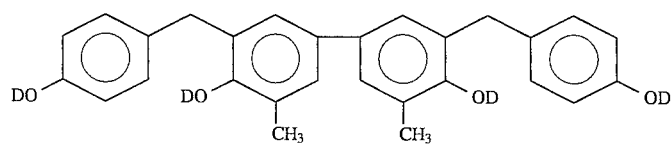
(B-38)
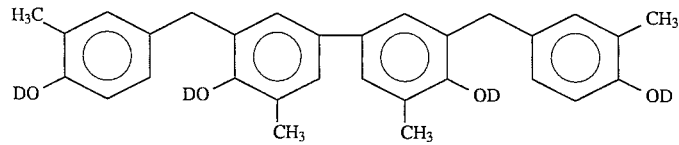
(B-39)
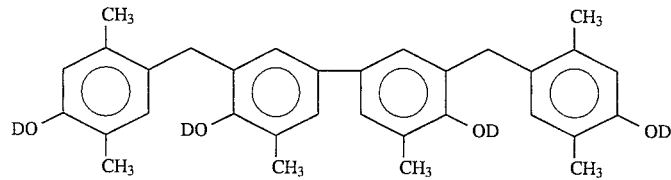
(B-40)
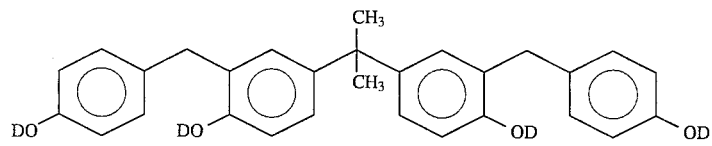
(B-41)
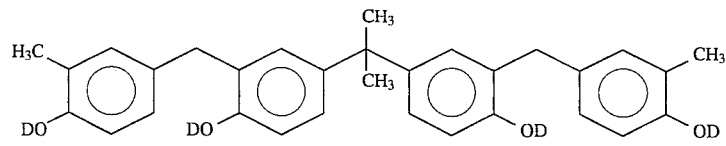
(B-42)
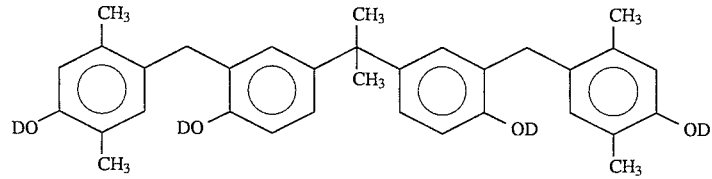
(B-43)
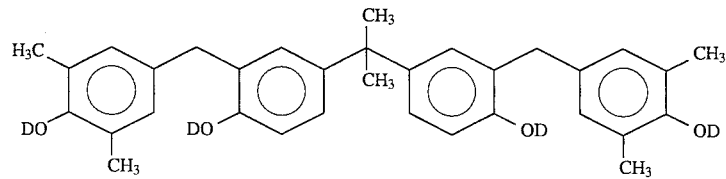
(B-44)

-continued
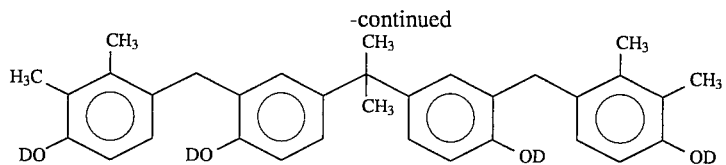 (B-45)
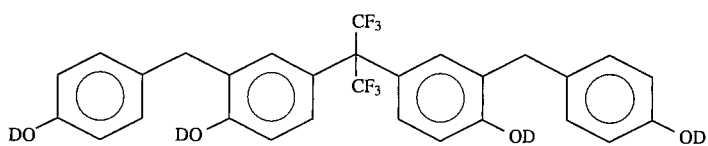 (B-46)
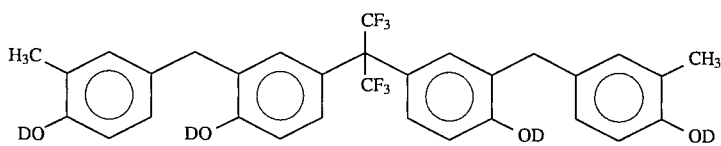 (B-47)
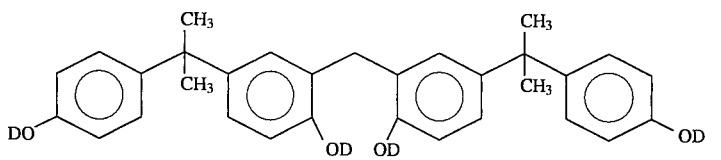 (B-48)
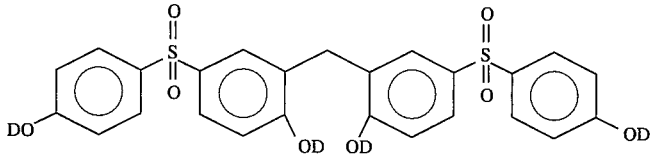 (B-49)
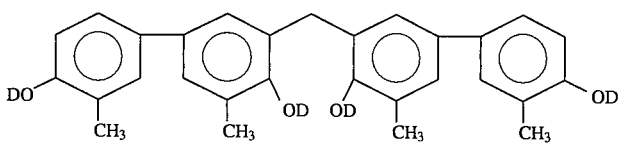 (B-50)
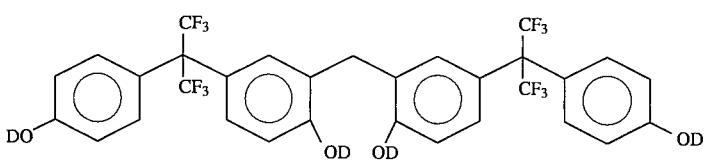 (B-51)
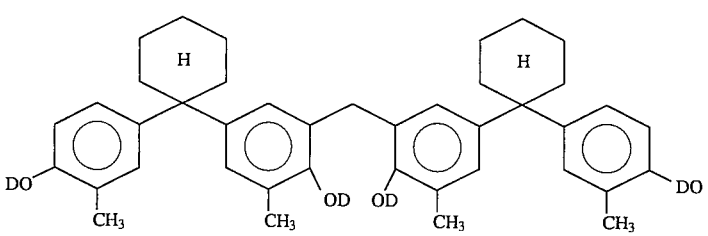 (B-52)
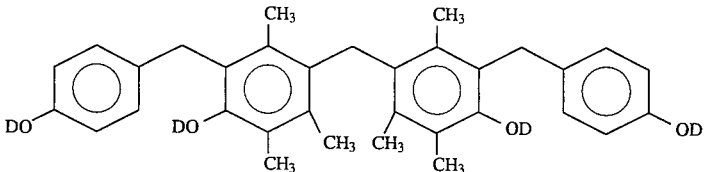 (B-53)
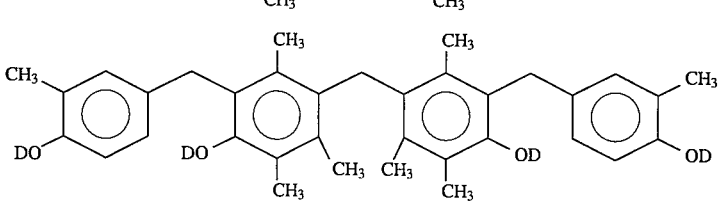 (B-54)

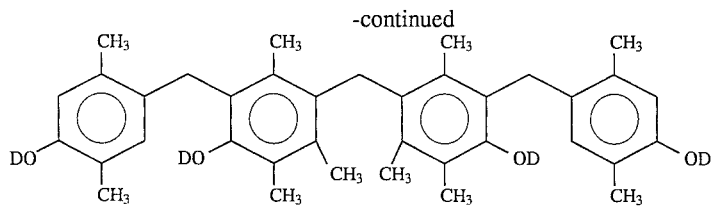
(B-55)
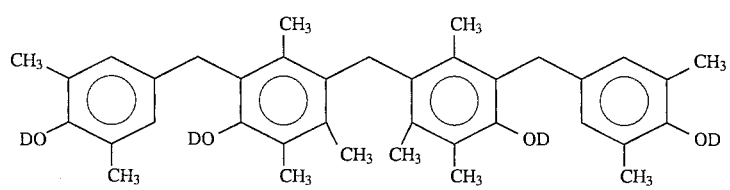
(B-56)
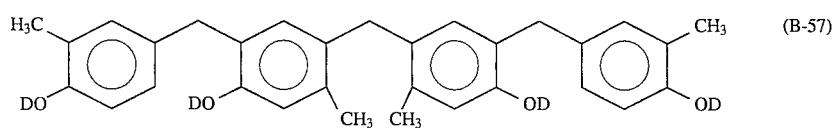
(B-57)
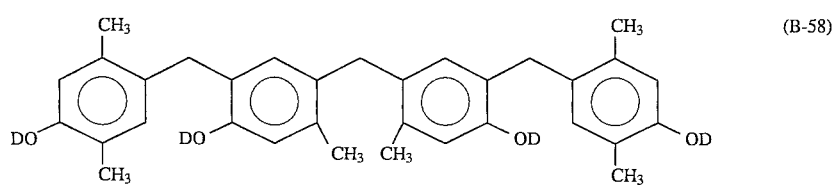
(B-58)
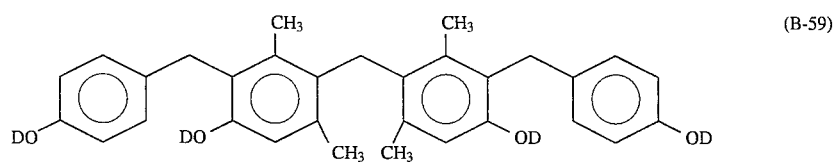
(B-59)
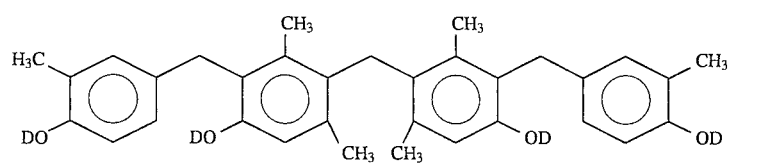
(B-60)
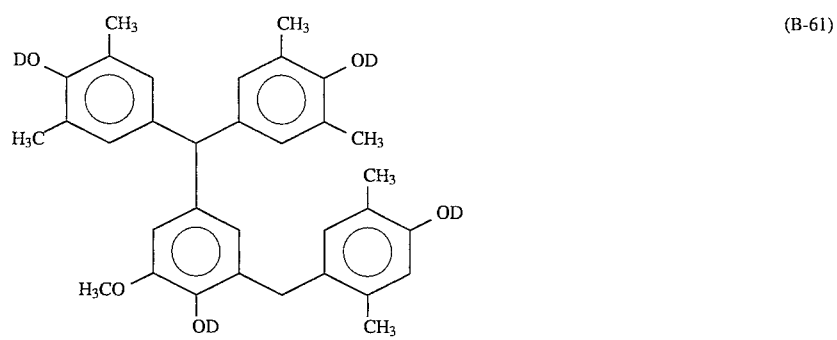
(B-61)
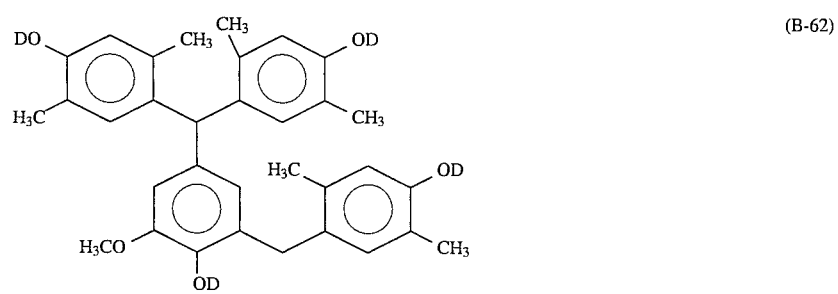
(B-62)

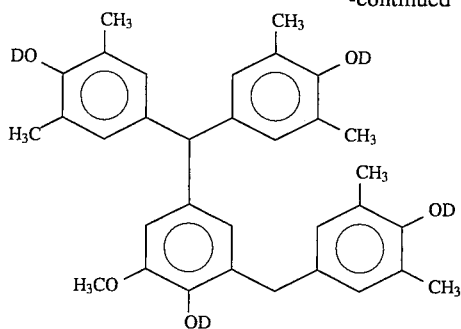
(B-63)
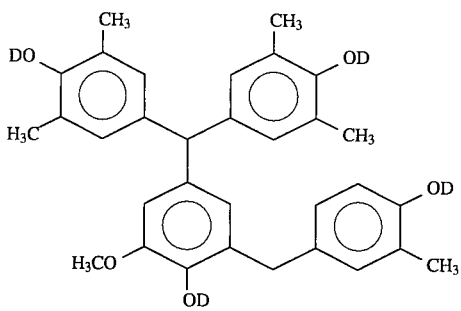
(B-64)
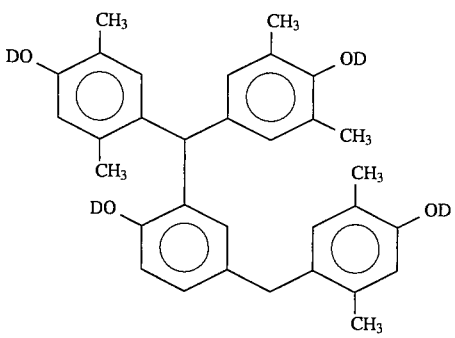
(B-65)
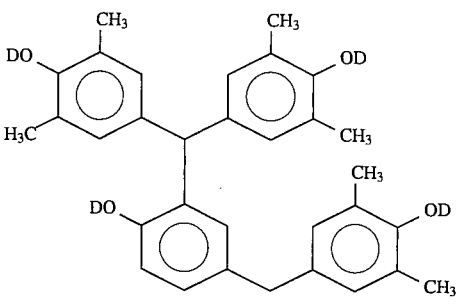
(B-66)
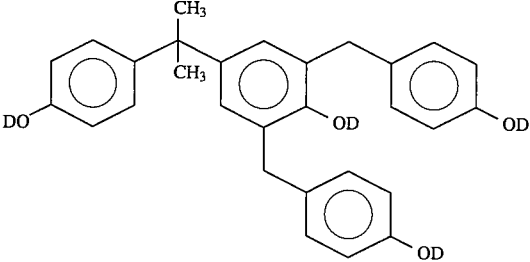
(B-67)

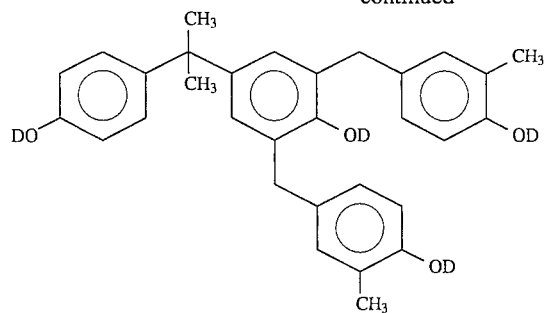
(B-68)
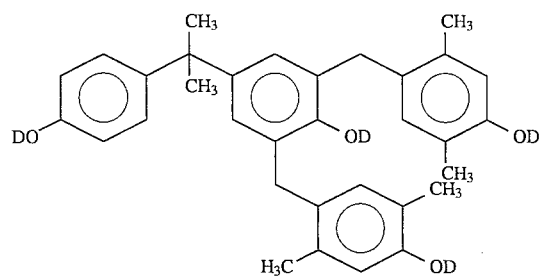
(B-69)
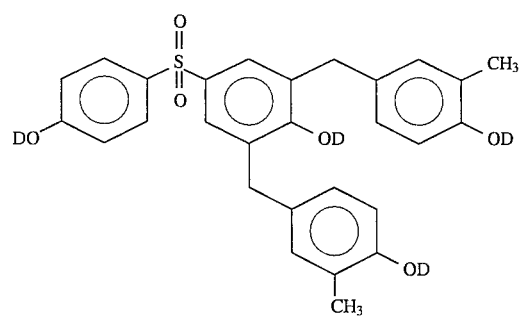
(B-70)
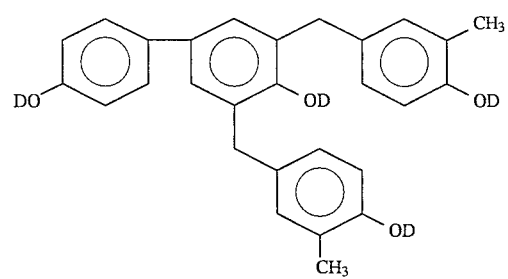
(B-71)
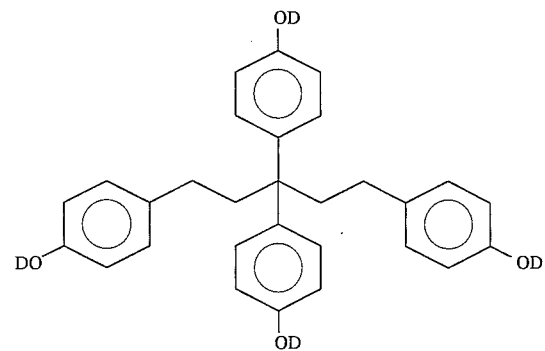
(B-72)

-continued

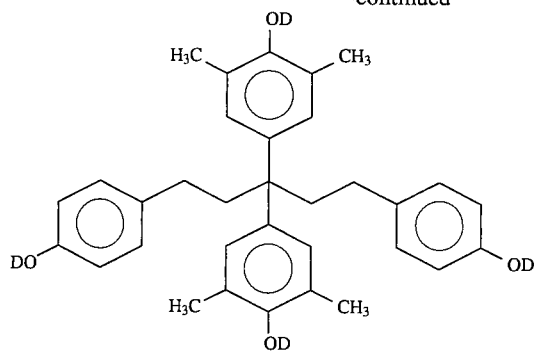

(B-73)

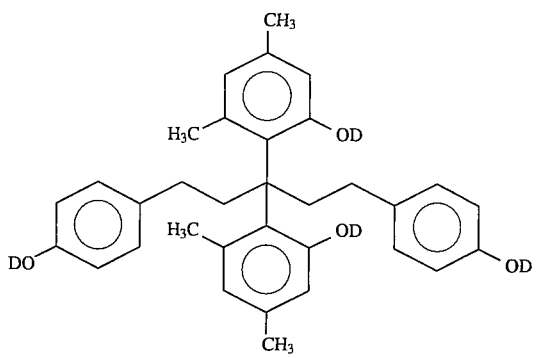

(B-74)

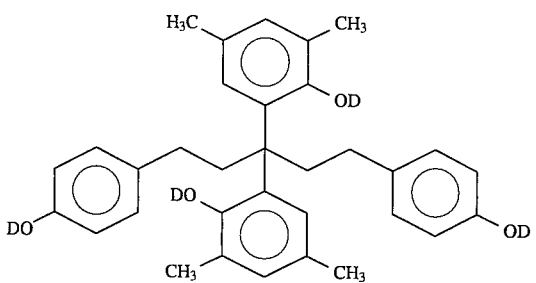

(B-75)

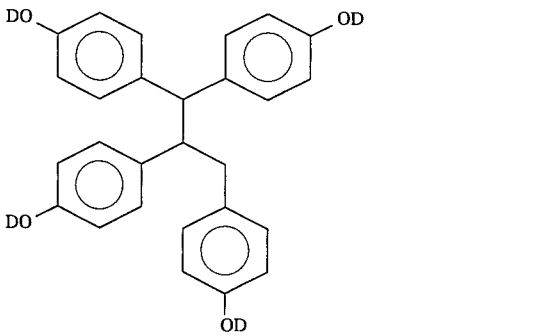

(B-76)

Referring to the ratio of the ionization-sensitive radioactive compound (A) to the ionization-sensitive radioactive compound (B) in the mixture of ionization-sensitive radioactive compounds to be used in the present invention, if the proportion of the ionization-sensitive radioactive compound (A) is too great, it tends to add to the dependence on film thickness and cause a rise in the production of development residue. On the other hand, if the proportion of the ionization-sensitive radioactive compound (B) is too great, it tends to reduce the film thickness during development and deteriorate the development latitude and the resolving power. Therefore, the ratio of the ionization-sensitive radioactive compound (A) to the ionization-sensitive radioactive compound (B) is generally in the range of 0.02 to 20, preferably 0.1 to 5, particularly 0.2 to 4.

The mixture of the ionization-sensitive radioactive compound (A) and the ionization-sensitive radioactive compound (B) according to the present invention is preferably used in the form of composition containing a specific water-insoluble alkali-soluble resin and a specific water-insoluble alkali-soluble low molecular compound.

As the specific water-insoluble alkali-soluble resin there may be preferably used a water-insoluble alkali-soluble novolak resin whose ratio of weight-average molecular weight to number-average molecular weight is in the range of 1.5 to 5. A water-insoluble alkali-soluble novolak resin whose ratio of weight-average molecular weight to number-average molecular weight falls below 1.2 can be hardly produced on an industrial basis. On the contrary, if this ratio exceeds 5, it tends to narrow the development latitude and cause a rise in the production of development residue. The synthesis of a water-insoluble alkali-soluble resin whose ratio of weight-average molecular weight to number-average molecular weight is small can be carried out by those skilled in the art in accordance with, e.g., JP-A-4-122938. The weight-average molecular weight is generally from 1,000 to 250,000, preferably from 1,000 to 200,000, more preferably from 2,000 to 150,000.

In particular, the water-insoluble alkali-soluble resin comprises preferably at least one novolak resin synthesized by the condensation reaction of a mixture of m-cresol and at least one of phenol, cresol (excluding m-cresol), xylenol and trimethylphenol with an aldehyde compound, the preferred ratio of weight-average molecular weight to number-average molecular weight thereof being in the range of from 1.2 to 5, more preferably from 1.5 to 5, and the preferred weight-average molecular weight thereof being in the range of 6,000 to 25,000, or at least one novolak resin synthesized by the condensation reaction of a mixture comprising at least three of p-cresol, o-cresol, 2,3-xylenol, 2,6-xylenol and trimethylphenol with an aldehyde compound, the preferred ratio of weight-average molecular weight to number-average molecular weight thereof being in the range of from 1.5 to 5.0, more preferably from 1.5 to 4.0 and the preferred weight-average molecular weight thereof being in the range of 1,500 to 5,000.

As the specific water-insoluble alkali-soluble low molecular compound there may be preferably used a water-insoluble alkali-soluble low molecular compound having not more than 60 carbon atoms and 2 to 10 phenolic hydroxyl groups per molecule. Further, it is preferred to use at least one water-insoluble alkali-soluble low molecular compound having a ratio of phenolic hydroxyl group to aromatic ring ranging from 0.5 to 1.4, a total number of carbon atoms per molecule ranging from 12 to 50, and 2 to 10 phenolic hydroxyl groups per molecule. Particularly preferred among these compounds is one which increases the rate of dissolution of the alkali-soluble resin in alkali when added to the water-insoluble alkali-soluble resin.

If the total number of carbon atoms in the compound exceeds 60, the effects of the present invention are reduced. On the contrary, if the total number of carbon atoms falls below 12, new defects such as deterioration of heat resistance occur.

In order to exert the effects of the present invention, it is preferred that the compound has at least two phenolic hydroxyl groups per molecule. However, if the number of carbon atoms exceeds 10, the effect of improving the development latitude is lost. On the contrary, if the ratio of phenolic hydroxyl group to aromatic ring falls below 0.5, it tends to add to the dependence on film thickness and narrow the development latitude. If this ratio exceeds 1.4, it deteriorates the stability of the composition, making it difficult to obtain a high resolving power and reduce the dependence on film thickness.

The added amount of the water-insoluble alkali-soluble low molecular compound is preferably in the range of 2 to 50% by weight, more preferably 10 to 40% by weight based on the weight of the alkali-soluble resin. If this amount exceeds 50% by weight, new defects such as rise in the production of development residue and deformation of pattern upon development occur.

The synthesis of the water-insoluble alkali-soluble low compound having an aromatic hydroxyl group to be used in the present invention can be carried out by those skilled in the art in accordance with the method as described in JP-A-4-122938, JP-A-2-28531, U.S. Pat. No. 4,916,210, and EP 219294.

Specific examples of the low molecular compound having an aromatic hydroxyl group useful in the present invention will be listed below, but the present invention should not be construed as being limited thereto.

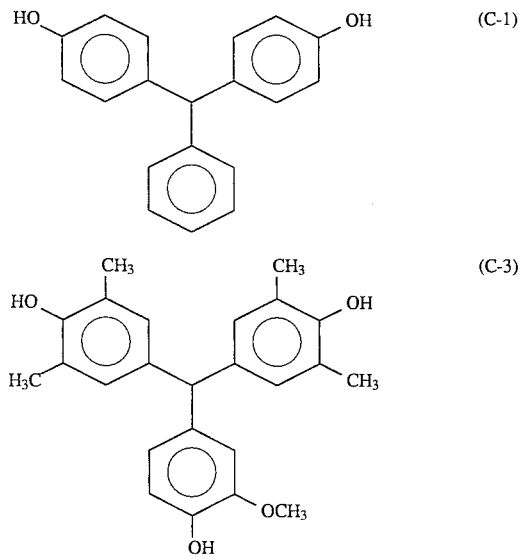

-continued
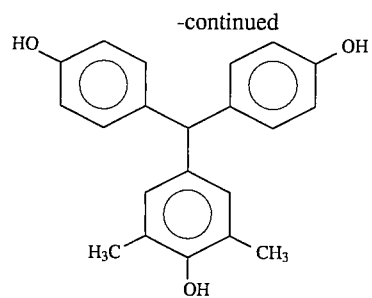 (C-5)
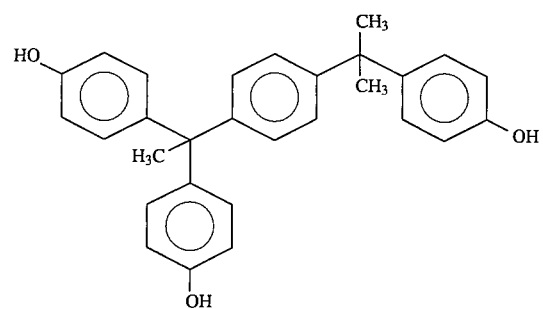 (C-6)
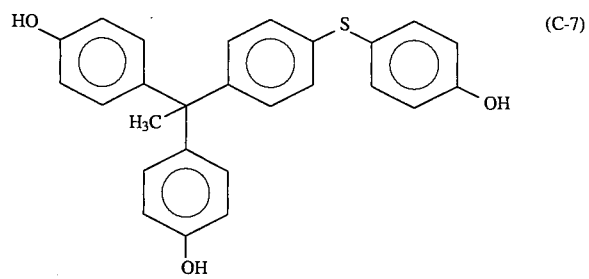 (C-7)
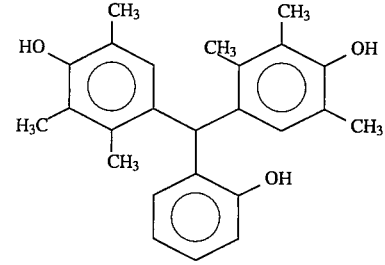 (C-8)
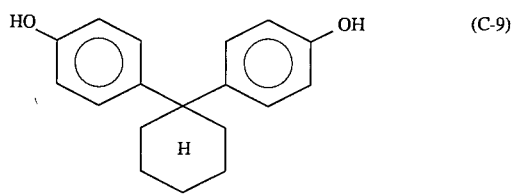 (C-9)
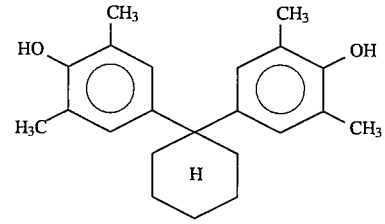 (C-10)
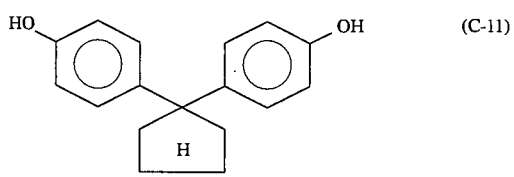 (C-11)
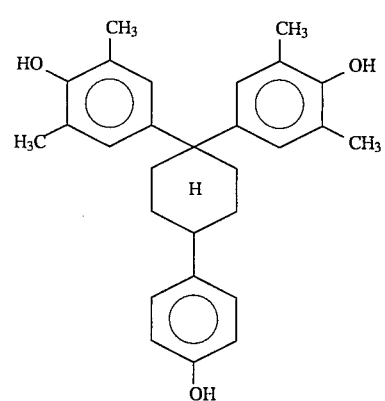 (C-12)
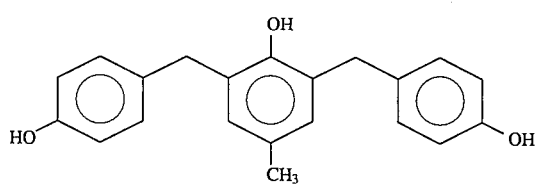 (C-13)

-continued
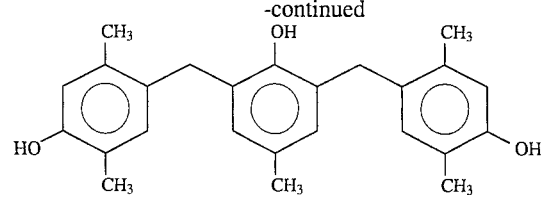 (C-14)
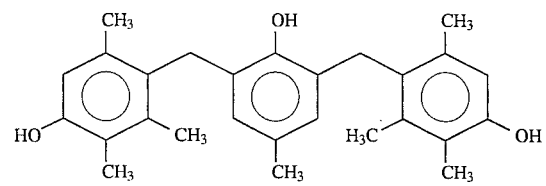 (C-15)
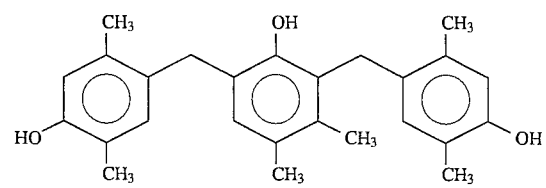 (C-16)
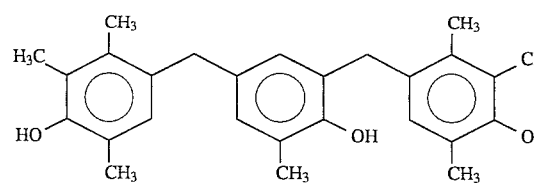 (C-17)
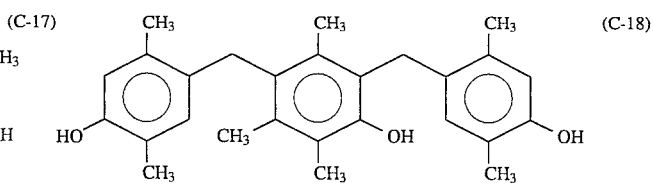 (C-18)
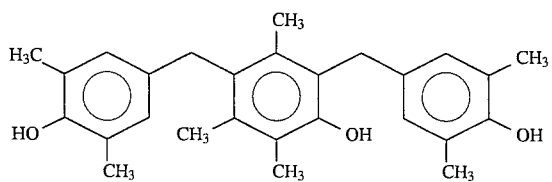 (C-19)
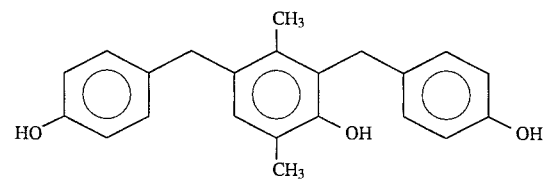 (C-20)
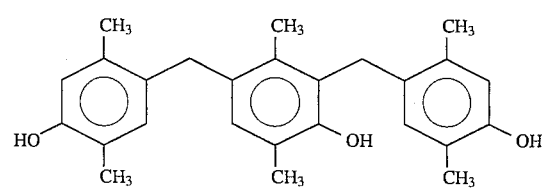 (C-21)
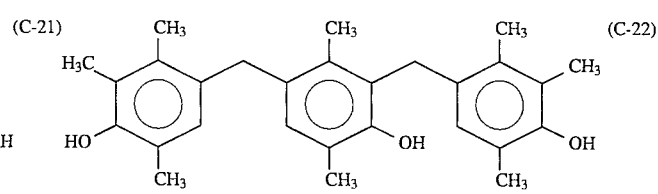 (C-22)
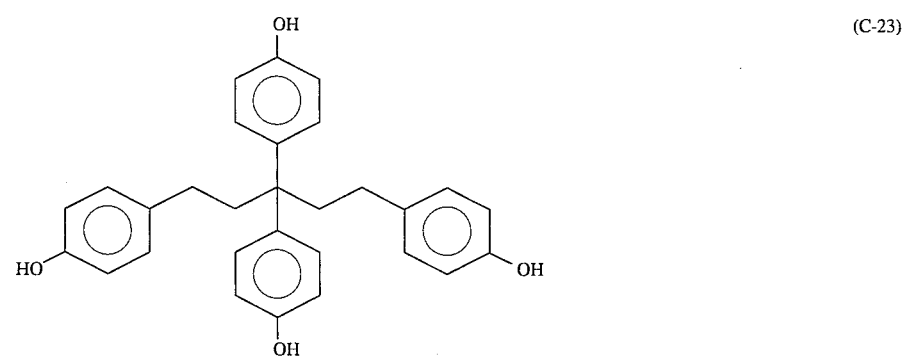 (C-23)

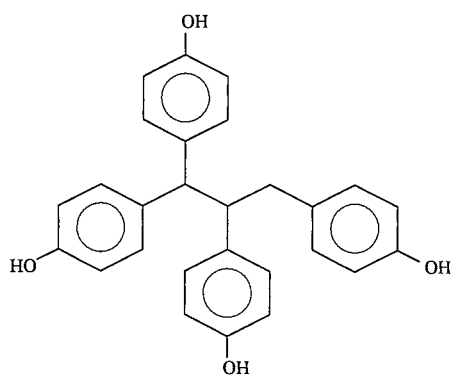
(C-24)

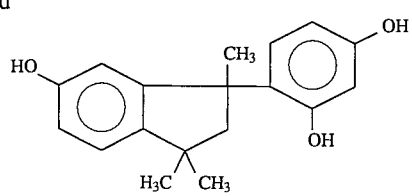
(C-25)

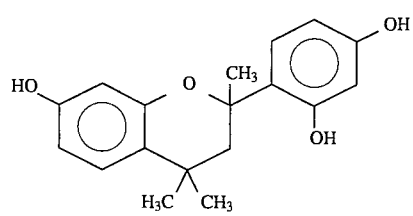
(C-26)

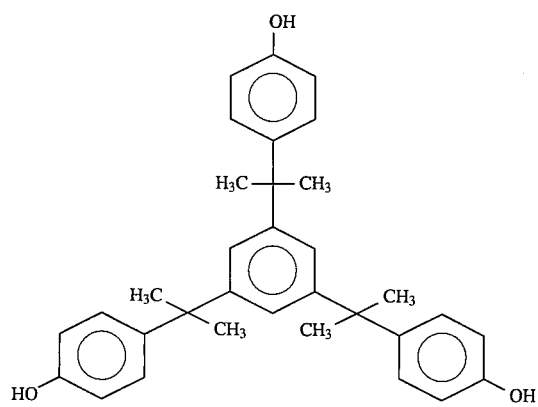
(C-27)

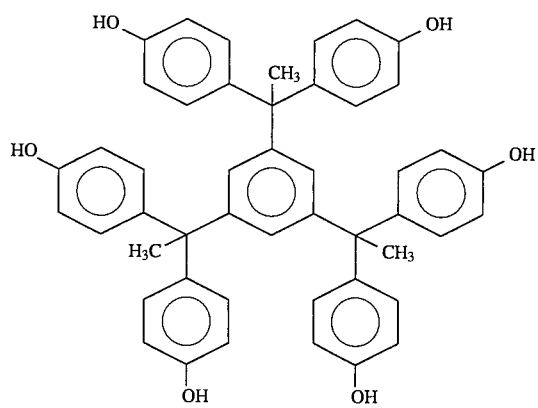
(C-28)

Examples of the water-insoluble alkali-soluble resin, which may be used in combination with the specific water-insoluble alkali-soluble resin described above, include vinylphenol resin, acetone-pyrogallol resin, acetone-resol resin, maleimide copolymer, N-(hydroxyphenyl)maleimide (co)polymer, styrene-maleic anhydride copolymer, and a polymer containing a carboxyl group, a sulfonyl group, a lactone group or a phosphonic group.

The proportion of the other water-insoluble alkali-soluble resin than the specific water-insoluble alkali-soluble resin is preferably not more than 50% by weight, more preferably not more than 25% by weight based on the total amount of the water-insoluble alkali-soluble resin.

The other water-insoluble alkali-soluble resin than the specific water-insoluble alkali-soluble resin preferably exhibits an average molecular weight Mw of 1,000 to 25,000, more preferably 2,000 to 15,000. If Mw is too great, the effects of the present invention of, e.g., providing a wide development latitude, cannot be exerted.

The ionization-sensitive radioactive compound to be used in the present invention can comprise other ionization-sensitive radioactive compounds besides the mixture of the ionization-sensitive radioactive compound (A) and the ionization-sensitive radioactive compound (B). Examples of the other ionization-sensitive radioactive compounds include ionization-sensitive radioactive alkali dissolution-inhibiting compounds, and ionization-sensitive radioactive acid-producing compounds. The ionization-sensitive radioactive acid-producing compounds, if any, are preferably used in combination with acid-instable group-containing alkali dissolution-inhibiting compounds.

Examples of the ionization-sensitive radioactive alkali dissolution-inhibiting compounds include quinonediazide compounds, diazoketone compounds, azide compounds, orthonitrobenzyl compounds, orthonitroarylsulfonyl ester compounds, and polyolefinsulfon compounds.

Examples of the quinonediazide compounds include esters of 1,2-naphthoquinonediazide-5-sulfonic acid, 1,2-naphthoquinonediazide-4-sulfonic acid or 1,2-benzoquinonediazide-4-sulfonic acid with polyhydroxyaromatic compounds.

Examples of the polyhydroxyaromatic compounds include polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenozphenone and 2,3,4,3',4',5'-hexahydroxybenzophenone, polyhydroxyphenylalkylketones such as 2,3,4-trihydroxyacetophenone and 2,3,4-trihydroxyphenylhexylketone, bis((poly)hydroxyphenyl)alkanes such as bis(2,4-dihydroxyphenyl)methane, bis(2,3,4-trihydroxyphenyl)methane, and bis(2,4-dihydroxyphenyl)propane-1, polyhydroxybenzoic esters such as 3,4,5-trihydroxybenzoic propyl and 3,4,5-trihydroxybenzoic phenyl, bis(polyhydroxybenzoyl)alkanes or bis(polyhydroxybenzoyl)aryls such as bis(2,3,4-trihydroxybenzoyl)methane and bis(2,3,4-trihydroxybenzoyl)benzene, alkylene-di(polyhydroxybenzoate)'s such as ethyleneglycol-di(3,5-dihydroxybenzoate), polyhydroxybiphenyls such as 3,5,3',5'-biphenyltetrol, 2,4,2',4'-biphenyltetrol, 2,4,6,3',5'-biphenylpentol and 2,4,6,2',4',6'-biphenylhexol, polyhydroxytriphenylmethanes such as 4,4',3",4"-tetrahydroxy-3,5,3',5'-tetramethyltriphenylmethane, 4,4',2",3",4"-pentahydroxy-3,5,3',5'-tetramethyltriphenylmethane and 2,3,4,2',3',3",4"-octahydroxy-5,5'-diacetyltriphenylmethane, polyhydroxyspirobiindanes such as 3,3,3',3'-tetramethyl-1,1'-spirobi-indane-5,6,6',6'-tetrol, 3,3,3',3'-tetramethyl-1,1'-spirobi-indane-5,6,7,5',6',7'-hexol, 3,3,3',3'-tetramethyl-1,1'-spirobiindane-4,5,6,4',5',6'-hexol and 3,3,3',3'-tetramethyl-1,1'-spirobiindane-4,5,6,5',6',7'-hexol, polyhydroxyphthalides such as 3,3-bis (3,4-dihydroxyphenyl) phthalide, 3,3-bis(2,3,4-trihydroxyphenyl)phthalide and 3',4',5',6'-tetrahydroxyspiro[phthalide-3,9'-xanthene], polyhydroxybenzopyrans such as 2-(3,4-dihydroxyphenyl)-3,5,7-trihydroxybenzopyran, 2-(3,4,5-trihydroxyphenyl)-3,5,7-trihydroxybenzopyran, 2-(3,4-dihydroxyphenyl)-3-(3,4,5-trihydroxybenzoyloxy)-5,7-dihydroxybenzopyran and 2-(3,4,5-trihydroxyphenyl)-3-(3,4,5-trihydroxybenzoyloxy)-5,7-dihydroxybenzopyran, polyhydroxyphenylchromans such as 2,4,4-trimethyl-2-(2',4'-dihydroxyphenyl)-7-hydroxychroman, 2,4,4-trimethyl-2-(2',3',4'-trihydroxyphenyl)-7,8-dihydroxychroman and 2,4,4-trimethyl-2-(2',4',6'-trihydroxyphenyl)-5,7-dihydroxychroman, hydroxybenzylphenols such as 2,6-bis(2,3,4-trihydroxybenzyl)-4-methylphenol, 2,6-bis(2,4-dihydroxybenzyl)-4-methylphenol, 2,6-bis(5-chloro-2,4-dihydroxybenzyl)-4-methylphenol, 2,6-bis(2,4,6-trihydroxybenzyl)-4-methylphenol, 2,6-bis(2-acetyl-3,4,5-trihydroxybenzyl)-4-methylphenol, 2,4,6-tris(2,3,4-trihydroxybenzyl)phenol, 2,6-bis(3,5-dimethyl-4-hydroxybenzyl)-4-methylphenol, 2,4,6-tris(3,5'-dimethyl-4-hydroxybenzyl)-4-methylphenol, 4,6-bis(3,5'-dimethyl-4-hydroxybenzyl)pyrogallol, 2,6-bis(3,5-dimethyl-4-hydroxybenzyl)-4-methylphenol and 2,6-bis(3,5-dimethyl-4-hydroxybenzyl)phloroglucinol, flavono dyes such as quercetin and rutin, low nucleus compounds of novolak, and their analogues.

Further, a polymer containing an aromatic hydroxyl group such as acetone-pyrogallol condensation resins and polyvinylphenol may be used in place of the polyhydroxy aromatic compound. Moreover, the hydroxyl group in a novolak may be substituted by quinonediazide in a proper amount so that the novolak can serve as both a photosensitive material and a binder.

Particularly preferred among these groups is one having a structure containing a moiety having two or more aromatic hydroxyl groups on the same aromatic ring and containing a total of 3 or more hydroxyl groups.

Examples of the diazoketone compounds include 5-diazomeldrum's acid, 2-diazo-1-phenylbutane-1,3-dione, 1,3-diphenyl-2-diazopropane-1,3-dione, 2-diazomethyl phenylmalonate, 2-diazo-1-(3'-chlorosulfonylphenyl)-1-trimethylsilylpropane-1,3-dione, and diazoketone compounds as disclosed in JP-A-60-14235, JP-A-62-47296, JP-A-63-253938, and JP-A-63-253940.

Examples of the azide compounds include monoazide compounds such as 1-azidepyrene, p-azidebenzophenone, 4'-methoxy-4-azidephenylamine, 4-azidebenzal-2'-methoxyacetophenone, 4-azide-4'-nitrophenylazobenzene, 1-(p-azidephenyl)-1-cyano-4-(p-diethylaminophenyl)-1,3-butadiene and 4-azidechalcone, 4,4'-diazidebenzophenone, 4,4'-diazidephenylmethane, 4,4'-diazidestilbene, 4,4'-diazidechalcone, 4,4'-diazidebenzalacetone, 4,4'-diazidephenylether, 4,4'-diazidephenylsulfide, 4,4'-diazidephenylsulfon, 2,6-di(4'-azidebenzal)cyclohexanone, 2,6-di(4'-azidebenzal)-4-methylcyclohexanone, 1,8-diazidenaphthalene, 3-azide-4'-(3'-azidebenzalmethyl) stilbene, and azide compounds as described in JP-B-35-49295, JP-B-48-31841, JP-B-44-26047, JP-B-44-26048, JP-B-45-7328, JP-B-47-30204, JP-B-49-12283, JP-B-51-29932, JP-B-53-325, JP-A-48-14316, JP-A-48-93623, JP-A-49-81103, JP-A-55-57538, JP-A-56-39538, JP-A-58-68036, JP-A-58-203438, JP-A-60-107644, JP-A-62- 2249, JP-A-63-305347, U.S. Pat. Nos. 2,852,379, 2,940,853, 3,092,494, GB Patent 892,811, FR Patent 1,511,485, and DE Patent 514,057.

Examples of the orthonitrobenzyl compounds include orthonitrobenzylester stearate, orthonitrobenzylester cholesterate, orthonitrobenzyloxy triphenylsilane, 5-methyl-2-nitrobenzyltriphenylsilane, di(5-chloro-2nitrobenzyloxy)diphenylsilane, poly-orthonitrobenzyl methacrylate, poly-orthonitrobenzyl acrylate, orthonitrobenzaldehyde acetalation product of polyvinyl alcohol, and orthonitrobenzyl compounds as described in JP-A-48-47320, JP-A-60-198538, JP-A-61-138255, JP-A-62-153853, and JP-B-56-2696.

Examples of the orthonitroarylsulfenyl ester compounds include 2,4-dinitrobenzenesulfenyl cholate, orthonitrobenzenesulfenyl adamantane carboxylate, orthonitrobenzenesulfenyl-tris(trimethylsilyl) cholate, poly-2,4-dinitrobenzenesulfenyl methacrylate, and orthonitroarylsulfenyl ester compounds as described in JP-A-61-3141, and JP-A-61-36741.

Examples of the polyolefinesulfonic compounds include poly-butene-1-sulfon, polyhexene-1-sulfon, polycyclopentenesulfon, poly-2-methylpentenesulfon, polyoctene-1-sulfon, polybutene-2-sulfon, and polyolefinsulfonic compounds as described in JP-A-62-27732, and JP-A-63-218949.

Examples of the tetrahydropyranyl ether compounds include 4,4'-isopropylidenediphenol-bis-2-tetrahydropyranyl ether, 4,4'-sulfonyldiphenol-bis-tetrahydropyranyl ether, polytetrahydropyranyletherification product of phenolformaldehyde, and tetrahydropyranyl ether compounds as described in U.S. Pat. No. 3,779,778.

The mixing proportion of the mixture of the ionization-sensitive radioactive compound (A) and the ionization-sensitive radioactive compound (B) in the ionization-sensitive radioactive compound of the present invention is in the range of not less than 30% by weight, preferably not less than 40% by weight, particularly not less than 50% by weight, with the upper limit being 100% by weight. If this proportion falls below 30% by weight, it tends to add to the dependence on film thickness and cause a rise in the production of development residue.

The ratio of the ionization-sensitive radioactive compound to the water-insoluble alkali-soluble resin in the present invention is generally in the range of 5 to 100 parts by weight, preferably 20 to 80 parts by weight based on 100 parts by weight of the latter. If this ratio falls below 5 parts by weight, it tends to cause a remarkable drop in the percent film retention. On the contrary, if this ratio exceeds 100 parts by weight, it tends to reduce the sensitivity and the solvent solubility of the composition.

The ionization-sensitive radioactive acid-producing compound, if any, is used in an amount of 0.1 to 200 parts by weight, preferably 1 to 60 parts by weight based on 100 parts by weight of the acid-instable group-containing alkali dissolution-inhibiting compound. If this content falls below 0.1 parts by weight, it causes a remarkable drop in the sensitivity.

The composition of the present invention may comprise a water-insoluble alkali-soluble low molecular compound incorporated therein to accelerate its dissolution in the developer. Preferred examples of the water-insoluble alkali-soluble low molecular compound include polyhydroxyaromatic compounds as ester resides of the foregoing quinonediazide compounds. Typical examples of the water-insoluble alkali-soluble low molecular compounds include phenols, resorcin, phloroglucin, 2,3,4-trihydroxybenzophenone, 2,3,4,4'-tetrahydroxybenzophenone, pentahydroxybenzophenone, hexahydroxybenzophenone, polyhydroxytriphenylmethanes, polyhydroxyspirobiindanes, hydroxybenzylphenols, acetone-pyrogallol condensation resins, and pholoroglucide.

Examples of the solvent for dissolving the ionization-sensitive radioactive compound, water-insoluble alkali-soluble low molecular compound and water-insoluble alkali-soluble resin of the present invention therein include ketones such as methyl ethyl ketone, methyl amyl ketone and cyclohexanone, alcohol ethers such as ethylene glycol monomethyl ether, ethylene glycol monoethyl ether, diethylene glycol monomethyl ether and diethylene glycol monoethyl ether, alchols such as n-propyl alcohol, iso-butyl alcohol, n-butyl alcohol, cyclohexyl alcohol and diacetone alcohol, ethers such as dioxane, ethylene glycol dimethyl ether and diethylene glycol dimethyl ether, esters such as methyl cellosolve acetate, ethyl cellosolve acetate, methyl methoxy propionate, propyl formate, propyl acetate, butyl acetate, methyl propionate, methyl lactate, ethyl lactate, ethyl 2-hydroxy-2-methylprionate, methoxyethyl propionate, methoxymethyl propionate, ethoxyethyl propionate and ethyl pyruvate, propylene glycols such as propylene glycol, propylene glycol monomethyl ether, propylene glycol monoethyl ether and propylene glycol monomethyl ether acetate, halogenated hydrocarbons such as 1,1,2-trichloroethylene, aromatic hydrocarbons such as toluene and xylene, and high polarity solvents such as dimethyl acetamide, N-methylpyrrolidone, dimethylformamide and dimethyl sulfoxide. These solvents may be used singly or in admixture.

The positive-working photoresist composition of the third aspect of the present invention may comprise additives compatible therewith, such as dye, plasticizer, adhesive aid, storage stabilizer, sensitizing agent, anti-striation agent and surface active agent, incorporated therein as necessary. Specific examples of these additives include dyes such as methyl violet, crystal violet, malachite green, curcumin, tinubin and thiazolylazophenol, plasticizers such as stearic acid, acetal resin, phenoxy resin and alkyd resin, adhesive aids such as hexamethyl disilazalan and chloromethylsilane, and surface active agents such as polyoxyethylene ethers (e.g., polyoxyethylene lauryl ether, polyoxyethylene oleyl ether, polyoxyethylene nonyl phenyl ether), polyoxyethylene polyoxypropylene block copolymers, sorbitan aliphatic esters (e.g., sorbitan monolaurate, sorbitan trioleate), polyoxyethylene sorbitan aliphatic esters (e.g., polyoxyethylene sorbitan monostearate, polyoxyethylene sorbitan monopalmitate, polyoxyethylene sorbitan trioleate), fluorine surface active agents (e.g., F Top EF301, EF303 and EF352 (produced by Shinakita Kasei K.K.), Megafac F171, F173 (produced by Dainippon InkAnd Chemicals, Incorporated), Florad FC430, FC431 (produced by Sumitomo 3M), and Asahi Guard AG710, Surflon S-382, SC101, SC102, SC103, SC104, SC105, SC106 (Asahi Glass Company, Limited), Organosiloxane polymer KP341 (produced by The Shin-etsu Chemical Industry Co., Ltd.), acrylic or methacrylic (co)polymer Polyflow Nos. 75 and 95 (produced by Kyoeisha Yushi kagaku Kogyo K.K.)). The amount of such a surface active agent to be blended in the system is normally in the range of not more than 2 parts by weight, preferably not more than 1 part by weight based on 100 parts by weight of the water-insoluble alkali-soluble resin in the composition of the present invention.

In particular, a dye having an alkali-soluble group such as aromatic hydroxyl group and carboxylic group, such as curcumin can be advantageously used. In the case where such a compound is added, the amount of the low molecular dissolution accelerator of the present invention is preferably controlled to obtain optimum properties.

The positive-working photoresist composition thus prepared is applied to a substrate for use in the production of precision integrated circuit elements (e.g., silicon/silicon dioxide-coated substrate) by an appropriate coating means such as spinner and coater, exposed to light through a predetermined mask, and then developed to obtain an excellent resist pattern.

In the positive-working photoresist composition of the present invention, the area which is not irradiated with ionization radiation forms an image. In other words, a so-called positive-working pattern image is obtained. However, a method which comprises the heat treatment in an atmosphere of amine as disclosed in JP-A-63-316429 can be used, or a compounds as disclosed in JP-A-62-35350 and EP 263434A such as 2,6-di-t-butylpyridine, benzimidazole, pyridine, quinoline, acridine, lutidine, 1-methylbenzimidazole and melamineformaldehyde alkyl ether can be blended in the resin composition of the present invention, so that a so-called image reverse is conducted to effectively obtain a negative pattern.

As developer for the positive-working photoresist composition of the present invention there can be used an aqueous solution of an inorganic alkali such as sodium hydroxide, potassium hydroxide, sodium carbonate, sodium silicate, sodium metasilicate and aqueous ammonia, primary amine such as ethylamine and n-propylamine, secondary amine such as diethylamine and di-n-butylamine, tertiary amine such as triethylamine and methyldiethylamine, alcohol amine such as dimethylethanolamine and triethanolamine, quaternary ammonium salt such as tetramethylammonium hydroxide, tetraethylammonium hydroxide and choline hydroxide, cyclic amine such as pyrrole and piperidine, etc. To such an aqueous solution of an alkali may be added an alcohol, surface active agent, aromatic hydroxyl group-containing compound, etc. in a proper amount. Particularly preferred among these additives is tetramethylammonium hydroxide.

The present invention will be further described hereinafter, but the present invention should not be construed as being limited thereto. The term "%" as used herein is meant to indicate % by weight unless otherwise specified.

EXAMPLE 1

(1) Synthesis of Compound (Ia-1)

107.1 g of 3,3'-Dimethyl-4,4'-dihydroxybiphenyl, 455.8 g of a 25% aqueous solution of TMAH (tetrahydroxyammonium hydroxide), and 500 ml of distilled water were charged into a four-necked flask equipped with a stirrer, a condenser, a thermometer and a dropping apparatus. The mixture was then heated to a temperature of 40° C. to dissolve 3,3'-dimethyl-4,4'-dihydroxybiphenyl. To the mixture solution was then added dropwise 243.5 g of a 37% aqueous solution of formalin in 30 minutes. The reaction mixture was heated and stirred at 40° C. for 12 hours. To the resulting reaction mixture were added 500 ml of distilled water and 125 ml of hydrochloric acid to obtain a brown solid. The resulting brown solid was then purified by column chromatography to obtain 95.9 g of Dimethylol Compound A in the form of a white powder.

Next, 82.2 g of Dimethylol Compound A, 282.3 g of phenol, and 1 l of methanol were charged into a three-necked flask equipped with a stirrer, a condenser, and a thermometer. The mixture was heated to 60° C. to dissolve the compound. At the time when a uniform solution was obtained, 3 g of concentrated sulfuric acid was added thereto. The mixture was heated and refluxed with stirring for 5 hours. The resulting reaction mixture was then poured into 10 l of distilled water. The resulting yellow solid was then purified by column chromatography to obtain 63.9 g of the desired material (Ia-1) in the form of a white powder.

(2) Synthesis of Compound (Ia-2)

Compound (Ia-2) was synthesized in the same manner as in Synthesis of Compound (Ia-1) described above except that o-chlorophenol was used in place of phenol.

(3) Synthesis of Compound (Ia-4)

24.6 g of 3,3'-Dimethyl-4,4'-dihydroxydiphenyl sulfide and 100 ml of methanol were charged into a four-necked flask equipped with a stirrer, a condenser, a thermometer and a dropping apparatus. The mixture was then heated to a temperature of 60° C. with stirring to dissolve 3,3'-dimethyl-4,4'-dihydroxydiphenyl sulfide. After 74.5 g of 4-hyroxy benzylalcohol was gradually added to the mixture solution in 2 hours, the reaction mixture was heated and stirred for 3 hours. To the resulting reaction mixture were added 1 l of distilled water to obtain a brown solid. The resulting brown solid was then purified by column chromatography to obtain 18.3 g of Compound (Ia-4) in the form of a white powder.

(4) Synthesis of Photosensitive Material a'

42.7 g of Compound (Ia-1), 53.7 g of 1,2-naphthoquinonediazide-5-sulfonyl chloride, and 800 ml of chloroform were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was concentrated, dissolved in acetone again, and then poured into 3 l of a 1% aqueous solution of hydrochloric acid. The resulting precipitate was recovered by filtration, washed with water, and then dried at a temperature of 40° C. to obtain 78.4 g of a 1,2-naphthoquinonediazide-5-sulfonic esterification product of Compound (Ia-1) (Photosensitive Material a').

The high performance liquid chromatography (HPLC) of Photosensitive Material a', with ultraviolet ray at 254 nm showed that the pattern area of diester compound accounts for 61% of all the pattern area and the pattern area of complete ester compound accounts for 5% of all the pattern area.

In the foregoing HPLC, a Type LC-6A chromatograph available from Shimadzu Corporation with Nova-Pak $C_{18}$ (4 μm) 8 mmφ×100 mm column available from Waters Corp. was used. In the measurement, a solution of 30.0% of acetonitrile, 0.7% of triethylamine and 0.7% of phosphoric acid, and 68.6% of distilled water as a carrier solvent was allowed to flow at a rate of 2.0 ml/min.

(5) Synthesis of Photosensitive Material b'

42.7 g of Compound (Ia-1), 53.7 g of 1,2-naphthoquinonediazide-5-sulfonyl chloride, and 800 ml of acetone were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 80.2 g of a 1,2-naphthoquinonediazide-5-sulfonic esterification product of Compound (Ia-1) (Photosensitive Material b').

The HPLC of Photosensitive Material b' with ultraviolet ray at 254 nm showed that the pattern area of diester compound accounts for 52% of all the pattern area and the pattern area of complete ester compound accounts for 7% of all the pattern area.

(6) Synthesis of Photosensitive Material c'

49.5 g of Compound (Ia-2), 53.7 g of 1,2-naphthoquinonediazide-5-sulfonyl chloride, and 800 ml of acetone were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 86.3 g of a 1,2-naphthoquinonediazide-5-sulfonic esterification product of Compound (Ia-2) (Photosensitive Material c').

The HPLC of Photosensitive Material c' with ultraviolet ray at 254 nm showed that the pattern area of diester compound accounts for 56% of all the pattern area and the pattern area of complete ester compound accounts for 6% of all the pattern area.

(7) Synthesis of Photosensitive Material d'

45.9 g of Compound (Ia-4), 53.7 g of 1,2-naphthoquinonediazide-5-sulfonyl chloride, and 800 ml of acetone were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 83.1 g of a 1,2-naphthoquinonediazide-5-sulfonic esterification product of Compound (Ia-4) (Photosensitive Material d').

The HPLC of Photosensitive Material d'with ultraviolet ray at 254 nm showed that the pattern area of diester compound accounts for 55% of all the pattern area and the pattern area of complete ester compound accounts for 7% of all the pattern area.

(8) Synthesis of Compound (Ib-1)

29.6 g of 1,1-bis(3'-methyl-4'-hydroxyphenyl) cyclohexane, 91.15 g of a 25% aqueous solution of tetrahydroxyammonium hydroxide, and 600 ml of distilled water were charged into a four-necked flask equipped with a stirrer, a condenser, a thermometer and a dropping apparatus. The mixture was then heated to a temperature of 50° C. with stirring to dissolve 1,1-bis(3'-methyl-4'-hydroxyphenyl) cyclohexane. To the mixture solution was then added dropwise 24.3 g of a 37% aqueous solution of formalin in 10 minutes. The reaction mixture was then heated with stirring for 14 hours. The resulting reaction mixture was then diluted with 400 ml of distilled water. To the reaction mixture were then added dropwise 15.0 g of acetic acid and 200 ml of distilled water in 30 minutes. The white powder thus precipitated was then recovered by filtration to obtain 33 g of Compound a.

17.8 g of Compound a thus obtained, 108.1 g of o-cresol, and 100 ml of methanol were charged into the same reaction apparatus as used above. The mixture was heated to a temperature of 40° C. with stirring to dissolve Compound a. To the solution was then added dropwise 0.5 g of sulfuric acid. The mixture was then heated with stirring for 10 hours. The resulting reaction mixture was poured into 1 l of distilled water. The resulting brown solid was then purified by column chromatography to obtain 12.0 g of the desired material (Ib-1) in the form of a light yellow solid. The purity of the desired material thus obtained was 96% as determined by GPC with polystyrene as a standard.

(9) Synthesis of Compound (Ib-2)

Compound (Ib-2) was synthesized in the same manner as in Synthesis of Compound (Ib-1) described above except that 122.17 g of 2,5-dimethylphenol was used instead of o-cresol. The purity of the desired material thus obtained was 97%.

(10) Synthesis of Compound (Ib-9)

29.6 g of 1,1-bis(3'-methyl-4'-hydroxyphenyl) cyclohexane, 130.2 g of 3-hydroxy-α-methylstyrene, and 50 ml of methanol were charged into a three-necked flask equipped with a stirrer, a condenser, and a thermometer to make a uniform solution. To the solution was then added 0.3 g of concentrated hydrochloric acid. The mixture was then heated to a temperature of 50° C. with stirring for 8 hours. The resulting reaction mixture was then poured into 1 l of distilled water. The resulting brown solid was then purified by column chromatography to obtain 13.2 g of the desired material (Ib-9) in the form of a light yellow solid. The purity of the desired material thus obtained was 98% as determined by GPC with polystyrene as a standard.

(11) Synthesis of Photosensitive Material a 53.7 g of Compound (Ib-1), 53.7 g of 1,2-naphthoquinonediazide-5-sulfonyl chloride, and 800 ml of acetone were charged into a three-necked flask to make a uniform solution. To the solution was then gradually added dropwise 21.2 g of triethylamine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 90.2 g of a 1,2-naphthoquinonediazide-5-sulfonic esterification product of Compound (Ib-1) (Photosensitive Material a).

The HPLC of Photosensitive Material a with ultraviolet ray at 254 nm showed that the pattern area of diester compound accounts for 60% of all the pattern area and the pattern area of complete ester (tetraester) compound accounts for 3% of all the pattern area.

(12) Synthesis of Photosensitive Material b 53.7 g of Compound (Ib-1), 53.7 g of 1,2-naphthoquinonediazide-5-sulfonyl chloride, and 800 ml of acetone were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 91.4 g of a 1,2-naphthoquinonediazide-5-sulfonic esterification product of Compound (Ib-1) (Photosensitive Material b).

The HPLC of Photosensitive Material b with ultraviolet ray at 254 nm showed that the pattern area of diester compound accounts for 65% of all the pattern area and the pattern area of complete ester (tetraester) compound accounts for 3% of all the pattern area.

(13) Synthesis of Photosensitive Material c 53.7 g of Compound (Ib-1), 53.7 g of 1,2-naphthoquinonediazide-5-sulfonyl chloride, and 1 l of chloroform were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was concentrated, dissolved in 900 ml of 1,4-dioxan, and then poured into 3 l of a 1% aqueous solution of hydrochloric acid. The resulting precipitate was recovered by filtration, washed with water, and then dried at a temperature of 40° C. to obtain 85.7 g of a 1,2-naphthoquinonediazide-5-sulfonic esterification product of Compound (Ib-1) (Photosensitive Material c).

The HPLC of Photosensitive Material c with ultraviolet ray at 254 nm showed that the pattern area of diester compound accounts for 70% of all the pattern area and the pattern area of complete ester (tetraester) compound accounts for 2% of all the pattern area.

(14) Synthesis of Photosensitive Material d 56.5 g of Compound (Ib-2), 53.7 g of 1,2-naphthoquinonediazide-5-sulfonyl chloride, and 800 ml of 1,4dioxan were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 92.7 g of a 1,2-naphthoquinonediazide-5-sulfonic esterification product of Compound (Ib-2) (Photosensitive Material d).

The HPLC of Photosensitive Material d with ultraviolet ray at 254 nm showed that the pattern area of diester compound accounts for 55% of all the pattern area and the pattern area of complete ester (tetraester) compound accounts for 5% of all the pattern area.

(15) Synthesis of Photosensitive Material e 56.6 g of Compound (Ib-9), 53.7 g of 1,2-naphthoquinonediazide-5-sulfonyl chloride, and 800 ml of acetone were charged into a three-necked flask to make a uniform solution. To the solution was then gradually added dropwise 20.8 g of N-methylpiperidine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 92.8 g of a 1,2-naphthoquinonediazide-5-sulfonic esterification product of Compound (Ib-9) (Photosensitive Material e).

The HPLC of Photosensitive Material e with ultraviolet ray at 254 nm showed that the pattern area of diester compound accounts for 66% of all the pattern area and the pattern area of complete ester (tetraester) compound accounts for 4% of all the pattern area.

(16) Synthesis of Photosensitive Material f 56.5 g of Compound (Ib-2), 53.7 g of 1,2-naphthoquinonediazide-5-sulfonyl chloride, and 800 ml of acetone were charged into a three-necked flask to make a uniform solution. To the solution was then gradually added dropwise 21.2 g of triethylamine. The reaction mixture was then allowed to undergo reaction at a temperature of 25° C. for 3 hours. The reaction mixture solution was then poured into 3 l of a 1% aqueous solution of hydrochloric acid. The resulting precipitate was recovered by filtration, washed with water, and then dried at a temperature of 40° C. to obtain 92.7 g of a 1,2-naphthoquinonediazide-5-sulfonic esterification product of Compound (Ib-2) (Photosensitive Material f).

The HPLC of Photosensitive Material f with ultraviolet ray at 254 nm showed that the pattern area of diester compound accounts for 45% of all the pattern area and the pattern area of complete ester (tetraester) compound accounts for 6% of all the pattern area.

(17) Synthesis of Photosensitive Material g 53.7 g of Compound (Ib-1), 61.8 g of 1,2-naphthoquinonediazide-5-sulfonyl chloride, and 1,000 ml of acetone were charged into a three-necked flask to make a uniform solution. To the solution was then gradually added dropwise 24.4 g of triethylamine. The reaction mixture was then allowed to undergo reaction at a temperature of 25° C. for 3 hours. The reaction mixture solution was then poured into 3.5 l of a 1% aqueous solution of hydrochloric acid. The resulting precipitate was recovered by filtration, washed with water, and then dried at a temperature of 40° C. to obtain 96.5 g of a 1,2-naphthoquinonediazide-5-sulfonic esterification product of Compound (Ib-1) (Photosensitive Material g).

The HPLC of Photosensitive Material g with ultraviolet ray at 254 nm showed that the pattern area of diester compound accounts for 33% of all the pattern area and the pattern area of complete ester (tetraester) compound accounts for 15% of all the pattern area.

(18) Synthesis of Photosensitive Material h 53.7 g of Compound (Ib-1), 94.0 g of 1,2-naphthoquinonediazide-5-sulfonyl chloride, and 1,200 ml of acetone were charged into a three-necked flask to make a uniform solution. To the solution was then gradually added dropwise 37.2 g of triethylamine. The reaction mixture was then allowed to undergo reaction at a temperature of 25° C. for 3 hours. The reaction mixture solution was then poured into 4 l of a 1% aqueous solution of hydrochloric acid. The resulting precipitate was recovered by filtration, washed with water, and then dried at a temperature of 40° C. to obtain 121.6 g of a 1,2-naphthoquinonediazide-5-sulfonic esterification product of Compound (Ib-1) (Photosensitive Material h).

The HPLC of Photosensitive Material h with ultraviolet ray at 254 nm showed that the pattern area of diester compound accounts for 5% of all the pattern area and the pattern area of complete ester (tetraester) compound accounts for 60% of all the pattern area.

(19) Synthesis of Photosensitive Material i 24.4 g of Compound (III) having the following structural formula, 53.7 g of 1,2-naphthoquinonediazide-5-sulfonyl chloride, and 800 ml of acetone were charged into a three-necked flask to make a uniform solution. To the solution was then gradually added dropwise 21.2 g of triethylamine. The reaction mixture was then allowed to undergo reaction at a temperature of 25° C. for 3 hours. The reaction mixture solution was then poured into 2,500 ml of a 1% aqueous solution of hydrochloric acid. The resulting precipitate was recovered by filtration, washed with water, and then dried at a temperature of 40° C. to obtain 63.8 g of a 1,2-naphthoquinonediazide-5sulfonic esterification product of Compound (III) (Photosensitive Material i).

The HPLC of Photosensitive Material i with ultraviolet ray at 254 nm showed that the pattern area of diester compound accounts for 80% of all the pattern area and the pattern area of complete ester (triester) compound accounts for 8% of all the pattern area.

Compound (III)

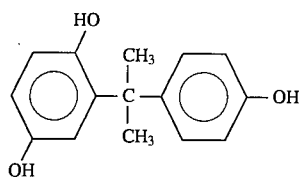

(20) Synthesis of Photosensitive Material j 30.0 g of Compound (IV) having the following structural formula, 53.7 g of 1,2-naphthoquinonediazide-5-sulfonyl chloride, and 800 ml of chloroform were charged into a three-necked flask to make a uniform solution. To the solution was then gradually added dropwise 21.2 g of triethylamine. The reaction mixture was then allowed to undergo reaction at a temperature of 25° C. for 3 hours. The reaction mixture solution was concentrated, dissolved in 900 ml of 1,4-dioxan, and then poured into 2,500 ml of a 1% aqueous solution of hydrochloric acid. The resulting precipitate was recovered by filtration, washed with water, and then dried at a temperature of 40° C. to obtain 68.8 g of a 1,2-naphthoquinonediazide-5-sulfonic esterification product of Compound (IV) (Photosensitive Material j).

The HPLC of Photosensitive Material j with ultraviolet ray at 254 nm showed that the pattern area of diester compound accounts for 89% of all the pattern area and the pattern area of complete ester (tetraester) compound accounts for 4% of all the pattern area.

Compound (IV)

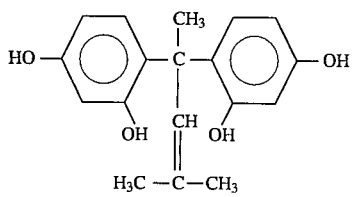

(21) Synthesis of Photosensitive Material k 35.2 g of Compound (V) having the following structural formula, 107.5 g of 1,2-naphthoquinonediazide-5-sulfonyl chloride, and 1,200 ml of acetone were charged into a three-necked flask to make a uniform solution. To the solution was then gradually added dropwise 42.5 g of triethylamine. The reaction mixture was then allowed to undergo reaction at a temperature of 25° C. for 3 hours. The reaction mixture solution was then poured into 4,000 ml of a 1% aqueous solution of hydrochloric acid. The resulting precipitate was recovered by filtration, washed with water, and then dried at a temperature of 40° C. to obtain 68.8 g of a 1,2-naphthoquinonediazide-5-sulfonic esterification product of Compound (V) (Photosensitive Material k).

The HPLC of Photosensitive Material k with ultraviolet ray at 254 nm showed that the pattern area of diester compound accounts for 15% of all the pattern area and the pattern area of complete ester (pentaester) compound accounts for 5% of all the pattern area.

Compound (V)

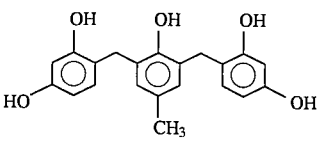

(22) Synthesis of Photosensitive Material 1

65.1 g of Compound (VI) having the following structural formula, 107.5 g of 1,2-naphthoquinonediazide-5-sulfonyl chloride, and 1,500 ml of acetone were charged into a three-necked flask to make a uniform solution. To the solution was then gradually added dropwise 42.5 g of triethylamine. The reaction mixture was then allowed to undergo reaction at a temperature of 25° C. for 3 hours. The reaction mixture solution was then poured into 4,000 ml of a 1% aqueous solution of hydrochloric acid. The resulting precipitate was recovered by filtration, washed with water, and then dried at a temperature of 40° C. to obtain 142.1 g of a 1,2-naphthoquinonediazide-5-sulfonic esterification product of Compound (VI) (Photosensitive Material l).

The HPLC of Photosensitive Material l with ultraviolet ray at 254 nm showed that the pattern area of diester compound accounts for 20% of all the pattern area and the pattern area of complete ester (hexaester) compound accounts for 5% of all the pattern area.

Compound (VI)

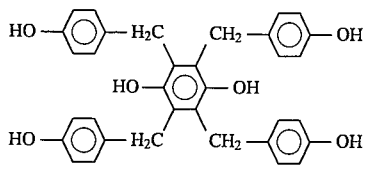

(23) Synthesis of Novolak Resin A 45 g of m-cresol, 55 g of p-cresol, 49 g of a 37% aqueous solution of formalin, and 0.13 g of oxalic acid were charged into a three-necked flask. The reaction mixture was then heated with stirring to a temperature of 100° C. where it was then allowed to undergo reaction for 15 hours.

The reaction system was then heated to a temperature of 200° C. where it was then gradually evacuated to 5 mmHg to remove water, unreacted monomers, formaldehyde, oxalic acid, etc. therefrom. The alkali-soluble novolak resin thus melted was allowed to cool to room temperature and then recovered. The novolak resin A thus obtained had a weight-average molecular weight of 8,100 (reduced to polystyrene) and a dispersion degree of 6.30.

(24) Synthesis of Novolak Resin B 50 g of m-cresol, 25 g of p-cresol, 28 g of 2,5-xylenol, 53 g of a 37% aqueous solution of formalin, and 0.15 g of oxalic acid were charged into a three-necked flask. The reaction mixture was then heated with stirring to a temperature of 100° C. where it was then allowed to undergo reaction for 14 hours.

The reaction system was then heated to a temperature of 200° C. where it was then gradually evacuated to 1 mmHg to remove water, unreacted monomers, formaldehyde, oxalic acid, etc. therefrom. The novolak resin thus melted was allowed to cool to room temperature and then recovered. The novolak resin thus obtained had a weight-average molecular weight of 4,800 (reduced to polystyrene). 20 g of the novolak resin was then completely dissolved in 60 g of methanol. To the resin solution was then gradually added 30 g of water with stirring to precipitate the resin component. The upper phase was removed by decantation. The resin component thus precipitated was recovered, heated to a temperature of 40° C., and then dried under reduced pressure for 24 hours to obtain an alkali-soluble novolak resin B. The novolak resin thus obtained had a weight-average molecular weight of 9,960 (reduced to polystyrene) and a dispersion degree of 3.50. The novolak resin also exhibited monomer, dimer and trimer contents of 0%, 2.3% and 3.5%, respectively, showing that the low molecular components had been removed in an amount of 43% by the fractional reprecipitation process.

(25) Synthesis of Novolak Resin C 60 g of m-cresol, 20 g of p-cresol, 25 g of 2,3,5-trimethylphenol, 56 g of a 37% aqueous solution of formalin, and 0.16 g of oxalic acid were charged into a three-necked flask. The reaction mixture was then heated with stirring to a temperature of 100° C. where it was then allowed to undergo reaction for 16 hours.

The reaction system was then heated to a temperature of 200° C. where it was then gradually evacuated to 1 mmHg to remove water, unreacted monomers, formaldehyde, oxalic acid, etc. therefrom. The novolak resin thus melted was allowed to cool to room temperature and then recovered. The novolak resin thus obtained had a weight-average molecular weight of 3,800 (reduced to polystyrene). 20 g of the novolak resin was then completely dissolved in 60 g of acetone. To the resin solution was then gradually added 60 g of hexane with stirring. The mixture was then allowed to stand for 2 hours. The upper phase was removed by decantation. The resin component thus precipitated was recovered, heated to a temperature of 40° C., and then dried under reduced pressure for 24 hours to obtain an alkali-soluble novolak resin C. The novolak resin thus obtained had a weight-average molecular weight of 8,300 (reduced to polystyrene) and a dispersion degree of 3.20. The novolak resin also exhibited monomer, dimer and trimer contents of 0%, 2.1 and 3.0%, respectively, showing that the low molecular components had been removed in an amount of 56% by the fractional reprecipitation process.

(26) Synthesis of Novolak Resin D 30 g of p-cresol, 14 g of o-cresol, 50 g of 2,3-dimethylphenol, 20 g of 2,3,5-trimethylphenol, and 4.9 g of 2,6-dimethylphenol were mixed with 50 g of diethylene glycol monomethyl ether. The mixture was then charged into a three-necked flask equipped with a stirrer, a condenser and a thermometer. To the reaction mixture was then added 85 g of a 37% aqueous solution of formalin. The reaction mixture was then stirred over a 110° C. oil bath. When the internal temperature of the reaction system reached 90° C., 6.3 g of oxalic acid dihydrate was added to the reaction system. The temperature of the oil bath was then raised to 130° C. where the reaction system continued to undergo reaction for 18 hours. The condenser was then removed. The reaction system was then distilled at a temperature of 200° C. under reduced pressure to remove unreacted monomers therefrom. The novolak resin thus obtained exhibited Mw of 3,280 and a dispersion degree of 2.75.

(27) Preparation and Evaluation of Positive-working Photoresist Composition

The photosensitive materials, the novolak resins, solvents, and optionally water-insoluble alkali-soluble compounds were mixed in proportions as set forth in Table 1, respectively, to make uniform solutions. These solutions were each filtered through a teflon microfilter having a pore diameter of 0.10 μm to prepare photoresist compositions. These photoresist compositions were each applied to a silicon wafer by means of a spinner at different numbers of rotation, respectively, and then dried at a temperature of 90° C. over a vacuum suction hot plate for 60 seconds to obtain resist films having a thickness of 0.97 μm and 1.02 μm.

These films were each exposed to light from a reduction projection exposing apparatus (NSR-2005i9C available from Nikon Corporation), postbaked at a temperature of 110° C. for 60 seconds, developed with a 2.38% aqueous solution of tetramethylammonium hydroxide for 1 minute, washed with water for 30 seconds, and then dried.

The resist patterns thus obtained on the silicon wafers were then observed under a scanning electron microscope to evaluate the resist. The results are set forth in Table 2.

Sensitivity was defined by a reciprocal of an exposure necessary for reproducing a mask pattern of 0.60 μm and expressed by a value relative to that of Comparative Example 1 with a resist film thickness of 1.02 μm, which was set at 1.0.

Resolving power represents a critical resolving power in an exposure necessary for reproducing a mask pattern of 0.60 μm.

Heat resistance was represented by the highest allowable temperature at which the silicon wafer on which a resist pattern has been formed can be baked over a hot plate for 4 minutes without causing the pattern to be deformed.

Resist shape was represented by the angle (θ) made by the resist wall and the surface of the silicon wafer on a section of 0.50-μm thick resist pattern.

Development Residue was evaluated by observing the resist patterns obtained on the silicon wafers under a scanning electron microscope.

A: No residue is observed.

B: Residue is observed.

For the evaluation of storage stability, the positive-working photoresist composition solution was allowed to stand at room temperature for 6 months. The presence of precipitates in the solution was then examined. In Table 2, "A" indicates the absence of precipitates while "B" indicates the presence of precipitates.

The results are set forth in Table 2.

TABLE 1

| | Formulations of positive-working photoresist composition | | | | | | | |
|---|---|---|---|---|---|---|---|---|
| | Novolak Resin | | Photosensitive Material | | Water-insoluble Alkali-soluble Low Molecular Compound* | | Solvent** | |
| Example No. | Kind | Added Amount | Kind | Added Amount | Kind | Added Amount | Kind | Added Amount |
| Example 1 | A | 100 | a' | 28 | — | — | S-1 | 350 |
| Example 2 | A | 100 | c' | 27 | — | — | S-2 | 380 |
| Example 3 | A | 100 | d' | 27 | — | — | S-3 | 360 |
| Example 4 | B | 85 | a' | 28 | P-1 | 15 | S-1 | 350 |
| Example 5 | B | 80 | b' | 28 | P-2 | 20 | S-1 | 350 |
| Example 6 | B | 96 | d' | 27 | P-3 | 15 | S-2 | 380 |
| Example 7 | D | 80 | a' | 29 | P-3 | 20 | S-2 | 380 |
| Example 8 | D | 80 | d' | 28 | P-1 | 20 | S-3 | 350 |
| Example 9 | A | 100 | a | 28 | — | — | S-3 | 360 |
| Example 10 | A | 100 | b | 28 | — | — | S-2 | 380 |
| Example 11 | A | 100 | c | 26 | — | — | S-1 | 380 |
| Example 12 | B | 85 | a | 27 | P-3 | 15 | S-2/S-4 | 285/95 |
| Example 13 | B | 78 | b/j | 15/15 | P-2 | 22 | S-1 | 380 |
| Example 14 | B | 80 | d | 29 | P-3 | 20 | S-2 | 380 |
| Example 15 | B | 83 | e | 27 | P-2 | 17 | S-3 | 360 |
| Example 16 | B | 77 | f | 31 | P-3 | 23 | S-2 | 380 |
| Example 17 | B | 79 | c | 30 | P-1 | 21 | S-2 | 370 |
| Example 18 | C | 82 | b | 27 | P-3 | 18 | S-2/S-4 | 285/95 |
| Example 19 | C | 79 | c | 30 | P-1/P-3 | 11/10 | S-1 | 340 |
| Example 20 | C | 83 | e | 29 | P-3 | 17 | S-1 | 350 |
| Example 21 | C | 78 | f | 30 | P-2 | 22 | S-2 | 380 |
| Example 22 | D | 81 | c/l | 25/5 | P-2 | 19 | S-1 | 340 |
| Example 23 | D | 85 | c | 28 | P-3 | 15 | S-1 | 340 |
| Example 24 | D | 84 | e | 29 | P-1 | 16 | S-2 | 370 |
| Comparative Example 1 | A | 100 | j | 29 | — | — | S-1 | 300 |
| Comparative Example 2 | A | 100 | k | 29 | — | — | S-1 | 350 |
| Comparative Example 3 | A | 100 | l | 27 | — | — | S-1 | 350 |
| Comparative Example 4 | B | 100 | m | 28 | P-1 | 15 | S-2 | 380 |
| Comparative Example 5 | A | 79 | g | 33 | — | — | S-2 | 370 |
| Comparative Example 6 | B | 79 | h | 33 | P-3 | 21 | S-2 | 380 |
| Comparative | C | 78 | l | 32 | P-2 | 22 | S-1 | 350 |

TABLE 1-continued

<table>
<tr><th colspan="9">Formulations of positive-working photoresist composition</th></tr>
<tr><th></th><th colspan="2">Novolak Resin</th><th colspan="2">Photosensitive Material</th><th colspan="2">Water-insoluble Alkali-soluble Low Molecular Compound*</th><th colspan="2">Solvent**</th></tr>
<tr><th>Example No.</th><th>Kind</th><th>Added Amount</th><th>Kind</th><th>Added Amount</th><th>Kind</th><th>Added Amount</th><th>Kind</th><th>Added Amount</th></tr>
<tr><td>Example 7</td><td></td><td></td><td></td><td></td><td></td><td></td><td></td><td></td></tr>
</table>

*P-1: α,α,α'-Tris(4-hydroxyphenyl)-1-ethyl-4-isopropoxybenzene
P-2: Tris(4-hydroxyphenyl)methane
P-3: 1,1-Bis(4-hydroxyphenyl)cyclohexane
**S-1: Ethyl cellosolve acetate
S-2: Ethyl 2-hydroxypropionate
S-3: Methyl 3-methoxypropionate
S-4: Ethyl 3-ethoxypropionate

TABLE 2

| Example No. | Relative Sensitivity | | Resolving Power (μm) | | Heat Resistance (°C.) | Resist Shape (θ) | | Development Residue | Storage Stability |
|---|---|---|---|---|---|---|---|---|---|
| | Resist Thickness 0.97 μm | Resist Thickness 1.02 μm | Resist Thickness 0.97 μm | Resist Thickness 1.02 μm | Resist Thickness 0.97 μm | Resist Thickness 0.97 μm | Resist Thickness 1.02 μm | | |
| Example 1 | 1.1 | 1.2 | 0.32 | 0.32 | 150 | 89 | 89 | — | A |
| Example 2 | 1.2 | 1.3 | 0.32 | 0.32 | 150 | 89 | 89 | — | A |
| Example 3 | 1.1 | 1.2 | 0.32 | 0.32 | 150 | 89 | 89 | — | A |
| Example 4 | 1.2 | 1.3 | 0.30 | 0.30 | 160 | 88 | 88 | — | A |
| Example 5 | 1.2 | 1.3 | 0.30 | 0.30 | 160 | 89 | 88 | — | A |
| Example 6 | 1.2 | 1.3 | 0.30 | 0.30 | 160 | 89 | 89 | — | A |
| Example 7 | 1.2 | 1.3 | 0.29 | 0.29 | 160 | 88 | 88 | — | A |
| Example 8 | 1.2 | 1.3 | 0.29 | 0.29 | 160 | 89 | 89 | — | A |
| Example 9 | 1.1 | 1.2 | 0.32 | 0.32 | 150 | 89 | 89 | A | A |
| Example 10 | 1.2 | 1.3 | 0.32 | 0.32 | 150 | 89 | 89 | A | A |
| Example 11 | 1.1 | 1.2 | 0.32 | 0.32 | 150 | 89 | 89 | A | A |
| Example 12 | 1.1 | 1.2 | 0.30 | 0.30 | 160 | 89 | 89 | A | A |
| Example 13 | 1.2 | 1.3 | 0.32 | 0.32 | 160 | 88 | 88 | A | A |
| Example 14 | 1.1 | 1.2 | 0.30 | 0.30 | 160 | 89 | 89 | A | A |
| Example 15 | 1.2 | 1.3 | 0.28 | 0.28 | 160 | 88 | 88 | A | A |
| Example 16 | 1.1 | 1.2 | 0.30 | 0.30 | 160 | 89 | 89 | A | A |
| Example 17 | 1.2 | 1.3 | 0.28 | 0.28 | 160 | 89 | 89 | A | A |
| Example 18 | 1.1 | 1.2 | 0.30 | 0.30 | 160 | 88 | 88 | A | A |
| Example 19 | 1.2 | 1.3 | 0.28 | 0.28 | 160 | 89 | 89 | A | A |
| Example 20 | 1.1 | 1.2 | 0.30 | 0.30 | 160 | 89 | 89 | A | A |
| Example 21 | 1.1 | 1.2 | 0.32 | 0.32 | 160 | 88 | 88 | A | A |
| Example 22 | 1.2 | 1.3 | 0.30 | 0.30 | 160 | 89 | 89 | A | A |
| Example 23 | 1.2 | 1.3 | 0.28 | 0.28 | 160 | 89 | 89 | A | A |
| Example 24 | 1.1 | 1.2 | 0.30 | 0.30 | 160 | 89 | 89 | A | A |

TABLE 2-continued

| Example No. | Relative Sensitivity Resist Thickness 0.97 μm | Relative Sensitivity Resist Thickness 1.02 μm | Resolving Power (μm) Resist Thickness 0.97 μm | Resolving Power (μm) Resist Thickness 1.02 μm | Heat Resistance (°C.) Resist Thickness 0.97 μm | Resist Shape (θ) Resist Thickness 0.97 μm | Resist Shape (θ) Resist Thickness 1.02 μm | Development Residue | Storage Stability |
|---|---|---|---|---|---|---|---|---|---|
| Comparative Example 1 | 0.9 | 1.0 | 0.40 | 0.42 | 140 | 84 | 83 | A | A |
| Comparative Example 2 | 1.1 | 1.2 | 0.36 | 0.40 | 140 | 83 | 82 | A | A |
| Comparative Example 3 | 1.1 | 1.3 | 0.32 | 0.38 | 150 | 85 | 84 | A | A |
| Comparative Example 4 | 0.8 | 0.9 | 0.34 | 0.36 | 140 | 83 | 83 | B | B |
| Comparative Example 5 | 0.8 | 0.9 | 0.32 | 0.34 | 150 | 88 | 88 | A | A |
| Comparative Example 6 | 0.7 | 0.8 | 0.32 | 0.34 | 160 | 89 | 89 | A | A |
| Comparative Example 7 | 1.3 | 1.4 | 0.32 | 0.36 | 160 | 86 | 85 | A | A |

The positive-working photoresist comprising the photosensitive material of the present invention exhibits excellent sensitivity and resolving power as well as little dependence of properties on film thickness, little development residue and excellent storage stability.

EXAMPLE 2

(28) Synthesis of Photosensitive Material (A-2A)

50.5 g of 2,6-bis(hydroxymethyl)-p-cresol and 194.7 g of o-cresol were dissolved in 200 ml of methanol in a three-necked flask equipped with a stirrer, a condenser, and a thermometer. To the mixture was then added 9.1 g of a 36% hydrochloric acid. The reaction mixture was then allowed to undergo reaction under reflux at an elevated temperature for 7 hours. The reaction mixture was then poured into 4 l of water. The resulting precipitate was washed with water, and then stirred in a 2:1 mixture of hexane and dichloromethane to remove unreacted materials therefrom. The residue was then recrystallized from a mixture of ethanol and water to obtain 54 g of a white solid. NMR of the product showed that it is 2,6-bis(3'-methyl-4'-hydroxybenzyl)-p-cresol.

8.71 g of 2,6-bis(3'-methyl-4'-hydroxybenzyl)-p-cresol thus obtained, 13.43 g of 1,2-naphthoquinonediazide-5-sulfonyl chloride, 200 ml of acetone, and 10 ml of distilled water were charged into a four-necked flask equipped with a stirrer, a condenser, a thermometer, and a dropping apparatus to make a solution. To the solution was then added dropwise a solution of 5.27 g of triethylamine in 25 ml of acetone at room temperature in 35 minutes. The reaction mixture was then allowed to undergo reaction for 3 hours. To the reaction mixture was then added 3.14 g of acetic acid. The reaction mixture was then poured into 3 l of distilled water. The resulting yellow precipitate was recovered by filtration, washed with water, and then dried to obtain 19.7 g of a photosensitive material (A-2A). The HPLC of this photosensitive material showed that the diester compound and triester compound account for 59% and 24%, respectively.

(29) Synthesis of Photosensitive Material (A-2B)

17.1 g of a photosensitive material (A-2B) was obtained in the same manner as in Synthesis of Photosensitive Material (A-2A) above except that the added amount of 2,6-bis(3'-methyl-4'-hydroxybenzyl)-p-cresol was altered from 8.71 g to 5.81 g. The HPLC of this photosensitive material showed that the diester compound and triester compound account for 20% and 75%, respectively.

(30) Synthesis of Photosensitive Material (A-3A)

40.4 g of 2,6-bis(hydroxymethyl)-p-cresol and 176 g of 2,5-xylenol were dissolved in 170 ml of methanol in a three-necked flask equipped with a stirrer, a condenser, and a thermometer. To the mixture was then added 7.3 g of a 36% hydrochloric acid. The reaction mixture was then allowed to undergo reaction under reflux at an elevated temperature for 12 hours. The reaction mixture was then poured into 3.5 l of water. The resulting precipitate was washed with water, and then stirred in a 2:1 mixture of hexane and dichloromethane to remove unreacted materials therefrom. The residue was then recrystallized from a mixture of ethanol and water to obtain 41 g of a white solid. NMR of the product showed that it is 2,6-bis(2',5'-dimethyl-4'-hydroxybenzyl)-p-cresol.

7.34 g of 2,6-bis(2',5'-dimethyl-4'-hydroxybenzyl)-p-cresol thus obtained, 10.48 g of 1,2-naphthoquinonediazide-5-sulfonyl chloride, 160 ml of acetone, and 10 ml of distilled water were charged into a four-necked flask equipped with a stirrer, a condenser, a thermometer, and a dropping apparatus to make a solution. To the solution was then added dropwise a solution of 4.11 g of triethylamine in 20 ml of acetone at room temperature in 30 minutes. The reaction mixture was then allowed to undergo reaction for 5 hours. To the reaction mixture was then added 2.45 g of acetic acid. The reaction mixture was then poured into 2.5 l of distilled water. The resulting yellow precipitate was recovered by filtration, washed with water, and then dried to obtain 15.5 g of a photosensitive material (A-3A). The HPLC showed that the diester compound and triester compound account for 61% and 35%, respectively.

(31) Synthesis of Photosensitive Material (A-3B)

13.2 g of a photosensitive material (A-3B) was obtained in the same manner as in Synthesis of Photosensitive Material (A-3A) described above except that the added amount of 2,6-bis( 2',5'-dimethyl-4'-hydroxybenzyl)-p-cresol was altered from 7.34 g to 4.91 g. The HPLC showed that the diester compound and triester compound account for 18% and 77%, respectively.

(32) Synthesis of Photosensitive Material (A-71A)

116 g of phenol and 2.5 g of a 16% aqueous solution of a sodium salt of methyl mercaptan were charged into a flask equipped with a stirrer, a condenser, a thermometer, a dropping apparatus, and a gas intake tube. Hydrogen chloride gas was then introduced into the mixture with stirring at a temperature of 40° C. until saturation was reached. To the reaction mixture was then added dropwise a mixture of 19 g of p-isopropenyl acetophenone and 19 g of phenol at a temperature of 40° C. with hydrogen chloride gas being introduced thereinto in 2 hours. The reaction mixture was further allowed to undergo reaction at a temperature of 40° C. with hydrogen chloride gas being gradually introduced thereinto for 6 hours. The reaction mixture was allowed to cool to room temperature where it was then allowed to stand overnight. To the reaction mixture were then added 700 g of toluene and 360 g of a 3% aqueous solution of sodium hydrogencarbonate. The reaction mixture was then vigorously stirred at a temperature of 80° C. for 30 minutes. The reaction mixture was then allowed to cool to room temperature. The resulting crystalline precipitate was recovered by filtration, and then washed with toluene and distilled water. The crystal was dissolved in a mixture of methyl isobutyl ketone and toluene at an elevated temperature, washed with distilled water, and then cooled. The crystal was recovered by filtration, and then dried to obtain 41 g of a white solid having a melting point of 221° to 224° C. The mass spectrometry of the product showed that $M^+$ is 424.

16.99 g of the white crystal thus obtained, 21.49 g of 1,2-naphthoquinonediazide-5-sulfonyl chloride, 320 ml of acetone, and 15 ml of distilled water were charged into a four-necked flask equipped with a stirrer, a condenser, a thermometer, and a dropping apparatus to make a solution. To the solution was then added dropwise a solution of 8.43 g of triethylamine in 40 ml of acetone at room temperature in 30 minutes. The reaction mixture was then further allowed to undergo reaction for 4 hours. To the reaction mixture was then added 5.02 g of acetic acid. The reaction mixture was then poured into 4.8 l of distilled water. The resulting yellow precipitate was recovered by filtration, washed with water, and then dried to obtain 32.7 g of a photosensitive material (A-71A). The HPLC of this photosensitive material showed that the diester compound and triester compound account for 68% and 29% of the photosensitive material, respectively.

(33) Synthesis of Photosensitive Material (A-71B)

26.4 g of a photosensitive material (A-71B) was obtained in the same manner as in Synthesis of Photosensitive Material (A-71A) described above except that the added amount of the white crystal was altered from 16.99 g to 11.33 g. The HPLC showed that the diester compound and triester compound account for 10% and 87%, respectively.

(34) Synthesis of Photosensitive Material (A-9A)

15 g of 2,6-bis(3,5-dimethyl-4-hydroxybenzyl)-p-cresol, 30.3 g of 1,2-naphthoquinonediazide-5-sulfonyl chloride, and 300 ml of acetone were charged into a three-necked flask to make a uniform solution. To the solution was then added gradually dropwise a mixture of 12.4 g of triethylamine and 30 ml of acetone. The reaction mixture was then allowed to undergo reaction at a temperature of 25° C. for 15 hours. The reaction mixture was then poured into 1,500 ml of a 1% aqueous solution of hydrochloric acid. The resulting precipitate was recovered by filtration, washed with water and methanol, and then dried at a temperature of 40° C. to recover a photosensitive material (A-9A). HPLC of the product showed that it is a mixture of 28% of triester compounds, 59% of diester compounds, and a balance of other lower substituted compounds.

(35) Synthesis of Photosensitive Material (A-9B)

10 g of 2,6-bis(3,5-dimethyl-4-hydroxybenzyl)-p-cresol, 30.3 g of 1,2-naphthoquinonediazide-5-sulfonyl chloride, and 300 ml of acetone were charged into a three-necked flask to make a uniform solution. To the solution was then added gradually dropwise a mixture of 12.4 g of triethylamine and 30 ml of acetone. The reaction mixture was then allowed to undergo reaction at a temperature of 25° C. for 15 hours. The reaction mixture was then poured into 1,500 ml of a 1% aqueous solution of hydrochloric acid. The resulting precipitate was recovered by filtration, washed with water and methanol, and then dried at a temperature of 40° C. to recover a photosensitive material (A-9B). HPLC of the product showed that it is a mixture of 78% of triester compounds, 12 of diester compounds, and a balance of other lower substituted compounds.

Preparation examples of the novolak resins which can be used in the present invention will be described hereinafter.

(36) Synthesis of Novolak Resin (a)

50 g of m-cresol, 50 g of p-cresol, 45.5 g of a 37% aqueous solution of formalin, and 0.05 g of oxalic dihydrate were charged into a three-necked flask equipped with a stirrer, a condenser, and a thermometer. The mixture was heated with stirring to a temperature of 100° C. where it was then allowed to undergo reaction for 10 hours. After the completion of reaction, the reaction mixture was allowed to cool to room temperature. The condenser was then removed from the flask. The reaction system was then evacuated to 25 mmHg.

The reaction mixture was then gradually heated to a temperature of 160° C. to remove water and unreacted monomers therefrom. Thus, 73 g of Novolak Resin (a) was obtained. GPC of the product showed that it has Mw of 6,540 and a dispersion degree of 7.4.

(37) Synthesis of Novolak Resin (b)

44 g of Novolak Resin (a) was measured out and dissolved in 400 ml of MEK. To the solution was then added 1,600 ml of cyclohexane. The mixture was heated to a temperature of 60° C. with stirring. The solution was allowed to cool to room temperature where it was then allowed to stand for 16 hours to cause precipitation. The precipitate thus obtained was recovered by filtration, and then dried in a 50° C. vacuum oven to obtain about 15 g of Novolak Resin (b). GPC of Novolak Resin (b) showed that it has Mw of 8,720 and a dispersion degree of 4.3.

(38) Synthesis of Novolak Resin 456.6 g of m-cresol, 295.8 g of p-cresol, and 404.35 g of a 37% aqueous solution of formalin were charged into a three-necked flask equipped with a stirrer, a condenser, and a thermometer. The mixture was heated over a 110° C. oil bath with stirring. When the internal temperature of the reaction system reached 90° C., 1.03 g of oxalic dihydrate was added to the reaction system. The reaction system was then allowed to undergo reaction under reflux for 15 hours. After the condenser was removed, the temperature of the oil bath was raised to 200° C. where water and unreacted monomers were then removed from the reaction system under reduced pressure. Thus, 565 g of Novolak Resin (c) was obtained. GPC of Novolak Resin (c) showed that it has Mw of 8,860 and a dispersion degree of 7.7.

(39) Synthesis of Novolak Resin (d)

44 g of Novolak Resin (c) was measured out and dissolved in a mixture of 280 ml of acetone and 175 ml of toluene. To the solution was then added 180 ml of hexane. The mixture was heated to a temperature of 40° C. with stirring. The solution was allowed to cool to room temperature where it was then allowed to stand for 16 hours to cause precipitation. The precipitate thus obtained was recovered by filtration, and then dried in a 50° C. vacuum oven to obtain about 15 g of Novolak Resin (d). GPC of Novolak Resin (d) showed that it has Mw of 11,400 and a dispersion degree of 3.9.

(40) Synthesis of Novolak Resin (e)

50 g of m-cresol, 25 g of p-cresol, 28 g of 2,5-xylenol, and 53 g of a 37% aqueous solution of formalin were charged into a three-necked flask having an internal volume of 500 ml equipped with a stirrer and a condenser. The mixture was then heated with vigorous stirring over a 110° C. oil bath. To the mixture was then added 0.15 g of oxalic acid. The mixture was then heated to the same temperature with stirring for 15 hours.

The temperature of the reaction system was then raised to 200° C. where the reaction system was then gradually evacuated to 1 to 2 mmHg to conduct reflux for 2 hours, whereby unreacted monomers, water, formaldehyde, oxalic acid, etc. were removed. The reaction system was then allowed to cool to room temperature to obtain 81 g of Novolak Resin (e). GPC of Novolak Resin (e) showed that it has Mw of 4,400 and a dispersion degree of 6.5.

(41) Synthesis of Novolak Resin 20 g of Novolak Resin (e) was dissolved in 60 g of methanol. To the solution was then added gradually 30 g of distilled water with stirring to cause the precipitation of the resin component. The upper one of the resulting two phases was removed by decantation. The residue was then dissolved in 30 g of methanol. To the solution was again added gradually 40 g of distilled water to cause the precipitation of the resin component. The upper one of the resulting two phases was removed by decantation to recover the resin component which was then dried at a temperature of 40° C. in a vacuum dryer for 24 hours to obtain 7 g of Novolak Resin (f). GPC of Novolak Resin (f) showed that it has Mw of 9,860 and a dispersion degree of 2.80.

(42) Synthesis of Novolak Resin (g)

14.4 g of methylenebis-p-cresol, 2.2 g of o-cresol, 70.2 g of 2,3-dimethylphenol, 27.2 g of 2,3,5-trimethylphenol, and 9.77 g of 2,6-dimethylphenol were mixed with 50 g of diethylene glycol monomethyl ether. The mixture was then charged into a three-necked flask equipped with a stirrer, a condenser, and a thermometer. To the mixture was then added 85.2 g of a 37% aqueous solution of formalin. The reaction mixture was then heated with stirring over a 110° C. oil bath. When the internal temperature of the reaction mixture reached 90° C. 6 2 g of oxalic dihydrate was added to the reaction mixture. The temperature of the oil bath was then kept to 130° C. where the reaction continued for 18 hours. The condenser was then removed. The reaction mixture was then distilled at a temperature of 200° C. under reduced pressure to remove unreacted monomers therefrom. The novolak resin thus obtained exhibited Mw of 3,530 and a dispersion degree of 2.25.

(43) Synthesis of Novolak Resin 8.1 g of p-cresol, 6.6 g of o-cresol, 119.1 g of 2,3-dimethylphenol, 40.8 g of 2,3,5-trimethylphenol, and 11 g of 2,6-dimethylphenol were mixed with 73.5 g of diethylene glycol monomethyl ether. The mixture was then charged into a three-necked flask equipped with a stirrer, a condenser, and a thermometer. To the mixture was then added 133.8 g of a 37 aqueous solution of formalin. The reaction mixture was then heated with stirring over a 110° C. oil bath. When the internal temperature of the reaction mixture reached 90° C., 9.3 g of oxalic dihydrate was added to the reaction mixture. The temperature of the oil bath was then kept to 130° C. where the reaction continued for 18 hours. The condenser was then removed. The reaction mixture was then distilled at a temperature of 200° C. under reduced pressure to remove unreacted monomers therefrom. The novolak resin thus obtained exhibited Mw of 3,830 and a dispersion degree of 2.36.

(44) Synthesis of Photosensitive Material (A)

10 g of 2,3,4,4'-tetrahydroxybenzophenone, 41 g of 1,2-naphthoquinonediazide-5-sulfonyl chloride, and 400 ml of γ-butylolactone were charged into a three-necked flask to make a uniform solution. To the solution was then added gradually dropwise a mixture of 17 g of triethylamine and 40 ml of acetone. The reaction mixture was then allowed to undergo reaction at a temperature of 25° C. for 3 hours. The reaction mixture was then poured into 1,000 ml of a 1% aqueous solution of hydrochloric acid. The resulting precipitate was recovered by filtration, washed with water and methanol, and then dried at a temperature of 40° C. to recover a photosensitive material A. The HPLC of the product showed that it is a mixture of 81% of tetraester compounds, 5% of triester compounds, and a balance of other lower substituted compounds as calculated in terms of ratio of peak area on a 254 nm absorbency chart.

(45) Synthesis of Photosensitive Material (B)

10 g of 3,3,3',3'-tetramethyl-1,1'-spirobiindane-5,6,7,5',6', 7'-hexol, 32.5 g of 1,2-naphthoquinonediazide-5-sulfonyl chloride, and 500 ml of acetone were charged into a three-necked flask to make a uniform solution. To the solution was then added gradually dropwise a mixture of 13.7 g of triethylamine and 50 ml of acetone. The reaction mixture was then allowed to undergo reaction at a temperature of 25° C. for 3 hours. The reaction mixture was then poured into 1,500 ml of a 1% aqueous solution of hydrochloric acid. The resulting precipitate was recovered by filtration, washed with water and methanol, and then dried at a temperature of 40° C. to recover a photosensitive material B. The HPLC of the product showed that it is a mixture of 86% of hexaester compounds and a balance of other lower substituted compounds.

(46) Synthesis of Photosensitive Material 10 g of 2,6-bis(2,3,4-trihydroxybenzyl)-p-cresol, 50.4 g of 1,2-naphthoquinonediazide-5-sulfonyl chloride, and 500 ml of γbutylolactone were charged into a three-necked flask to make a uniform solution. To the solution was then added gradually dropwise a mixture of 20.7 g of triethylamine and 30 ml of acetone. The reaction mixture was then allowed to undergo reaction at a temperature of 20° C. for 10 hours. The reaction mixture was then poured into 1,500 ml of a 1% aqueous solution of hydrochloric acid. The resulting precipitate was recovered by filtration, washed with water and methanol, and then dried at a temperature of 40° C. to recover a photosensitive material C. The HPLC of the product showed that it is a mixture of 25% of heptaester compounds, 58% of hexaester compounds, and a balance of other lower substituted compounds.

Examples of the positive-working photoresist compositions of the present invention comprising the novolak resins and the ionization-sensitive radioactive compounds prepared in the foregoing examples in combination with a water-insoluble alkali-soluble low molecular compound will be described along with comparative examples below.

EXAMPLES 25 TO 77 AND COMPARATIVE EXAMPLES 10 TO 44

The above-prepared Novolak Resins (a) to (h), Photographic Materials (A) to (C), the ionization-sensitive radioactive compounds (A) and (B) according to the present invention, a water-insoluble alkali-insoluble low molecular compound were mixed in formulations and proportions as set forth in Table 3. These mixtures were each dissolved in a mixture of 18 g of ethyl lactate and 4.5 g of ethoxyethyl propionate, and then filtered through a 0.1-μm microfilter to prepare positive-working photoresist compositions. The ionization-sensitive radioactive compounds (A) and (B) have contents of diesterification product, triesterification product, etc. of naphthoquinonediazide-5-sulfonic acid as set forth in Table 4. These positive-working photoresist compositions were each applied to a silicon wafer by means of a spinner, and then dried at a temperature of 90° C. over a vacuum suction hot plate for 60 seconds to obtain resist films having a thickness of 0.98 μm. These resist films were each exposed to light from a reduction projection exposing apparatus (NSR-2005i9C available from Nikon Corporation), heated at a temperature of 110° C. over a vacuum suction hot plate for 90 seconds, developed with a 2.38% aqueous solution of tetramethylammonium hydroxide for 1 minute, washed with water for 30 seconds, and then dried.

The resist patterns thus obtained on the silicon wafers were then observed under a scanning electron microscope to evaluate the positive-working photoresist compositions. The results are set forth in Table 3.

Sensitivity is defined as the exposure at which a mask pattern with a 0.5 μm line width can be reproduced.

For the evaluation of development latitude, the same measurement was made with different development times, i.e., 40 seconds and 90 seconds. The ratio of sensitivity with the two development times is used as an index of development latitude. The closer to 1.0 this value is, the wider is the development latitude and the better is the result.

Resolving power is defined as the critical resolving power at the exposure which can reproduce a mask pattern with a 0.5 μm line width. For the evaluation of dependence on film thickness, the photoresist compositions were each applied to a silicon wafer to a thickness of 1.00 μm, and then subjected to exposure and development in the same manner as above. The ratio of resolving power with the two different film thicknesses, i.e., 0.98 μm and 1.00 μm is used as an index of dependence on film thickness. The closer to 1.0 this value is, the less is the dependence on film thickness and the better is the result.

For the evaluation of development residue, the silicon wafer on which a pattern had been formed was observed under a scanning electron microscope. In Table 3, "A" indicates the absence of residue between lines forming resist pattern while "B" indicates the presence of residue.

TABLE 3

| | Water-insoluble Alkali-soluble Resin (g) | Water-insoluble Alkali-soluble Low-Molecular Compound (g) | Ionization-Sensitive Radioactive Compound (A) (g) | Ionization-Sensitive Radioactive Compound (B) (g) | Sensitivity (mj/cm$^2$) | Development Latitude | Resolving Power (μm) | Dependence on film thickness | Development Residue |
|---|---|---|---|---|---|---|---|---|---|
| Example No. | | | | | | | | | |
| 25 | Novolak Resin (h) 4.25 | (C-6) 0.89 | (A-2C) 0.70 | (B-2A) 1.63 | 236 | 0.92 | 0.30 | 0.93 | A |

TABLE 3-continued

| | Water-insoluble Alkali-soluble Resin (g) | Water-insoluble Alkali-soluble Low-Molecular Compound (g) | Ionization-Sensitive Radioactive Compound (A) (g) | Ionization-Sensitive Radioactive Compound (B) (g) | Sensitivity (mj/cm$^2$) | Development Latitude | Resolving Power (μm) | Dependence on film thickness | Development Residue |
|---|---|---|---|---|---|---|---|---|---|
| 26 | Novolak Resin (h) 4.42 | (C-6) 0.90 | (A-2C) 0.65 | (B-3A) 1.52 | 215 | 0.89 | 0.32 | 0.91 | A |
| 27 | Novolak Resin (h) 4.05 | (C-6) 1.01 | (A-2C) 0.73 | (B-5A) 1.71 | 270 | 0.93 | 0.32 | 0.96 | A |
| 28 | Novolak Resin (h) 4.04 | (C-6) 1.02 | (A-2C) 0.67 | (B-6A) 1.54 | 207 | 0.90 | 0.32 | 0.92 | A |
| 29 | Novolak Resin (h) 4.30 | (C-6) 0.88 | (A-2C) 0.70 | (B-10A) 1.63 | 242 | 0.94 | 0.31 | 0.98 | A |
| 30 | Novolak Resin (h) 4.37 | (C-6) 1.04 | (A-2C) 0.63 | (B-11A) 1.47 | 210 | 0.91 | 0.30 | 0.89 | A |
| 31 | Novolak Resin (h) 4.38 | (C-6) 1.03 | (A-2C) 0.63 | (B-15A) 1.50 | 218 | 0.92 | 0.31 | 0.90 | A |
| 32 | Novolak Resin (h) 4.39 | (C-6) 0.90 | (A-2C) 0.66 | (B-28A) 1.55 | 260 | 0.93 | 0.33 | 0.95 | A |
| 33 | Novolak Resin (h) 4.35 | (C-6) 0.94 | (A-2C) 0.68 | (B-40A) 1.57 | 208 | 0.92 | 0.31 | 0.88 | A |
| 34 | Novolak Resin (h) 4.38 | (C-6) 0.92 | (A-2C) 0.68 | (B-44A) 1.55 | 222 | 0.88 | 0.33 | 0.87 | A |
| 35 | Novolak Resin (h) 4.25 | (C-6) 0.91 | (A-2C) 0.75 | (B-57A) 1.58 | 236 | 0.91 | 0.31 | 0.91 | A |
| 36 | Novolak Resin (g) 4.48 | (C-6) 0.88 | (A-2C) 0.64 | (B-61A) 1.49 | 195 | 0.87 | 0.32 | 0.87 | A |
| 37 | Novolak Resin (h) 4.51 | (C-6) 0.92 | (A-2C) 1.03 | (B-72A) 1.03 | 242 | 0.88 | 0.30 | 0.90 | A |
| 38 | Novolak Resin (h) 4.38 | (C-6) 1.02 | (A-2A) 1.05 | (B-72A) 1.05 | 206 | 0.89 | 0.32 | 0.87 | A |
| 39 | Novolak Resin (h) 4.24 | (C-6) 0.93 | (A-2A) 1.16 | (B-2B) 1.16 | 230 | 0.93 | 0.33 | 0.89 | A |
| 40 | Novolak Resin (h) 4.42 | (C-6) 0.91 | (A-3C) 0.65 | (B-10A) 1.52 | 240 | 0.95 | 0.30 | 0.90 | A |
| 41 | Novolak Resin (h) 4.05 | (C-6) 0.83 | (A-70A) 0.85 | (B-72A) 1.77 | 175 | 0.88 | 0.32 | 0.88 | A |
| 42 | Novolak Resin (f) 3.64 | (C-9) 1.09 | (A-3A) 0.69 | (B-28A) 1.59 | 225 | 0.96 | 0.32 | 0.98 | A |
| 43 | Novolak Resin (f) 3.64 | (C-9) 1.09 | (A-3C) 0.68 | (B-28A) 1.59 | 230 | 0.97 | 0.31 | 0.98 | A |
| 44 | Novolak Resin (f) 3.66 | (C-9) 1.03 | (A-3C) 0.69 | (B-3A) 1.62 | 248 | 0.98 | 0.32 | 0.97 | A |
| 45 | Novolak Resin (f) 3.83 | (C-9) 1.20 | (A-3C) 0.59 | (B-5A) 1.37 | 234 | 0.99 | 0.30 | 0.98 | A |
| 46 | Novolak Resin (f) 3.82 | (C-9) 1.08 | (A-3C) 0.63 | (B-10A) 1.47 | 220 | 0.98 | 0.31 | 0.99 | A |
| 47 | Novolak Resin (f) 3.88 | (C-9) 1.09 | (A-3C) 0.81 | (B-40A) 1.22 | 240 | 0.97 | 0.31 | 0.98 | A |
| 48 | Novolak Resin (f) 3.83 | (C-9) 1.20 | (A-6A) 0.59 | (B-5A) 1.37 | 242 | 0.96 | 0.31 | 0.99 | A |
| 49 | Novolak Resin (f) 3.83 | (C-9) 1.20 | (A-12A) 0.59 | (B-5A) 1.37 | 226 | 0.97 | 0.31 | 0.96 | A |
| 50 | Novolak Resin (f) 3.83 | (C-9) 1.20 | (A-22A) 0.59 | (B-5A) 1.37 | 248 | 0.95 | 0.32 | 0.95 | A |
| 51 | Novolak Resin (f) 3.83 | (C-9) 1.20 | (A-23A) 0.59 | (B-5A) 1.37 | 222 | 0.98 | 0.31 | 0.98 | A |
| 52 | Novolak Resin (f) 3.83 | (C-9) 1.20 | (A-28A) 0.59 | (B-5A) 1.37 | 206 | 0.95 | 0.32 | 0.94 | A |
| 53 | Novolak Resin (f) 3.83 | (C-9) 1.20 | (A-38A) 0.39 | (B-5A) 1.57 | 218 | 0.93 | 0.32 | 0.90 | A |
| 54 | Novolak Resin (f) 3.83 | (C-9) 1.20 | (A-52A) 0.59 | (B-5A) 1.37 | 238 | 0.92 | 0.33 | 0.92 | A |
| 55 | Novolak Resin (f) 3.83 | (C-9) 1.20 | (A-67A) 0.59 | (B-5A) 1.37 | 180 | 0.87 | 0.34 | 0.89 | A |
| 56 | Novolak Resin (f) 3.83 | (C-9) 1.20 | (A-70A) 0.59 | (B-5A) 1.37 | 236 | 0.86 | 0.34 | 0.88 | A |
| 57 | Novolak Resin (f) 3.83 | (C-9) 1.20 | (A-71A) 0.59 | (B-5A) 1.37 | 248 | 0.87 | 0.34 | 0.83 | A |
| 58 | Novolak Resin (f) 3.83 | (C-9) 1.20 | (A-72A) 0.59 | (B-5A) 1.37 | 246 | 0.88 | 0.33 | 0.87 | A |
| 59 | Novolak Resin (f) 3.83 | (C-9) 1.20 | (A-75A) 0.59 | (B-5A) 1.37 | 226 | 0.84 | 0.34 | 0.83 | A |
| 60 | Novolak Resin (f) 3.83 | (C-9) 1.20 | (A-78A) 0.59 | (B-5A) 1.37 | 258 | 0.85 | 0.33 | 0.84 | A |
| 61 | Novolak Resin (h) 4.36 | (C-9) 0.96 | (A-11A) 0.65 | (B-10A) 1.52 | 246 | 0.94 | 0.31 | 0.97 | A |

TABLE 3-continued

| | Water-insoluble Alkali-soluble Resin (g) | Water-insoluble Alkali-soluble Low-Molecular Compound (g) | Ionization-Sensitive Radioactive Compound (A) (g) | Ionization-Sensitive Radioactive Compound (B) (g) | Sensitivity (mj/cm$^2$) | Development Latitude | Resolving Power (μm) | Dependence on film thickness | Development Residue |
|---|---|---|---|---|---|---|---|---|---|
| 62 | Novolak Resin (h) 4.31 | (C-2) 1.01 | (A-11A) 0.65 | (B-10A) 1.52 | 234 | 0.93 | 0.32 | 0.96 | A |
| 63 | Novolak Resin (h) 4.10 | (C-4) 1.22 | (A-11A) 0.65 | (B-10A) 1.52 | 230 | 0.98 | 0.30 | 0.99 | A |
| 64 | Novolak Resin (h) 4.37 | (C-7) 0.96 | (A-11A) 0.65 | (B-10A) 1.52 | 242 | 0.97 | 0.31 | 0.95 | A |
| 65 | Novolak Resin (h) 4.37 | (C-16) 0.96 | (A-11A) 0.65 | (B-10A) 1.52 | 250 | 0.92 | 0.30 | 0.93 | A |
| 66 | Novolak Resin (h) 4.47 | (C-23) 0.85 | (A-11A) 0.65 | (B-10A) 1.52 | 226 | 0.96 | 0.32 | 0.97 | A |
| 67 | Novolak Resin (h) 4.37 | (C-26) 0.96 | (A-11A) 0.65 | (B-10A) 1.52 | 230 | 0.94 | 0.32 | 0.93 | A |
| 68 | Novolak Resin (h) 4.58 | (C-28) 0.75 | (A-11A) 0.65 | (B-10A) 1.52 | 210 | 0.90 | 0.32 | 0.90 | A |
| 69 | Novolak Resin (h) 4.47 | (C-9) 0.51 (C-28) 0.34 | (A-11A) 0.65 | (B-10A) 1.52 | 218 | 0.91 | 0.31 | 0.92 | A |
| 70 | Novolak Resin (b) 4.47 | (C-6) 0.85 | (A-11A) 0.65 | (B-10A) 1.52 | 194 | 0.90 | 0.33 | 0.89 | A |
| 71 | Novolak Resin (d) 4.47 | (C-6) 0.85 | (A-11A) 0.65 | (B-10A) 1.52 | 178 | 0.92 | 0.33 | 0.90 | A |
| 72 | Novolak Resin (f) 4.10 | (C-4) 1.22 | (A-11A) 0.65 | (B-10A) 1.52 | 210 | 0.97 | 0.31 | 0.96 | A |
| 73 | Novolak Resin (f) 4.10 | (C-4) 1.22 | (A-11A) 0.65 | (B-10B) 1.52 | 266 | 0.90 | 0.31 | 0.87 | A |
| 74 | Novolak Resin (f) 4.10 | (C-4) 1.22 | (A-11A) 0.65 | (B-10C) 1.52 | 206 | 0.96 | 0.32 | 0.94 | A |
| 75 | Novolak Resin (f) 4.10 | (C-4) 1.22 | (A-2A) 0.65 | (B-10A) 1.52 | 218 | 0.97 | 0.30 | 0.98 | A |
| 76 | Novolak Resin (f) 4.10 | (C-4) 1.22 | (A-2B) 0.65 | (B-10A) 1.52 | 242 | 0.90 | 0.32 | 0.86 | A |
| 77 | Novolak Resin (f) 4.10 | (C-4) 1.22 | (A-2C) 0.65 | (B-10A) 1.52 | 202 | 0.97 | 0.31 | 0.99 | A |
| Comparative Example No. | | | | | | | | | |
| 10 | Novolak Resin (a) 4.37 | (C-6) 1.04 | (A-2C) 0.63 | (B-10A) 1.47 | 126 | 0.62 | 0.47 | 0.71 | B |
| 11 | Novolak Resin (a) 5.40 | — | (A-2C) 0.63 | (B-10A) 1.47 | 242 | 0.74 | 0.38 | 0.67 | A |
| 12 | Novolak Resin (c) 4.37 | (C-6) 1.04 | (A-2C) 0.63 | (B-10A) 1.47 | 110 | 0.58 | 0.50 | 0.62 | B |
| 13 | Novolak Resin (c) 5.40 | — | (A-2C) 0.63 | (B-10A) 1.47 | 210 | 0.77 | 0.42 | 0.72 | A |
| 14 | Novolak Resin (e) 4.37 | (C-6) 1.04 | (A-2C) 0.63 | (B-10A) 1.47 | 142 | 0.65 | 0.38 | 0.73 | B |
| 15 | Novolak Resin (e) 5.40 | — | (A-2C) 0.63 | (B-10A) 1.47 | 238 | 0.77 | 0.37 | 0.62 | A |
| 16 | Novolak Resin (b) 5.40 | — | (A-2C) 0.63 | (B-10A) 1.47 | 650 | 0.52 | 0.38 | 0.63 | B |
| 17 | Novolak Resin (d) 5.40 | — | (A-2C) 0.63 | (B-10A) 1.47 | 570 | 0.61 | 0.42 | 0.68 | B |
| 18 | Novolak Resin (f) 5.40 | — | (A-2C) 0.63 | (B-10A) 1.47 | 680 | 0.57 | 0.45 | 0.64 | B |
| 19 | Novolak Resin (g) 5.40 | — | (A-2C) 0.63 | (B-10A) 1.47 | 720 | 0.65 | 0.40 | 0.48 | B |
| 20 | Novolak Resin (h) 5.40 | — | (A-2C) 0.63 | (B-10A) 1.47 | 692 | 0.58 | 0.42 | 0.57 | B |
| 21 | Novolak Resin (h) 4.37 | (C-6) 1.04 | (A-2C) 2.10 | — | 272 | 0.65 | 0.35 | 0.72 | B |
| 22 | Novolak Resin (h) 4.37 | (C-6) 1.04 | (A-3C) 2.10 | — | 284 | 0.59 | 0.36 | 0.66 | B |
| 23 | Novolak Resin (h) 4.37 | (C-6) 1.04 | (A-6A) 2.10 | — | 302 | 0.61 | 0.37 | 0.62 | B |
| 24 | Novolak Resin (h) 4.37 | (C-6) 1.04 | (A-23A) 2.10 | — | 294 | 0.63 | 0.35 | 0.58 | B |
| 25 | Novolak Resin (h) 4.37 | (C-6) 1.04 | (A-38A) 2.10 | — | 380 | 0.62 | 0.36 | 0.63 | B |
| 26 | Novolak Resin (h) 4.37 | (C-6) 1.04 | (A-52A) 2.10 | — | 288 | 0.61 | 0.38 | 0.67 | B |
| 27 | Novolak Resin (h) 4.37 | (C-6) 1.04 | (A-67A) 2.10 | — | 274 | 0.66 | 0.37 | 0.72 | A |

TABLE 3-continued

| | Water-insoluble Alkali-soluble Resin (g) | Water-insoluble Alkali-soluble Low-Molecular Compound (g) | Ionization-Sensitive Radioactive Compound (A) (g) | Ionization-Sensitive Radioactive Compound (B) (g) | Sensitivity (mj/cm²) | Development Latitude | Resolving Power (μm) | Dependence on film thickness | Development Residue |
|---|---|---|---|---|---|---|---|---|---|
| 28 | Novolak Resin (h) 4.37 | (C-6) 1.04 | (A-70A) 2.10 | — | 290 | 0.64 | 0.38 | 0.56 | A |
| 29 | Novolak Resin (h) 4.37 | (C-6) 1.04 | — | (B-2A) 2.10 | 170 | 0.70 | 0.37 | 0.78 | A |
| 30 | Novolak Resin (h) 4.37 | (C-6) 1.04 | — | (B-3A) 2.10 | 150 | 0.68 | 0.40 | 0.80 | A |
| 31 | Novolak Resin (h) 4.37 | (C-6) 1.04 | — | (B-5A) 2.10 | 180 | 0.72 | 0.36 | 0.84 | A |
| 32 | Novolak Resin (h) 4.37 | (C-6) 1.04 | — | (B-10A) 2.10 | 160 | 0.67 | 0.37 | 0.78 | A |
| 33 | Novolak Resin (h) 4.37 | (C-6) 1.04 | — | (B-11A) 2.10 | 154 | 0.70 | 0.38 | 0.80 | A |
| 34 | Novolak Resin (h) 4.37 | (C-6) 1.04 | — | (B-28A) 2.10 | 146 | 0.66 | 0.40 | 0.82 | A |
| 35 | Novolak Resin (h) 4.37 | (C-6) 1.04 | — | (B-40A) 2.10 | 140 | 0.62 | 0.38 | 0.84 | A |
| 36 | Novolak Resin (h) 4.37 | (C-6) 1.04 | — | (B-61A) 2.10 | 148 | 0.64 | 0.40 | 0.73 | A |
| 37 | Novolak Resin (h) 4.37 | (C-6) 1.04 | — | (B-72A) 2.10 | 136 | 0.60 | 0.42 | 0.72 | A |
| 38 | Novolak Resin (h) 4.37 | (C-6) 1.04 | *) P.M. (A) 0.63 | (B-10A) 2.10 | 210 | 0.71 | 0.37 | 0.77 | A |
| 39 | Novolak Resin (h) 4.37 | (C-6) 1.04 | **) P.M. (B) 0.63 | (B-10A) 2.10 | 284 | 0.61 | 0.39 | 0.57 | B |
| 40 | Novolak Resin (h) 4.37 | (C-6) 1.04 | ***) P.M. (C) 0.63 | (B-10A) 2.10 | 310 | 0.56 | 0.40 | 0.61 | B |
| 41 | Novolak Resin (h) 4.37 | (C-6) 1.04 | (A-2B) 0.63 | (B-10B) 2.10 | 440 | 0.70 | 0.36 | 0.58 | B |
| 42 | Novolak Resin (h) 4.37 | (C-6) 1.04 | (A-3B) 0.63 | (B-10B) 2.10 | 462 | 0.67 | 0.37 | 0.62 | B |
| 43 | Novolak Resin (h) 4.37 | Trihydroxy-benzophenone 1.04 | (A-2C) 0.63 | (B-10A) 1.47 | 146 | 0.71 | 0.42 | 0.62 | B |
| 44 | Novolak Resin (h) 4.37 | Tetrahydroxy-benzophenone 1.04 | (A-2C) 0.63 | (B-10A) 1.47 | 132 | 0.72 | 0.45 | 0.58 | B |

*)P.M. (A): Photosensitive Material A
**)P.M. (B): Photosensitive Material B
***)P.M. (C): Photosensitive Material C

TABLE 4

| | Skeleton | Diester Compound | Triester Compound | Tetraester Compound |
|---|---|---|---|---|
| (A-2A) | (A-2) | 59% | 24% | — |
| (A-2B) | (A-2) | 20% | 75% | — |
| (A-2C) | (A-2) | 88% | 3.5% | — |
| (A-3A) | (A-3) | 61% | 35% | — |
| (A-3B) | (A-3) | 18% | 77% | — |
| (A-3C) | (A-3) | 82% | 3% | — |
| (A-6A) | (A-6) | 64% | 30% | — |
| (A-11A) | (A-11) | 74% | 18% | — |
| (A-12A) | (A-12) | 73% | 20% | — |
| (A-22A) | (A-22) | 67% | 27% | — |
| (A-23A) | (A-23) | 75% | 19% | — |
| (A-28A) | (A-28) | 40% | 38% | — |
| (A-38A) | (A-38) | 46% | 39% | — |
| (A-52A) | (A-52) | 57% | 28% | — |
| (A-67A) | (A-67) | 71% | 20% | — |
| (A-70A) | (A-70) | 40% | 40% | — |
| (A-71A) | (A-71) | 40% | 37% | — |
| (A-72A) | (A-72) | 43% | 32% | — |
| (A-75A) | (A-75) | 53% | 36% | — |
| (A-78A) | (A-78) | 66% | 25% | — |
| (B-2A) | (B-2) | 38% | 48% | 5% |
| (B-2B) | (B-2) | 48% | 14% | 1% |
| (B-3A) | (B-3) | 49% | 22% | 3% |
| (B-5A) | (B-5) | 59% | 30% | 4% |
| (B-10A) | (B-10) | 53% | 33% | 7% |
| (B-10B) | (B-10) | 22% | 63% | 12% |
| (B-10C) | (B-10) | 78% | 14% | 3% |
| (B-11A) | (B-11) | 36% | 30% | 6% |
| (B-15A) | (B-15) | 39% | 35% | 8% |
| (B-28A) | (B-28) | 52% | 26% | 11% |
| (B-40A) | (B-40) | 39% | 32% | 16% |
| (B-44A) | (B-44) | 51% | 23% | 5% |
| (B-57A) | (B-57) | 55% | 30% | 8% |
| (B-61A) | (B-61) | 46% | 36% | 10% |
| (B-72A) | (B-72) | 36% | 36% | 14% |

As mentioned above, the resist specimens meeting the requirements of the present invention exhibit little dependence on film thickness and little development residue, a high resolving power, and a wide development latitude as compared to the comparative resist specimens.

The positive-working photoresist compositions of the present invention exhibit little dependence on film thickness and little development residue, a high resolving power, and a wide development latitude. Thus, the positive-working photoresist compositions of the present invention can be advantageously used in the mass production of semiconductor devices having an ultrafine circuit.

While the invention has been described in detail and with reference to specific embodiments thereof, it will be apparent to one skilled in the art that various changes and modifications can be made therein without departing from the spirit and scope thereof.

What is claimed is:

1. A positive-working photoresist composition, comprising an alkali-soluble resin and a 1,2-naphthoquinonediazide-5-(and/or -4-)sulfonic ester of a water-insoluble alkali-soluble low molecular compound represented by formula (Ia), wherein the high-performance liquid chromatography of said ester with an ultraviolet ray at 254 nm shows that the patterns corresponding to the diester components and complete ester component of said ester are not less than 50% and less than 10% of the total pattern area of said ester, respectively:

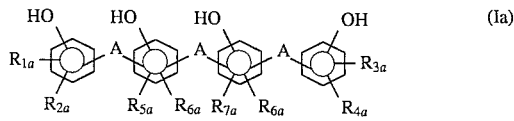

wherein A's may be the same or different and each represent a single bond or a divalent organic group, with the proviso that at least one of A's is selected from the group consisting of a single bond, —O—, —S—, —SO—, —SO$_2$—, —SO$_3$—, —NH—, —C(=O)—, —C(=O)O—, —C(=S)—, and —C(=O)NH—; and $R_{1a}$ to $R_{8a}$ may be the same or different and each represent a hydrogen atom, an alkyl group, an aryl group, an alkoxy group, an acyl group, an alkenyl group or a halogen atom.

2. A positive-working photoresist composition, comprising an alkali-soluble resin and a 1,2-naphthoquinonediazide-5-(and/or -4-)sulfonic ester of a water-insoluble alkali-soluble low molecular compound represented by formula (Ib) obtained by the esterification reaction of the water-insoluble alkali-soluble low molecular compound represented by formula (Ib) with 1,2-naphthoquinonediazide-5-(and/or -4-) sulfonyl chloride, wherein the high-performance liquid chromatography of said ester with an ultraviolet ray at 254 nm shows that the patterns corresponding to the diester components and complete ester component of said ester are not less than 40% and less than 10% of the total pattern area of said ester, respectively:

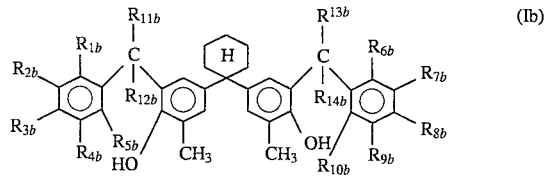

wherein $R_{1b}$ to $R_{10b}$ may be the same or different and each represent a hydrogen atom, a halogen atom, an alkyl group, a cyclic alkyl group, an aryl group, an alkoxy group, an acyl group, an alkenyl group or a hydroxyl group, with the proviso that at least one of $R_{1b}$ to $R_{5b}$ and at least one of $R_{6b}$ to $R_{10b}$ each is a hydroxyl group; and $R_{11b}$ to $R_{14b}$ may be the same or different and each represent a hydrogen atom or an alkyl group.

3. The positive-working photoresist composition according to claim 2, wherein said water-insoluble alkali-soluble low molecular compound is represented by formula (IIb):

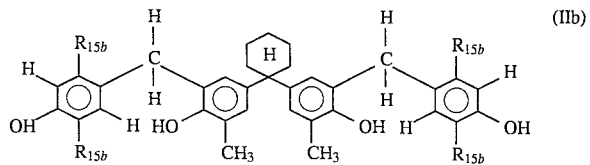

wherein $R_{15b}$'s may be the same or different and each represent a hydrogen atom or a methyl group.

4. The positive-working photoresist composition according to claim 2, wherein said ester is a compound obtained by the esterification reaction of N-methylpiperidine or N-methylpyrrolidine.

5. A positive-working photoresist composition comprising a water-insoluble alkali-soluble resin, a water-insoluble alkali-soluble low molecular compound, and an ionization-sensitive radioactive compound, said ionization-sensitive radioactive compound comprises a mixture of a naphthoquinonediazidesulfonic diester of a water-insoluble alkali-soluble low molecular compound having three phenolic hydroxyl groups as an ionization-sensitive radioactive compound (A) and a naphthoquinonediazidesulfonic diester of a water-insoluble alkali-soluble low molecular compound having four phenolic hydroxyl groups as an ionization-sensitive radioactive compound (B) in an amount of 30% or more by weight based on the total amount of said ionization-sensitive radioactive compound.

6. The positive-working photoresist composition according to claim 5, wherein said water-insoluble alkali-soluble resin comprises at least one novolak resin synthesized by the condensation reaction of a mixture of m-cresol and at least one phenolic monomer selected from phenol, o-cresol, p-cresol, xylenol and trimethylphenol with an aldehyde compound.

7. The positive-working photoresist composition according to claim 5, wherein said water-insoluble alkali-soluble resin comprises at least one novolak resin synthesized by the condensation reaction of a mixture containing at least three phenolic monomers selected from p-cresol, o-cresol, 2,3-xylenol, 2,6-xylenol and trimethylphenol with an aldehyde compound.

8. The positive-working photoresist composition according to claim 5, wherein said water-insoluble alkali-soluble low molecular compound comprises at least one compound containing a phenolic hydroxyl group(s) and an aromatic ring(s) wherein the ratio by number of the phenolic hydroxyl group to the aromatic ring is in the range of 0.5 to 1.4.

9. The positive-working photoresist composition according to claim 5, wherein the ratio by weight of said ionization-sensitive radioactive compound (A) to said ionization-sensitive radioactive compound (B) is in the range of 0.1 to 5.

10. The positive-working photoresist composition according to claim 5, wherein said ionization-sensitive radioactive compound (A) is a compound represented by formula (A$_1$) or (A$_2$) and said ionization-sensitive radioactive compound (B) is a compound represented by formula (B$_1$) or (B$_2$):

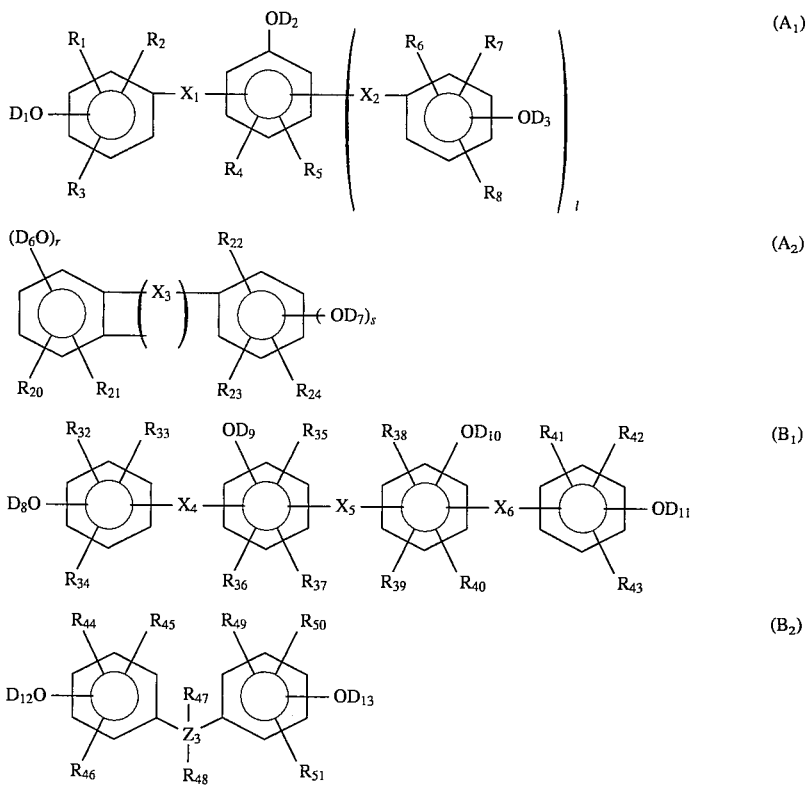

(A₁)

(A₂)

(B₁)

(B₂)

wherein

R₁ to R₈ and R₂₀ to R₂₄ each represent a hydrogen atom, —CN, —X—$R_{a1}$ or a halogen atom;

X₁ and X₂ each represent a single bond, a carbonyl group, a sulfide group, a sulfonyl group or —C($R_{b1}$)($R_{b2}$)—, with the proviso that when l is 0, X₁ represents a group represented by formula (A₁₁) or (A₁₂)

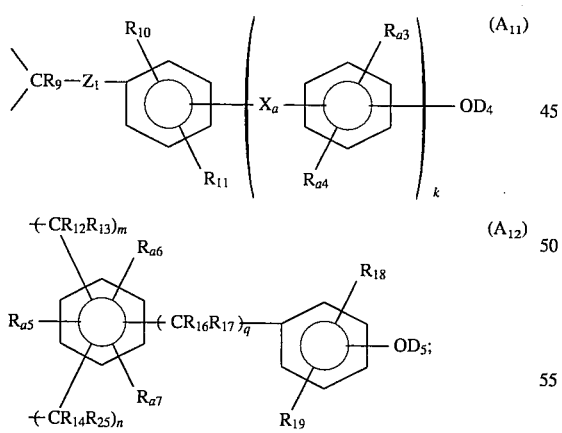

(A₁₁)

(A₁₂)

X₃ represents a group represented by formula (A₂₁) or (A₂₂):

(A₂₁)

-continued

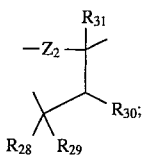

(A₂₂)

R₉, R₁₂ to R₁₇, R₂₅ to R₃₁, $R_{b1}$, and $R_{b2}$ each represent a hydrogen atom, a methyl group, an ethyl group or a C₁₋₂ haloalkyl group, with the proviso that $R_{b1}$ and $R_{b2}$, R₂₅ and R₂₆, R₂₈ and R₂₉, and R₃₀ and R₃₁ may be connected to each other to form an alicyclic hydrocarbon residue;

R₁₀, R₁₁, $R_{a3}$, $R_{a4}$, R₁₈ and R₁₉ each represent a hydrogen atom, —X—$R_{a1}$, —CN or a halogen atom;

X represents a single bond, —O—, —S—, —CO—, —OC(=O)— or N($R_{a1}$)CO—;

$X_a$ represents a carbonyl group, a sulfide group, a sulfonyl group or —C($R_{b1}$)($R_{b2}$)—;

$R_{a1}$ represents a C₁₋₁₀ alkyl group, an aryl group or an aralkyl group;

$R_{a5}$ to $R_{a7}$ represent a hydrogen atom, a methyl group, an ethyl group, or a C₁₋₁₀ haloalkyl group;

Z₁ represents a single bond or a trivalent alicyclic hydrocarbon group formed with CR₉;

Z₂ represents a single bond or —O—;

k and l each represent an integer 0 or 1;

m and n each represent an integer 1 or 2;

q represents an integer 1 to 8;

r and s each represent an integer 1 or 2, with the proviso that r and s satisfy the equation r+s=3;

D₁ to D₇ each represent a hydrogen atom or naphthoquinonediazide-4-(and/or 5)-sulfonyl group;

$R_{32}$ to $R_{46}$, and $R_{49}$ each represent a hydrogen atom, —CN, —X—$R_{a1}$ or a halogen atom;

$R_{47}$ represents a hydrogen atom, a methyl group, an ethyl group, a $C_{1-2}$ haloalkyl group or $R_c$, with the proviso that $R_c$ is a group represented by formula ($B_{21}$):

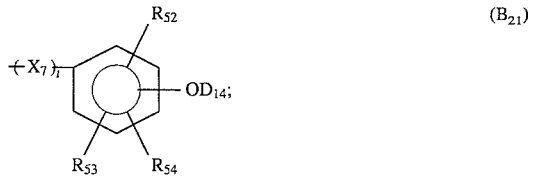

$R_{48}$ represents a hydrogen atom, a methyl group, an ethyl group, a $C_{1-2}$ haloalkyl group or $R_d$, with the proviso that $R_d$ is a group represented by formula ($B_{22}$):

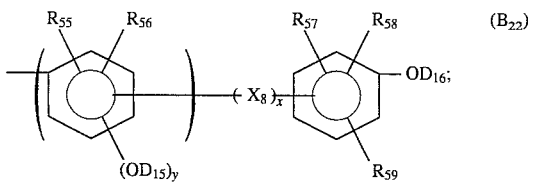

$R_{50}$ and $R_{51}$ each represent a hydrogen atom, —CN, —X—$R_{a1}$ or a halogen atom, with the proviso that when $R_{47}$ is different from $R_c$ and $R_{48}$ is different from $R_d$, $R_{50}$ and $R_{51}$ each represent $R_c$;

$X_4$ to $X_6$ each represent a single bond, a carbonyl group, a sulfide group, a sulfonyl group or —C($R_{b1}$)($R_{b2}$)—;

$X_7$ and $X_8$ each represent a single bond or —(CR$_{60}$R$_{61}$)$_u$(CH=CH)$_v$—;

$R_{52}$ and $R_{59}$ each represent a hydrogen atom, —CN, —X—$R_{a1}$ or a halogen atom;

$R_{60}$ and $R_{61}$ each represent a hydrogen atom, a methyl group, an ethyl group or a $C_{1-2}$ haloalkyl group;

$Z_3$ represents a $C_{1-6}$ tetravalent alkyl residue;

$D_8$ to $D_{16}$ each represent a hydrogen atom, naphthoquinonediazide-4(and/or 5)-sulfonyl group;

t represents an integer 0 to 2;

u and x each represent an integer 0, and 1 to 8;

y, v and w each represent an integer 0 or 1, with the proviso that when $R_{47}$ is different from $R_c$, $R_{50}$ is different from $R_c$ and $R_{51}$ is different from $R_c$, y and w each are 1, and y is 0 otherwise; and each of the compounds represented by formulae ($A_1$), ($A_2$), ($B_1$) and ($B_2$) has two naphthoquinonediazide-4(and/or 5)-sulfonyl groups as $D_1$ to $D_{16}$ per molecule.

* * * * *